(12) United States Patent
Fonseca et al.

(10) Patent No.: US 8,197,996 B2
(45) Date of Patent: Jun. 12, 2012

(54) DUAL TONE DEVELOPMENT PROCESSES

(75) Inventors: Carlos A. Fonseca, Fishkill, NY (US);
Mark Somervell, Austin, TX (US);
Steven Scheer, Austin, TX (US)

(73) Assignee: Tokyo Electron Limited (JP)

( * ) Notice: Subject to any disclaimer, the term of this patent is extended or adjusted under 35 U.S.C. 154(b) by 243 days.

(21) Appl. No.: 12/560,873

(22) Filed: Sep. 16, 2009

(65) Prior Publication Data

US 2010/0119960 A1    May 13, 2010

Related U.S. Application Data

(60) Provisional application No. 61/098,723, filed on Sep. 19, 2008.

(51) Int. Cl.
*G03C 5/00* (2006.01)
(52) U.S. Cl. .......... 430/30; 430/325; 430/326; 430/328; 430/329; 430/330; 430/394
(58) Field of Classification Search ............ 430/30, 430/325, 326, 328, 329, 330, 394
See application file for complete search history.

(56) References Cited

U.S. PATENT DOCUMENTS

| | | | |
|---|---|---|---|
| 4,568,631 A | 2/1986 | Badami et al. |
| 5,621,652 A | 4/1997 | Eakin et al. |
| 5,691,100 A | 11/1997 | Kudo et al. |
| 5,776,660 A | 7/1998 | Hakey et al. |
| 5,861,330 A | 1/1999 | Baker et al. |
| 5,882,967 A | 3/1999 | Brown et al. |
| 5,955,222 A | 9/1999 | Hibbs et al. |
| 5,972,570 A | 10/1999 | Bruce et al. |
| 5,976,768 A | 11/1999 | Brown et al. |
| 5,981,148 A | 11/1999 | Brown et al. |
| 6,007,968 A | 12/1999 | Furukawa et al. |
| 6,066,433 A | 5/2000 | Takemura et al. |
| 6,100,013 A | 8/2000 | Brown et al. |
| 6,114,082 A | 9/2000 | Hakey et al. |
| 6,184,041 B1 | 2/2001 | Furukawa et al. |
| 6,190,829 B1 | 2/2001 | Holmes et al. |
| 6,207,540 B1 | 3/2001 | Furukawa et al. |
| 6,210,866 B1 | 4/2001 | Furukawa et al. |
| 6,218,704 B1 | 4/2001 | Brown et al. |
| 6,221,562 B1 | 4/2001 | Boyd et al. |
| 6,277,546 B1 | 8/2001 | Breyta et al. |
| 6,294,419 B1 | 9/2001 | Brown et al. |
| 6,316,309 B1 | 11/2001 | Holmes et al. |
| 6,338,934 B1 | 1/2002 | Chen et al. |
| 6,387,783 B1 | 5/2002 | Furukawa et al. |
| 6,514,648 B2 | 2/2003 | Peng |
| 6,627,361 B2 | 9/2003 | Bula et al. |
| 7,102,763 B2 | 9/2006 | Ritzdorf et al. |
| 7,368,209 B2 | 5/2008 | Shiobara et al. |
| 2006/0160028 A1 | 7/2006 | Lee et al. |
| 2007/0050749 A1 | 3/2007 | Ye |
| 2007/0269749 A1 | 11/2007 | Schenker |
| 2008/0009138 A1 | 1/2008 | Lee |
| 2008/0113157 A1 | 5/2008 | Lee et al. |

FOREIGN PATENT DOCUMENTS

| | | |
|---|---|---|
| EP | 1 939 691 A2 | 7/2008 |
| JP | 2000199953 A | 7/2000 |

OTHER PUBLICATIONS

Machine English language translation of JP2000-199953, published Jul. 2000.

*Primary Examiner* — Christopher Young

(57) ABSTRACT

A method and system for patterning a substrate using a dual-tone development process is described. The method and system comprise using a resist material having a polymer backbone with a plurality of protecting groups attached thereto to improve process latitude and critical dimension uniformity for the dual-tone development process.

27 Claims, 59 Drawing Sheets

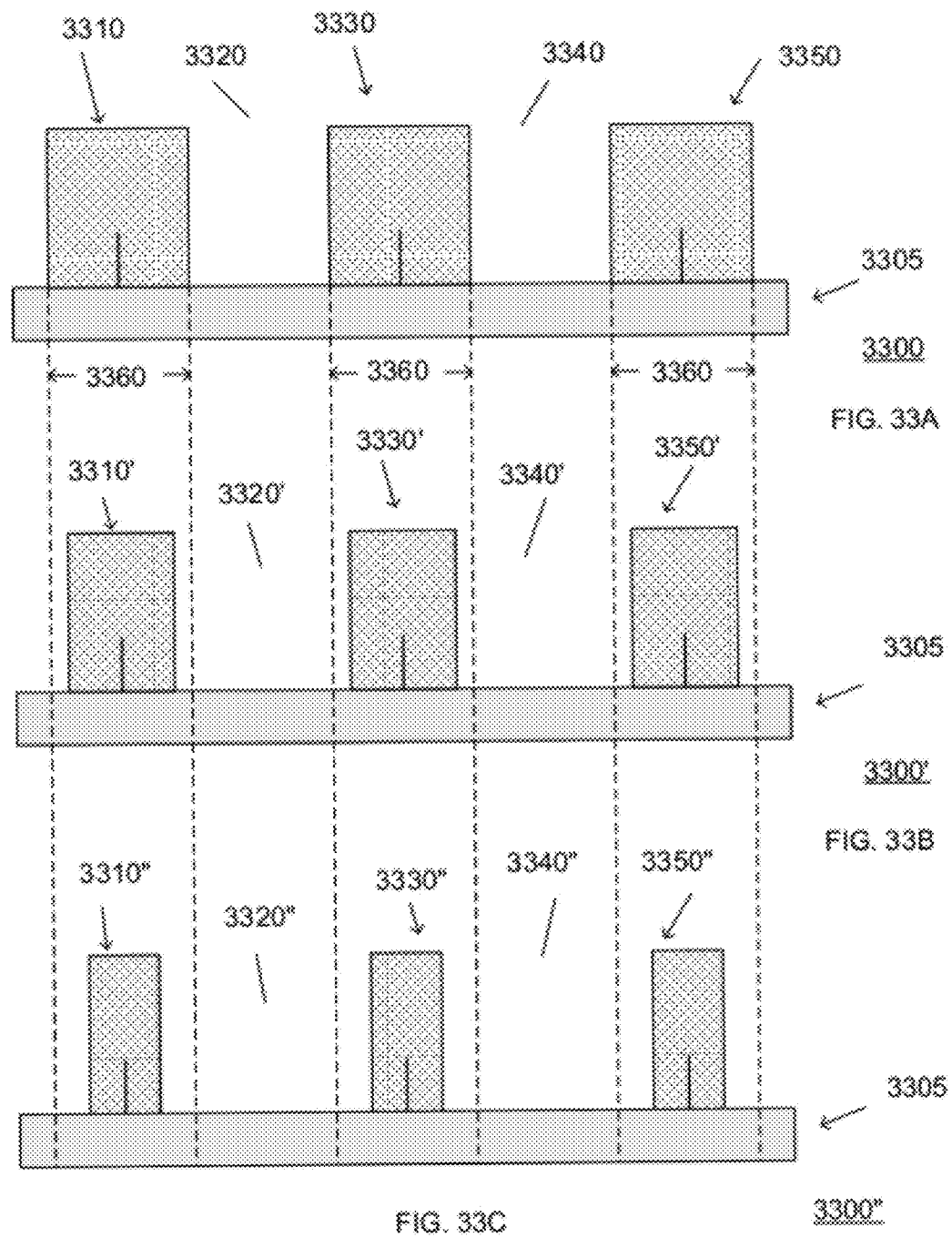

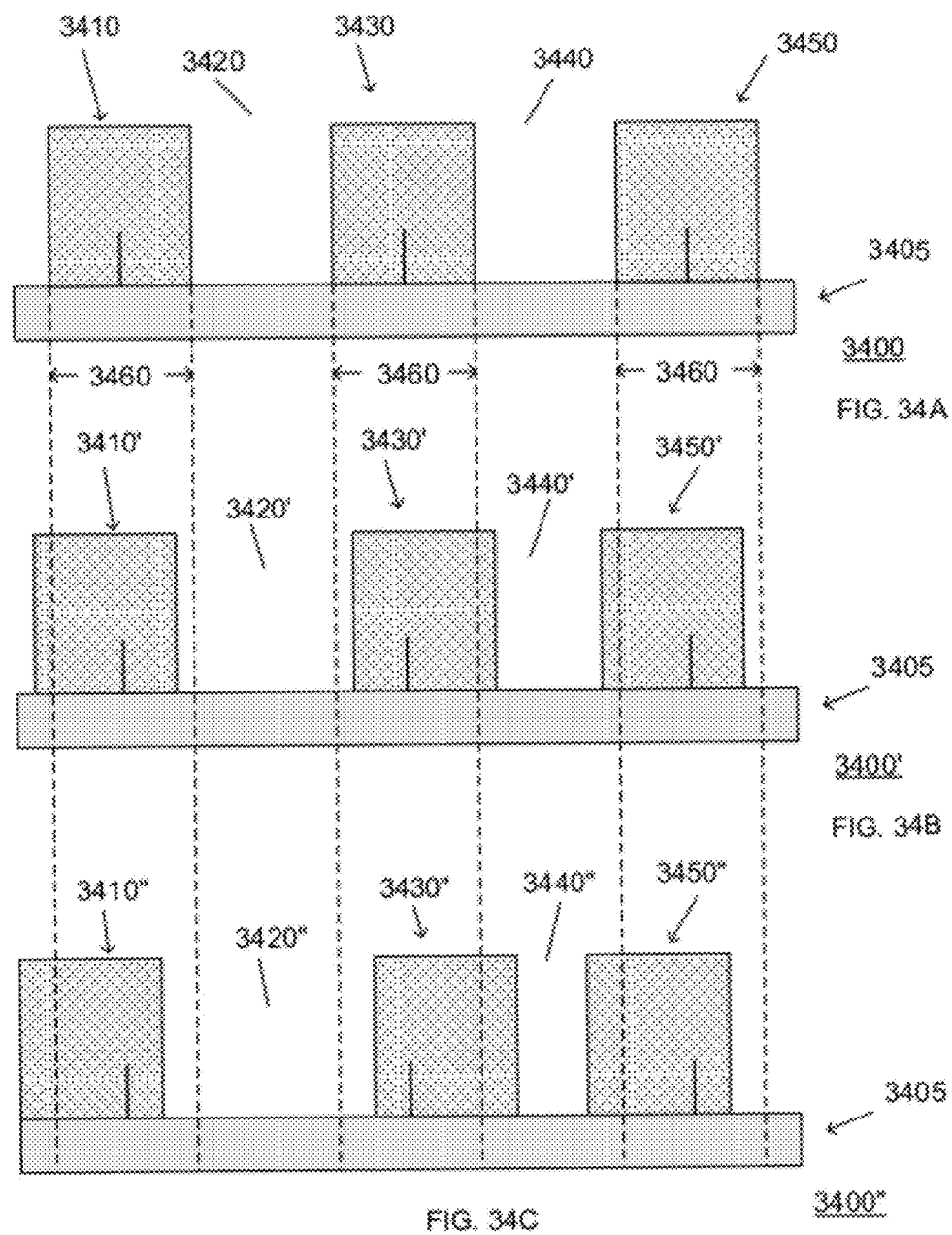

FIG. 35A
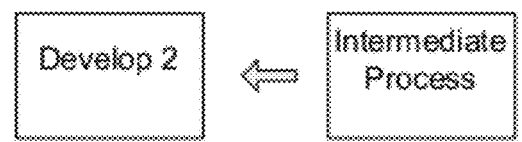
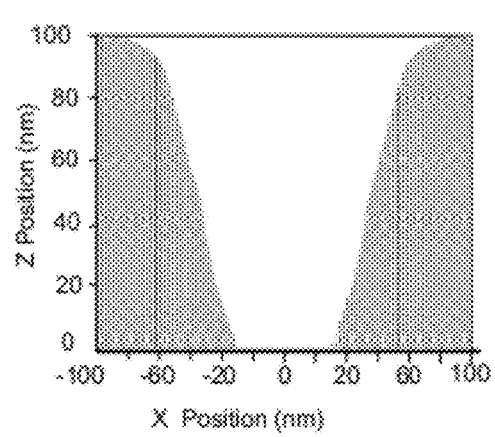
FIG. 35B
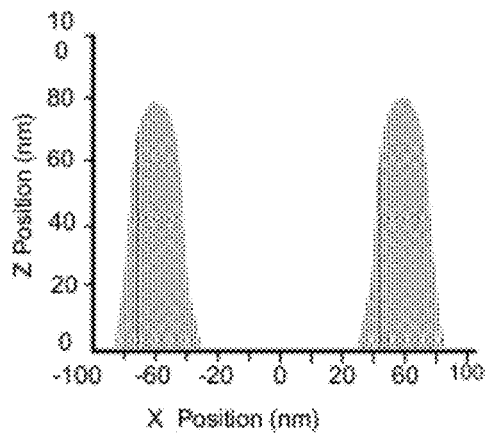
FIG. 35C

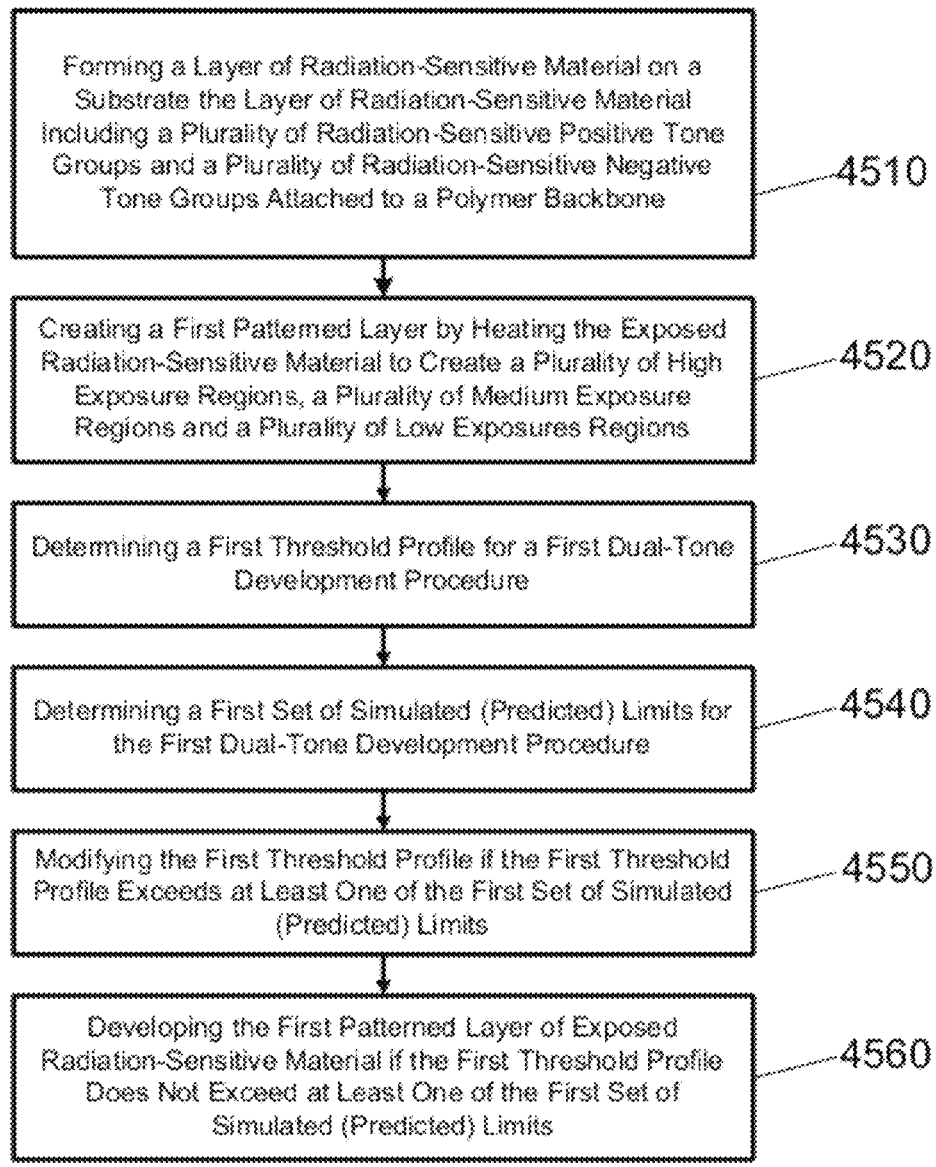
FIG. 45       4500

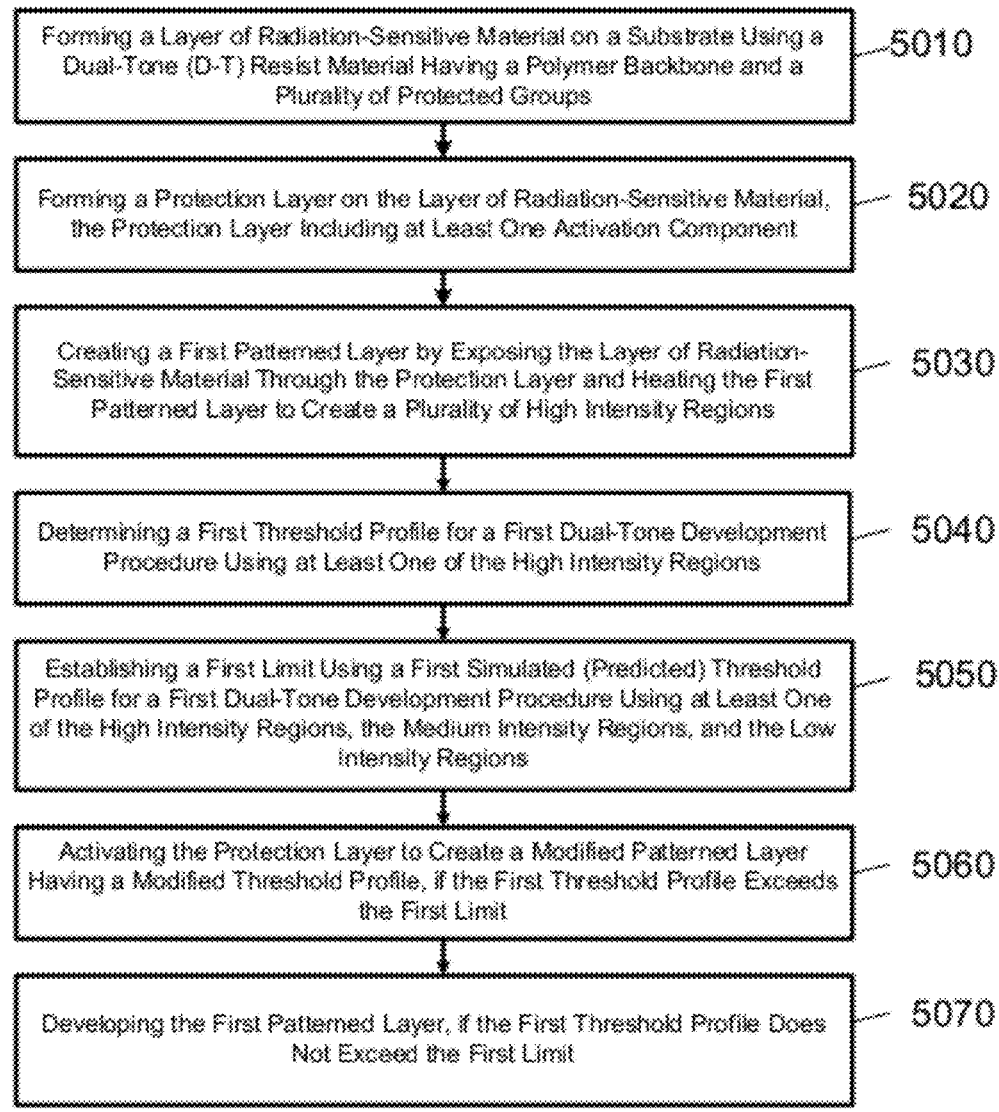
FIG. 50      5000

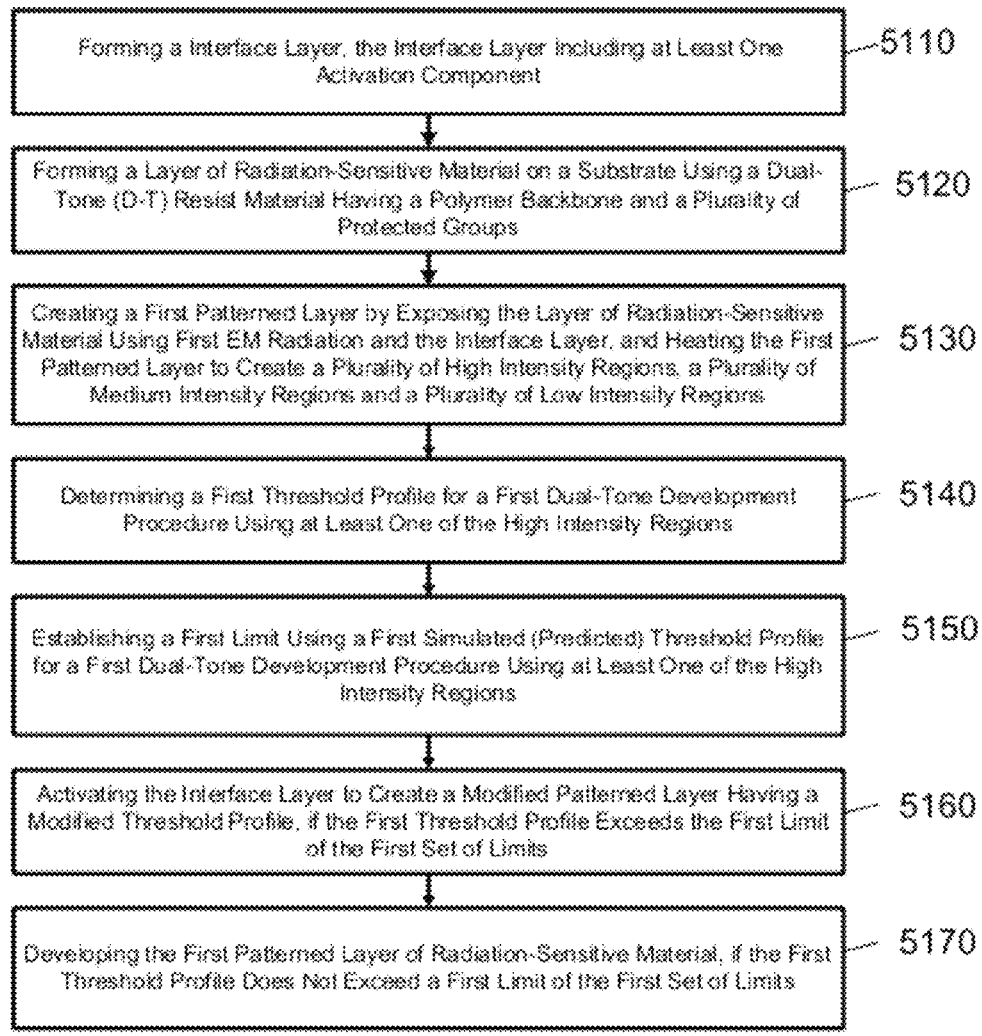
FIG. 51        5100

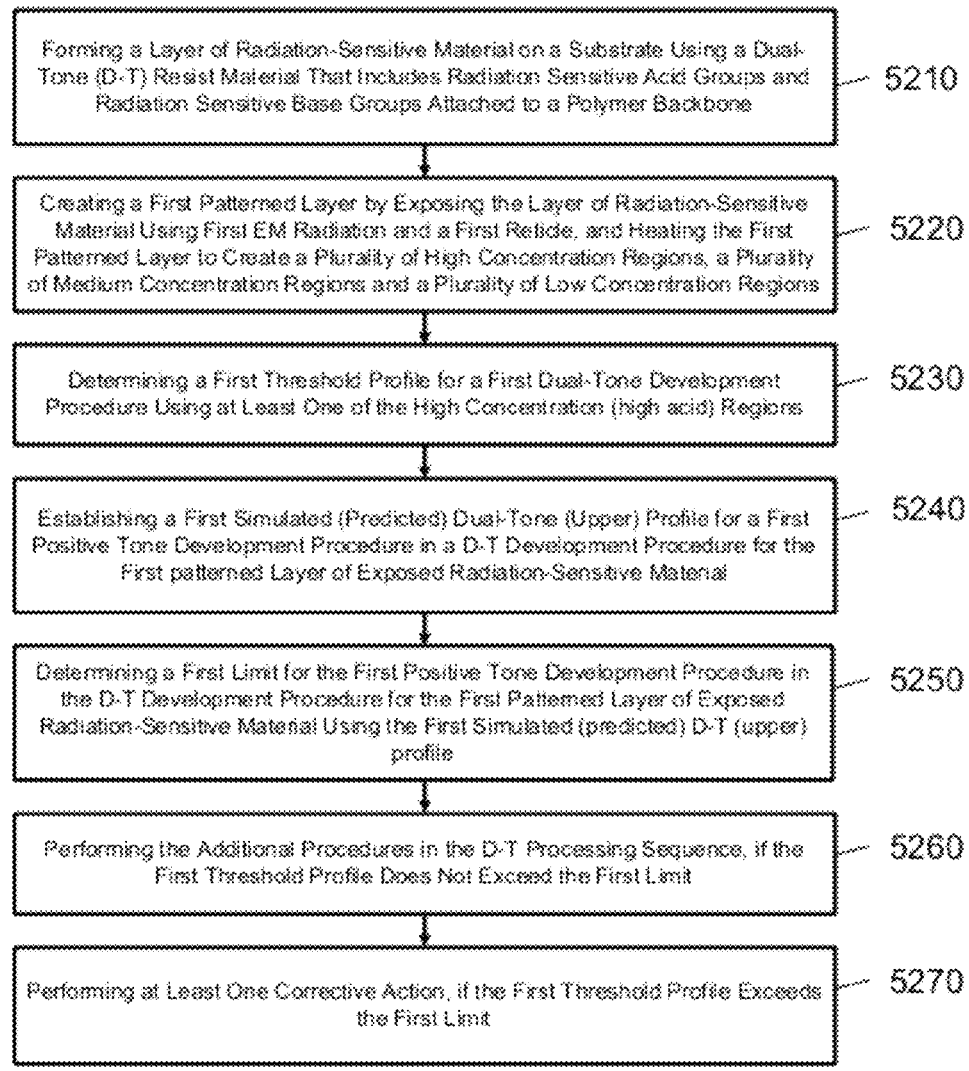
FIG. 52     5200

FIG. 54                5400

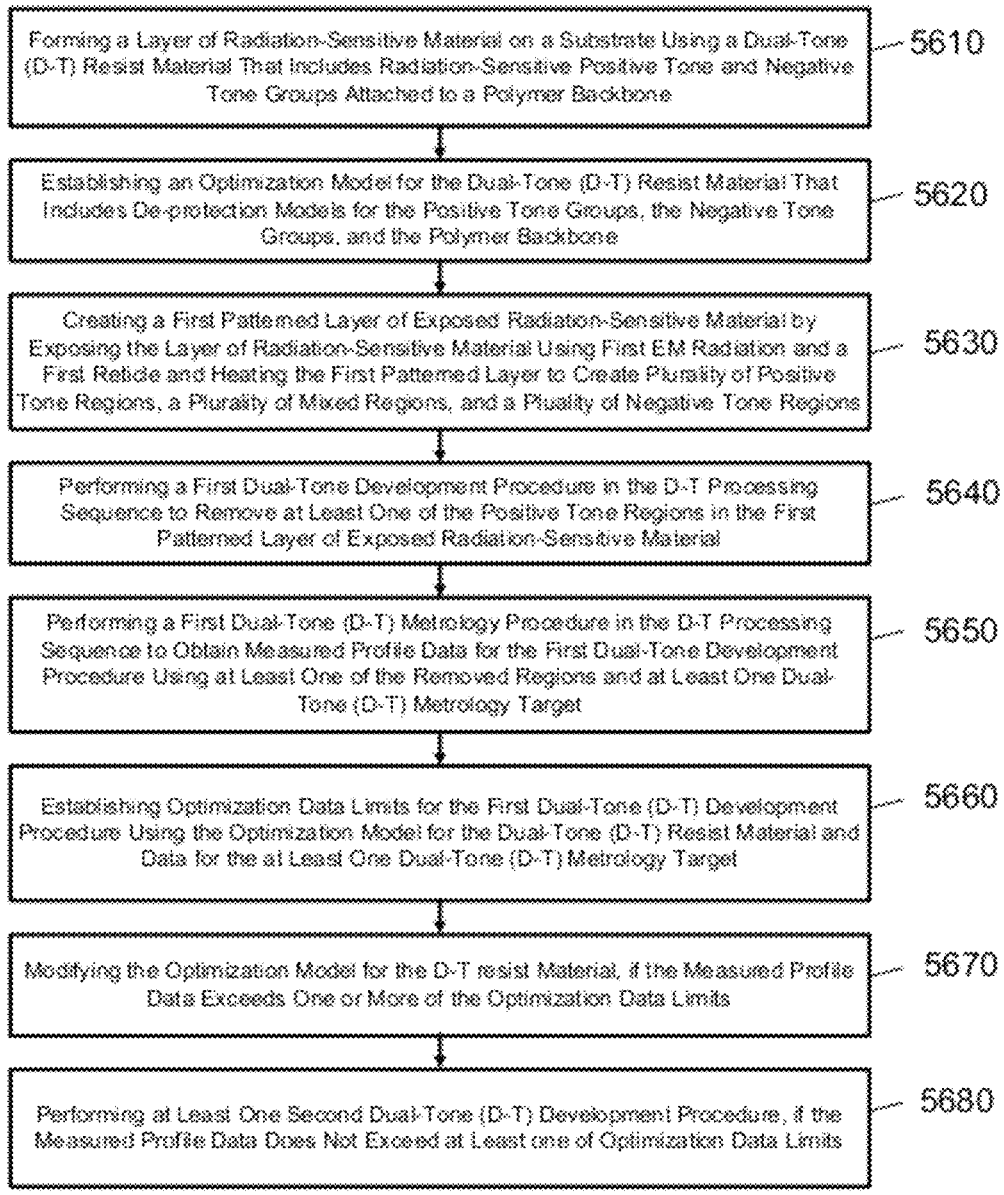
FIG. 56    5600

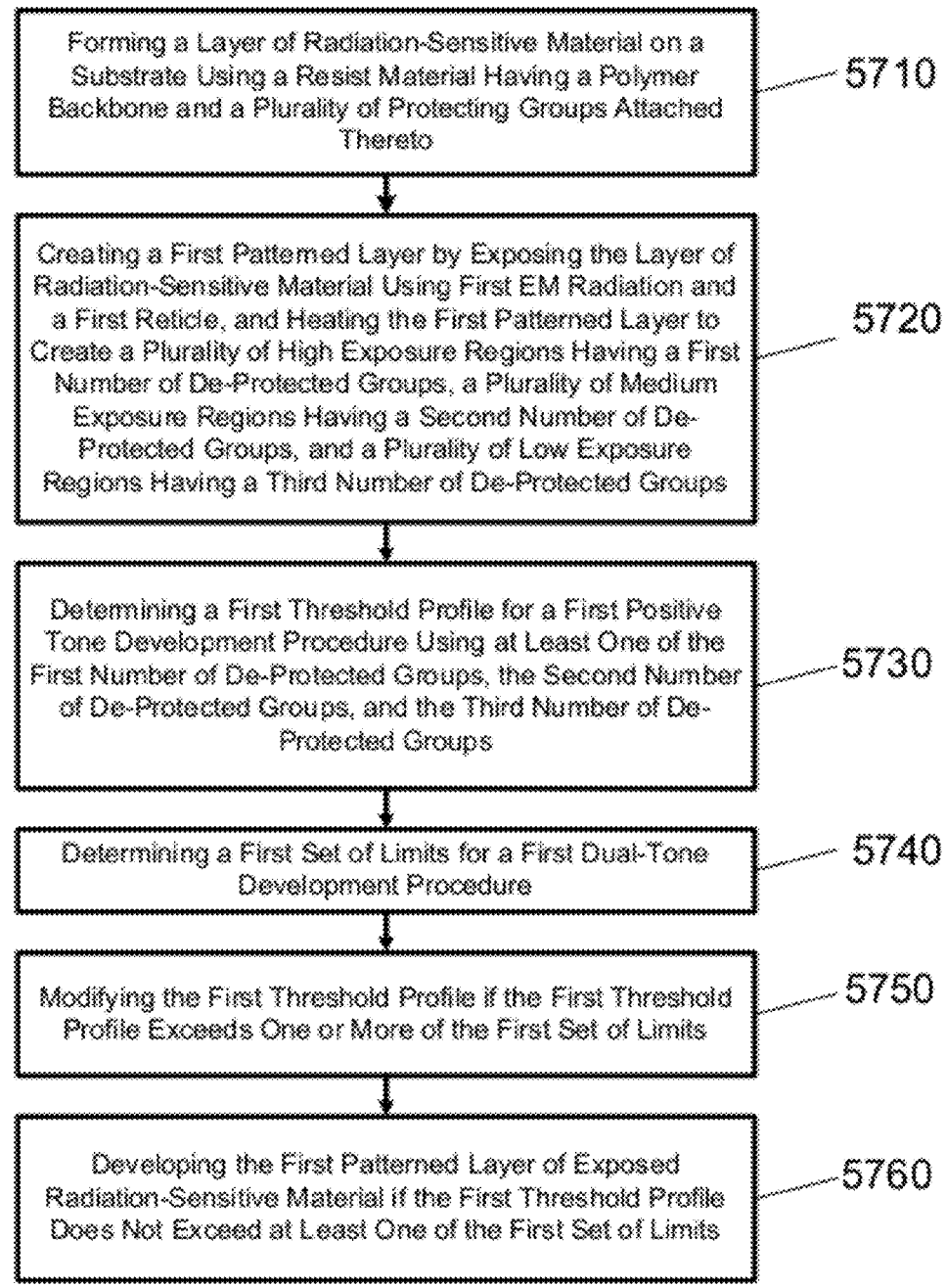
FIG. 57        5700

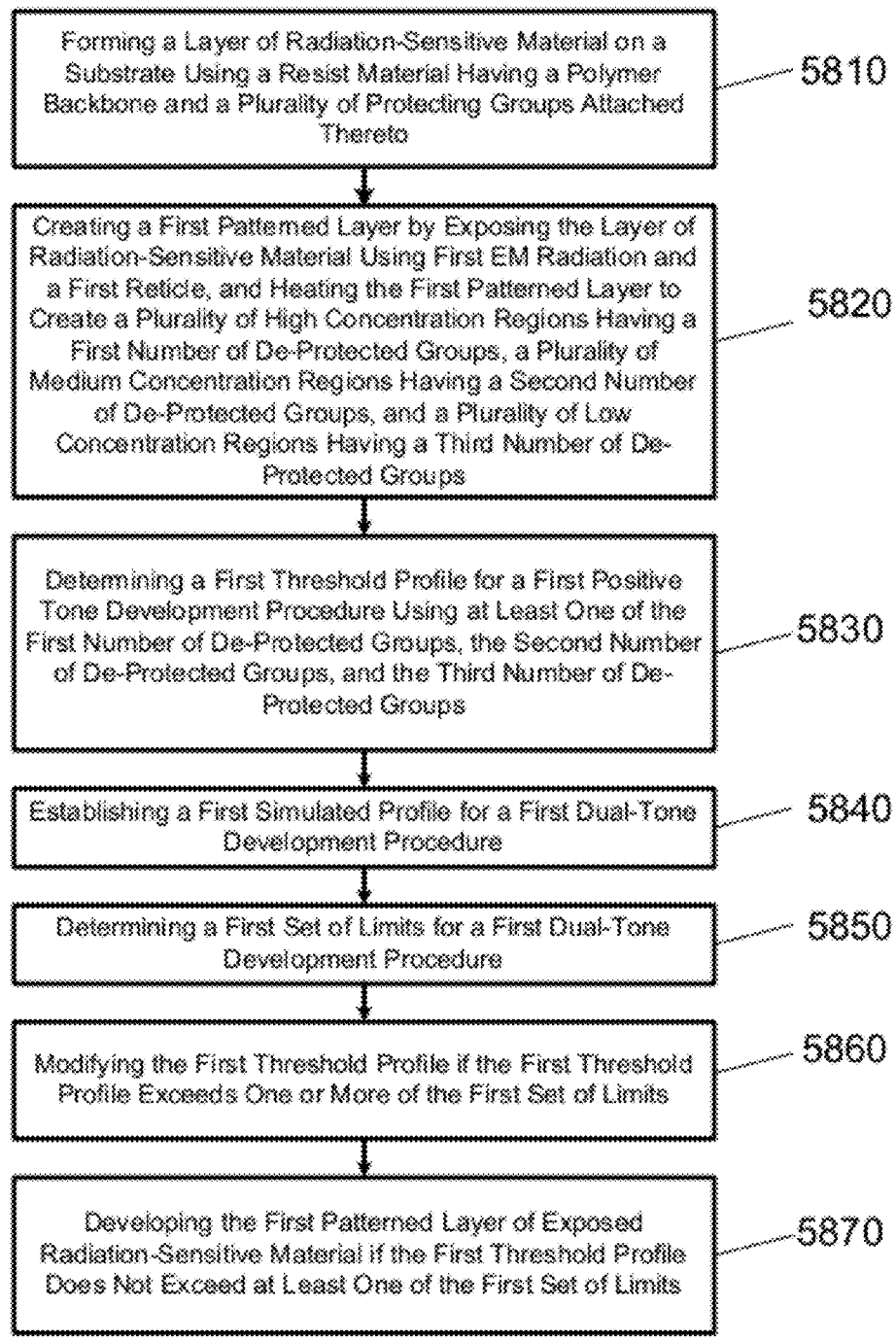
FIG. 58    5800

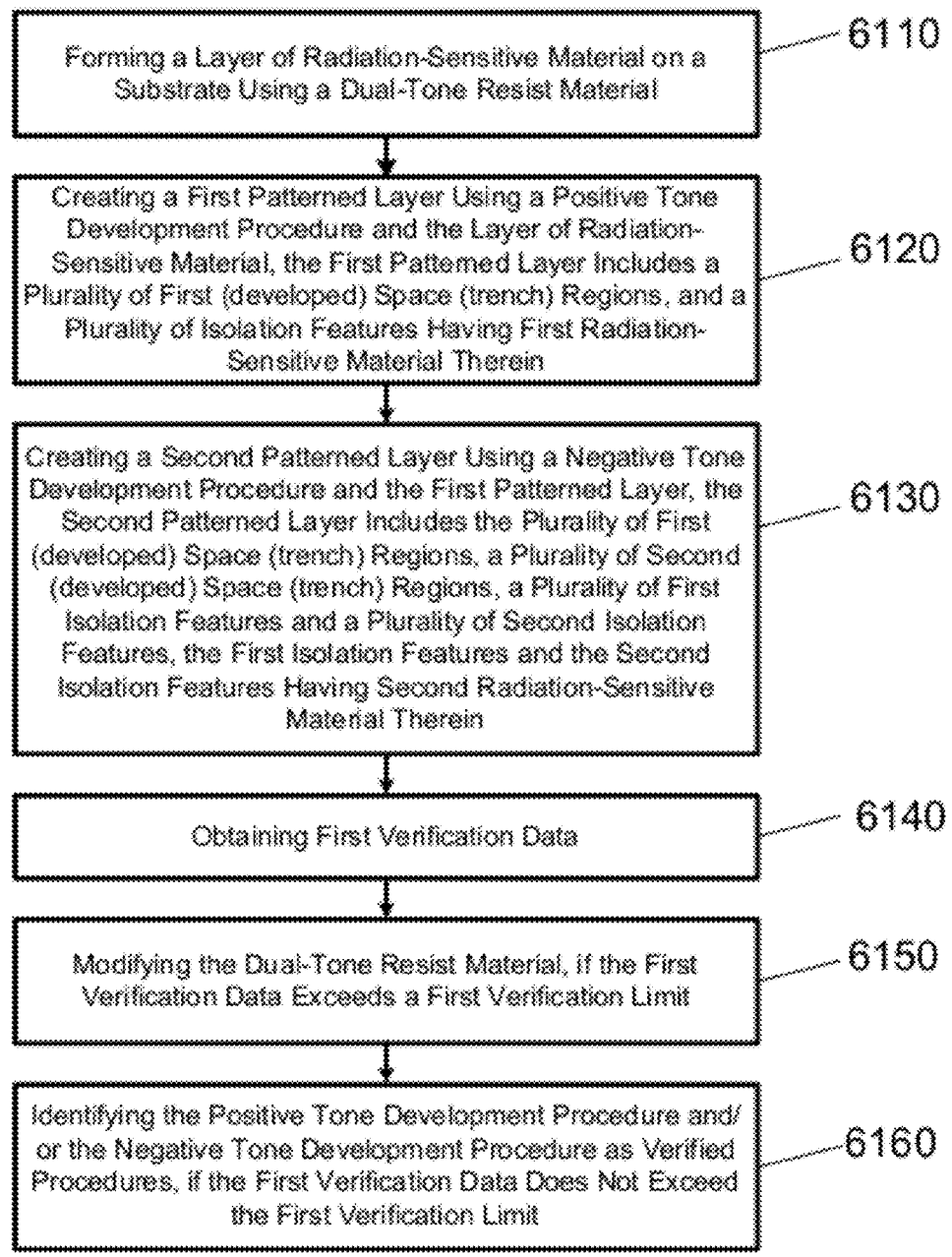
FIG. 61    6100

DUAL TONE DEVELOPMENT PROCESSES

CROSS-REFERENCE TO RELATED APPLICATIONS

This application is related to and claims priority to U.S. provisional application Ser. No. 61/098,723 filed on Sep. 19, 2008, and is related to U.S. non-provisional application Ser. No. 12/334,852 filed on Dec. 15, 2008; the entire contents of which are herein incorporated by reference.

FIELD OF THE INVENTION

1. Background of the Invention

The invention relates to a method for patterning a substrate. In particular, the invention relates to a method for patterning a substrate using dual-tone development processes.

2. Description of Related Art

In material processing methodologies, such as those used in the fabrication of micro-electronic devices, pattern etching is often utilized to define the intricate patterns associated with various integrated circuit elements. Pattern etching can include applying a patterned layer of radiation-sensitive material, such as photo-resist, to a thin film on an upper surface of a substrate, and transferring the pattern formed in the layer of radiation-sensitive material to the underlying thin film by etching.

The patterning of the radiation-sensitive material generally involves coating an upper surface of the substrate with a thin film of radiation-sensitive material and then exposing the thin film of radiation-sensitive material to a pattern of radiation by projecting radiation from a radiation source through a mask using, for example, a photolithography system. Thereafter, a developing process is performed, during which the removal of the irradiated regions of the radiation-sensitive material occurs (as in the case of positive-tone photo-resist), or the removal of non-irradiated regions occurs (as in the case of negative-tone photo-resist). The remaining radiation-sensitive material exposes the underlying substrate surface in a pattern that is ready to be etched into the surface.

As an example, for positive-tone pattern development, a typical lithographic patterning technique is shown in FIGS. 1A and 1B. As shown in FIG. 1A, a layer of positive-tone photo-resist 102 is formed on a substrate 101. The layer of photo-resist 102 is exposed to electromagnetic (EM) radiation 107 through a mask 103. Mask 103 includes transparent portions 104 and opaque features 108 that form a pattern, as shown in FIG. 1A. A distance (or pitch) 109 between opaque features 108 is shown in FIG. 1A. The transparent portions 104 transmit EM radiation 107 to the layer of positive-tone photo-resist 102, and the opaque features 108 prevent EM radiation 107 from being transmitted to the layer of positive-tone photo-resist 102. FIG. 1A shows the layer of positive-tone photo-resist 102 having exposed portions 105 that are exposed to EM radiation 107 and unexposed portions 106 that are not exposed to EM radiation 107. As shown in FIG. 1A, mask features 108 are imaged onto the layer of positive-tone photo-resist 102 to produce corresponding photo-resist features aligned with unexposed portions 106.

As shown in FIG. 1B, after removing exposed portions 105 of the layer of positive-tone photo-resist 102, unexposed portions 106 remain on substrate 101 and form the pattern transferred from mask 103 to substrate 101. As shown in FIGS. 1A and 1B, mask features 108 are imaged onto the layer of positive-tone photo-resist 102 to produce corresponding photo-resist features (i.e., unexposed portions 106). As shown in FIGS. 1A and 1B, pitch 110 between unexposed portions 106 is determined by pitch 109 between features 108 of mask 103.

As another example, for negative-tone pattern development, a typical lithographic patterning technique is shown in FIGS. 2A and 2B. As shown in FIG. 2A, a layer of negative-tone photo-resist 202 is formed on a substrate 201. The layer of negative-tone photo-resist 202 is exposed to the EM radiation 207 through a mask 203. The mask 203 includes transparent features 204 that form a pattern and opaque portions 208, as shown in FIG. 2A. A distance (pitch) 209 between transparent features 204 is shown in FIG. 2A. Transparent features 204 transmit EM radiation 207 to the layer of negative-tone photo-resist 202, and opaque portions 208 prevent EM radiation 207 from being transmitted to the layer of negative-tone photo-resist 202. FIG. 2A shows the layer of negative-tone photo-resist 202 having exposed portions 205 that are exposed to EM radiation 207 and unexposed portions 206 that are not exposed to EM radiation 207. As shown in FIG. 2A, mask features 204 are imaged onto the layer of negative-tone photo-resist 202 to produce corresponding photo-resist features aligned with exposed portions 205.

As shown in FIG. 2B, after removing unexposed portions 206 of the layer of negative-tone photo-resist 202, exposed portions 205 remain on substrate 201 and form a pattern transferred from mask 203 to substrate 201. As shown in FIGS. 2A and 2B, mask features 204 are imaged onto the layer of negative-tone photo-resist 202 to produce corresponding photo-resist features (i.e., exposed portions 205). Pitch 210 between exposed portions 205 is determined by pitch 209 between features 204 of mask 203, as shown in FIGS. 2A and 2B.

Photolithographic systems for performing the above-described material processing methodologies have become a mainstay of semiconductor device patterning for the last three decades, and are expected to continue in that role down to 32 nm resolution, and less. Typically, in both positive-tone and negative-tone pattern development, the minimum distance (i.e., pitch) between the centers of features of patterns transferred from the mask to the substrate by a lithography system defines the patterning resolution.

As indicated above, the patterning resolution ($r_o$) of a photolithographic system determines the minimum size of devices that can be made using the system. Having a given lithographic constant $k_1$, the resolution is given by the equation $$r_o = k_1 \lambda / NA, \quad (1)$$

where $\lambda$, is the operational wavelength of the EM radiation, and NA is the numerical aperture given by the equation $$NA = n \cdot \sin \theta_o. \quad (2)$$

Angle $\theta_o$ is the angular semi-aperture of the photo-lithography system, and n is the index of refraction of the material filling the space between the system and the substrate to be patterned.

Following equation (1), conventional methods of resolution improvement have lead to three trends in photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETs) such as phase-shifting masks, and off-axis illumination that have lead to a reduction in the lithographic constant $k_1$ from approximately a value of 0.6 to values approaching 0.25; and (3) increases in the numerical aperture (NA) via improvements in optical designs, manufacturing techniques, and metrology. These latter improvements have created increases in NA from approximately 0.35 to values greater than 1.35.

Immersion lithography provides another possibility for increasing the NA of an optical system, such as a lithographic system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA (see equations (1), and (2)).

However, many of these approaches, including EUV lithography, RET lithography, and immersion lithography, have added considerable cost and complexity to lithography equipment. Furthermore, many of these approaches continue to face challenges in integration and challenges in extending their resolution limits to finer design nodes.

Therefore, another trend in photolithographic technology is to utilize a double patterning approach, which has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, a layer of radiation-sensitive material on the substrate is exposed to a first pattern, the first pattern is developed in the radiation-sensitive material, the first pattern formed in the radiation-sensitive material is transferred to an underlying layer using an etching process, and then this series of steps is repeated for a second pattern, while shifting the second pattern relative to the first pattern. Herein, the double patterning approach may require an excessive number of steps, including exiting the coating/developing tool and re-application of a second layer of radiation-sensitive material.

Another approach to double the resolution of a lithographic pattern is to utilize a dual-tone development approach, and a layer of radiation-sensitive material on the substrate is exposed to a pattern of radiation, and then a double pattern is developed into the layer of radiation-sensitive material by performing a positive-tone development and a negative-tone development. However, current dual-tone development approaches lack the ability to adjust, control and/or optimize the double pattern formed on the substrate.

SUMMARY OF THE INVENTION

The invention relates to a method for patterning a substrate. In particular, the invention relates to a method for patterning a substrate using dual-tone development. Further, the invention relates to the implementation of resolution enhancement techniques, electronic design automation, novel hardware, novel control strategies, and novel materials in a dual-tone development process.

BRIEF DESCRIPTION OF THE DRAWINGS

In the accompanying drawings:

FIGS. 30, 31, 32A, 32B, 32C, 33A, 33B, and 33C illustrate additional exemplary data for patterning a substrate;

FIGS. 34A-34C illustrate a simplified view of a re-tuning process in accordance with embodiments of the invention;

FIGS. 35A-35C illustrate a simplified flow diagram and exemplary resist profiles for an exemplary dual-tone processing sequence in accordance with embodiments of the invention;

FIG. 45 illustrates another simplified flow diagram for a method of patterning a substrate in accordance with embodiments of the invention;

FIGS. 50-58 illustrate simplified flow diagrams for additional methods of patterning a substrate in accordance with embodiments of the invention

FIG. 61 illustrates an additional simplified flow diagram for a method of double patterning a substrate in accordance with embodiments of the invention.

DETAILED DESCRIPTION OF EXEMPLARY EMBODIMENTS

Figure 1A:
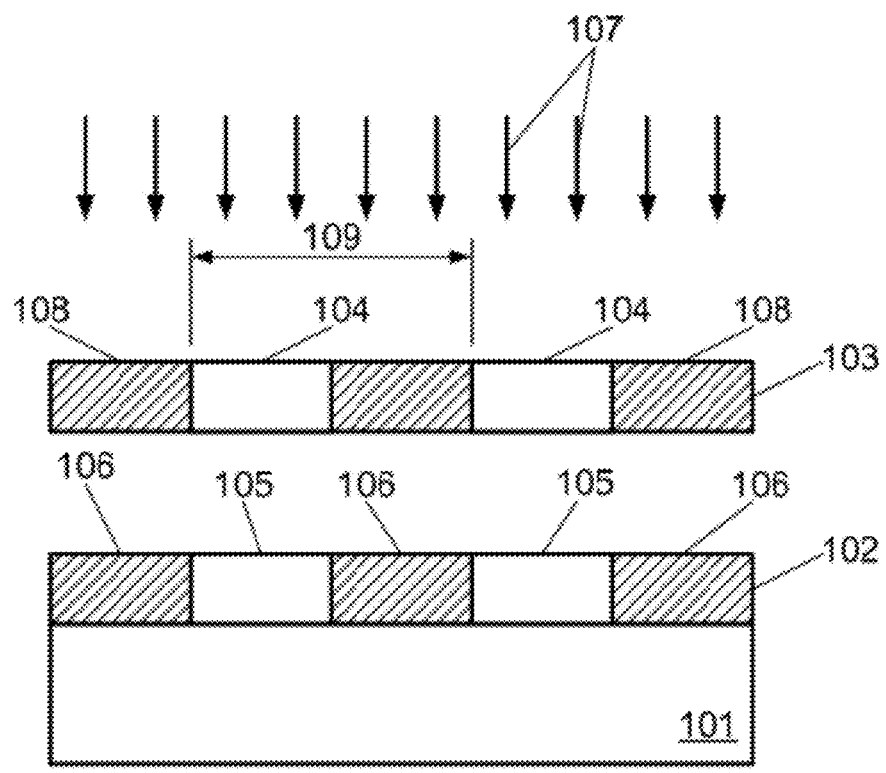
FIGS. 1A and 1B illustrate a lithographic patterning technique utilizing a positive-tone photo-resist according to the prior art.
Figure 1B:
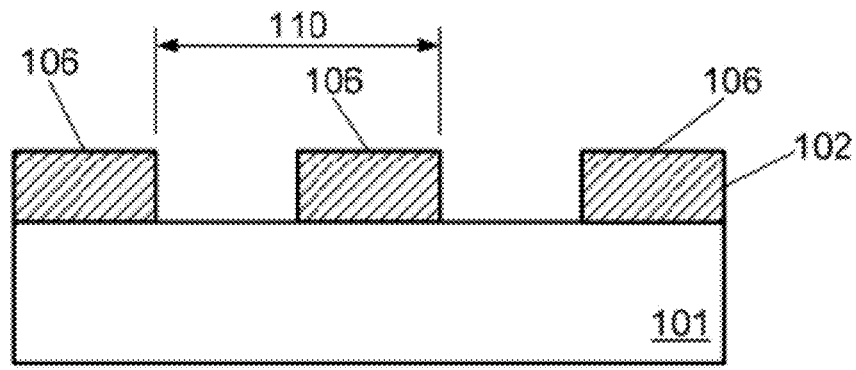
Figure 2A:
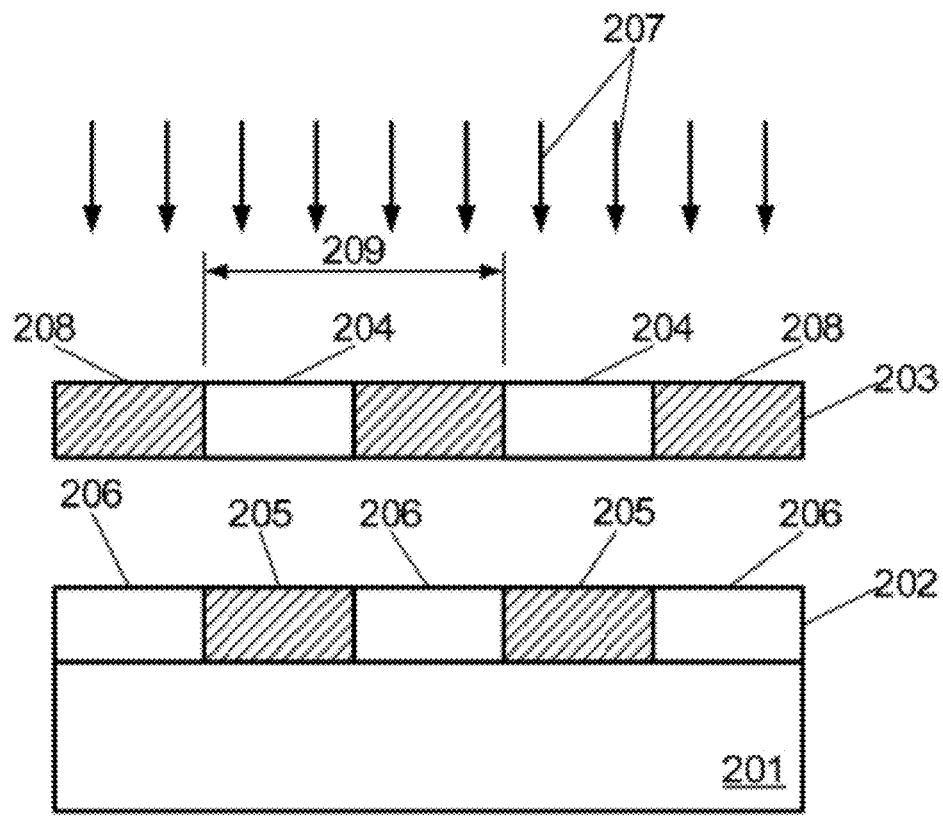
FIGS. 2A and 2B illustrate a lithographic patterning technique utilizing a negative-tone photo-resist according to the prior art.
Figure 2B:
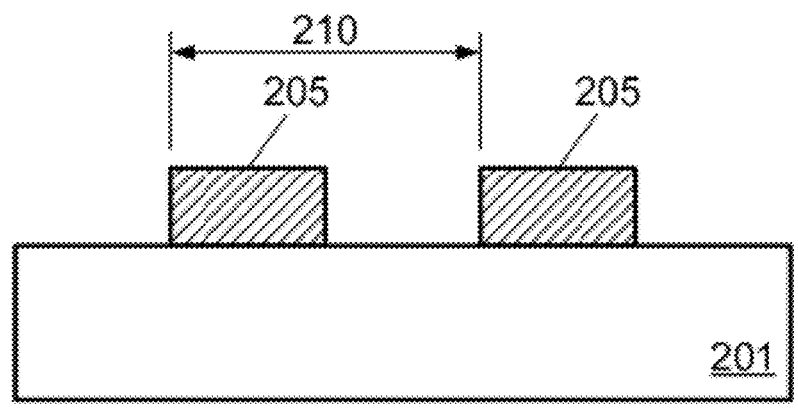

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Methods for patterning a substrate, including methods to reduce the minimum pitch of a pattern that can be transferred onto a substrate for a given lithographic tool and mask, are described herein. Multiple chemical treatments on exposed radiation-sensitive materials, such as photo-resist, are used to achieve a reduction in a lithographic pitch of about a factor of two.

According to an embodiment, a method of patterning a substrate to double the resolution of a lithographic pattern is described. The patterning process utilizes a dual-tone development approach, and a layer of radiation-sensitive material applied to the substrate is exposed to a pattern of radiation, and then a double pattern is developed into the layer of radiation-sensitive material by performing a positive-tone development followed by a negative-tone development. Furthermore, a critical dimension of the features formed in the double pattern is adjusted, controlled and/or optimized to meet pre-specified pattern requirements that may include a pre-specified critical dimension. This adjusting, controlling and/or optimizing include altering any process step, or altering a combination of steps in the double patterning process. For example, the altering of any step or a combination of steps may include adding, subtracting, and/or re-ordering the combination of steps.

Figure 3:
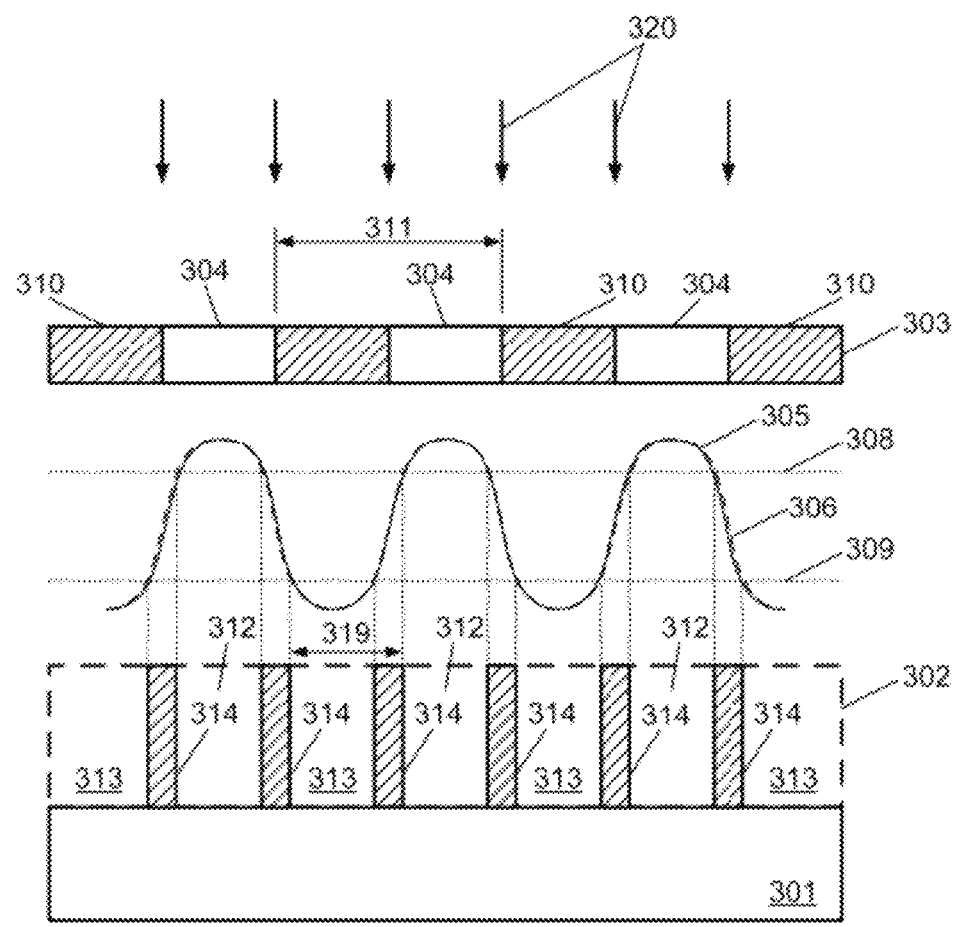
FIG. 3 illustrates a method of patterning a substrate.

FIG. 3 illustrates a method of transferring a pattern from a mask onto a substrate according to one embodiment. A layer of radiation-sensitive material 302, such as photo-resist, is formed on a substrate 301, and then it is exposed to radiation 320 from a radiation source of a lithography system (not shown) using a mask 303. Mask 303 has opaque features 310 that are periodically spaced at a mask pitch 311 and transparent portions 304, as shown in FIG. 3.

According to one embodiment, the radiation-sensitive material 302 can include photo-resist. According to another embodiment, the radiation-sensitive material 302 can include a 248 nm photo-resist, a 193 nm photo-resist, a 157 nm photo-resist, or an extreme ultraviolet photo-resist, or a combination of two or more thereof. According to another embodiment, the radiation-sensitive material 302 can include a positive-tone photo-resist, or a negative-tone photo-resist. According to another embodiment, the radiation-sensitive material 302 can include a dual-tone photo-resist. A dual-tone photo-resist may be characterized as a photo-resist that behaves as a positive-tone photo-resist or a negative-tone photo-resist depending upon the developing chemistry that is utilized. According to another embodiment, the radiation-sensitive material 302 can include a photo-resist that switches solubility due to a change in polarity upon exposure to the pattern of radiation and an optionally elevation of the temperature of the substrate following the exposure. According to another embodiment, the radiation-sensitive material 302 can include a photo-resist that provides acid-catalyzed de-protection upon exposure to the pattern of radiation and an optional elevation of the temperature of the substrate following the exposure.

FIG. 3 shows a radiation exposure profile 305 and a resist response profile 306 of a response produced in the layer of radiation-sensitive material 302 by a pattern of radiation resulting from the projection of radiation 320 through mask 303 using the lithography system. As shown in FIG. 3, first radiation-sensitive material portions 312 that correspond to transparent portions 304 receive a high radiation exposure from radiation 320, second radiation-sensitive material portions 313 that correspond to opaque features 310 receive a low radiation exposure from radiation 320, and third radiation-sensitive material portions 314 that approximately correspond to edges of opaque features 310 receive an intermediate radiation exposure from radiation 320. As shown in FIG. 3, the resist response profile 306 corresponding to the first radiation-sensitive material portions 312 of radiation-sensitive material 302 is higher than an upper threshold 308, while the resist response profile 306 corresponding to the second radiation-sensitive material portions 313 is lower than a lower threshold 309. Further, the resist response profile 306 corresponding to the third radiation-sensitive material portions 314 lies between the lower threshold 309 and the upper threshold 308.

In one embodiment, when the layer of radiation-sensitive material 302 includes a positive-tone photo-resist, resist response profile 306 may represent a chemical concentration of de-protected polymers in the layer of radiation-sensitive material 302 that is approximately proportional to radiation exposure profile 305, as shown in FIG. 3. In another embodiment, when the layer of radiation-sensitive material 302 includes a positive-tone photo-resist, resist response profile 306 may be an acid concentration in the layer of radiation-sensitive material 302 that is proportional to radiation exposure profile 305. In another embodiment, when the layer of radiation-sensitive material 302 includes a negative-tone photo-resist, resist response profile 306 is an average polymer molecular weight in the layer of radiation-sensitive material 302 that is proportional to radiation exposure profile 305.

In one embodiment, upper threshold 308 corresponds to a first threshold of solubility of the layer of radiation-sensitive material 302 when a first chemistry is applied. In one embodiment, lower threshold 309 corresponds to a second threshold of solubility of the layer of radiation-sensitive material 302 when a second chemistry is applied. In one embodiment, first radiation-sensitive material portions 312 of the layer of radiation-sensitive material 302 that correspond to transparent portions 304 that have high radiation exposure in radiation exposure profile 305 are selectively removed from substrate 301 using a first chemistry. Second radiation-sensitive material portions 313 of the layer of radiation-sensitive material 302 that have low radiation exposure in the radiation exposure profile 305 are selectively removed from substrate 301 using a second chemistry. The third radiation-sensitive material portions 314 that correspond to approximately the edges of opaque features 310 that have intermediate exposure in the radiation exposure profile 305 (i.e., radiation exposure between the upper threshold 308 and the lower threshold 309) remain on substrate 301 intact, as shown in FIG. 3. Selectively removing first radiation-sensitive material portions 312 and second radiation-sensitive material portions 313 using different chemistries while leaving third radiation-sensitive material portions 314 on substrate 301 intact.

In one embodiment, for first radiation-sensitive material portions 312, resist response profile 306 includes a concentration of acid in the layer of radiation-sensitive material 302 that is higher than an upper threshold 308 of acid concentration. In one embodiment, upper threshold 308 represents an acid level solubility threshold of the layer of radiation-sensitive material 302. For example, if an acid concentration in the layer of radiation-sensitive material 302 is higher than the upper threshold 308 of acid concentration, the layer of radiation-sensitive material 302 becomes soluble when a first chemistry is applied.

In one embodiment, for second radiation-sensitive material portions 313, resist response profile 306 includes a concentration of acid in the layer of radiation-sensitive material that is lower than lower threshold 309 of acid concentration. In one embodiment, lower threshold 309 represents another acid level solubility threshold of the layer of radiation-sensitive material 302. For example, if acid concentration in the layer of radiation-sensitive material 302 is lower than lower threshold 309 of acid concentration, the layer of radiation-sensitive material 302 becomes soluble when a second chemistry is applied.

In one embodiment, the layer of radiation-sensitive material 302 includes an upper acid concentration threshold in ranging from about 30% to about 60% of the clear field acid concentration and a lower acid concentration threshold ranging from about 10% to about 25% of the clear field acid concentration. In one embodiment, the clear field acid concentration is defined as the acid level of the photo-resist completely exposed to radiation. In another embodiment, the clear field acid concentration is defined as the acid concentration when all the PAG (Photo Acid Generation) material has reacted with radiation to produce acid species.

Due to diffraction of radiation 320, the third radiation-sensitive material portions 314 corresponding to intermediate radiation exposure are created. In one embodiment, third radiation-sensitive material portions 314 comprise an acid concentration between the upper acid concentration threshold and the lower acid concentration threshold. The first radiation-sensitive material portions 312 corresponding to high radiation exposure are selectively removed from the substrate using a first chemistry. The second radiation-sensitive material portions 313 corresponding to low radiation exposure are selectively removed from the substrate using a second chemistry. The third radiation-sensitive material portions 314 corresponding to intermediate radiation exposure remain on substrate 301 to form a pattern transferred by mask 303 and the lithography system.

As shown in FIG. 3, two photo-resist features (i.e., third radiation-sensitive material portions 314) are produced for every one mask feature 310, thereby doubling the amount of the pattern features on substrate 301. As a result, feature pitch 319 between the centers of photo-resist features (i.e., third radiation-sensitive material portions 314) becomes twice as small as the mask pitch 311 of the mask 303, as shown in FIG. 3.

Figure 4A:
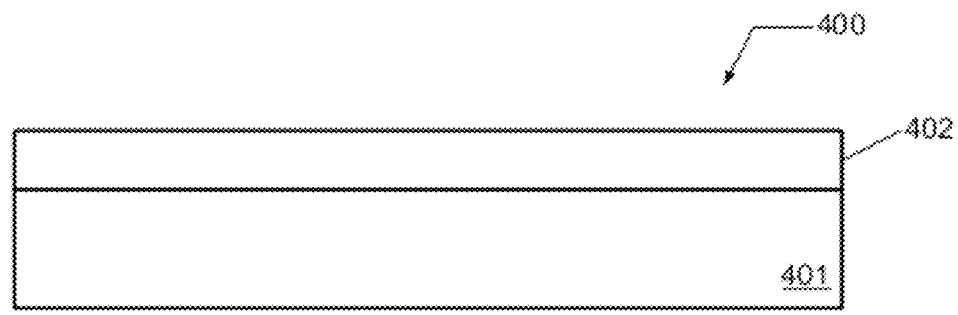
FIGS. 4A through 4D illustrate a method of patterning a substrate.

Referring now to FIGS. 4A through 4D, a method of patterning a substrate is illustrated according to another embodiment. As illustrated in FIG. 4A, a lithographic structure 400 is prepared by forming a layer of radiation-sensitive material 402 on a substrate 401.

The substrate 401 may comprise a semiconductor, e.g., mono-crystalline silicon, germanium, and any other semiconductor. In alternate embodiments, substrate 401 may comprise any material used to fabricate integrated circuits, passive microelectronic devices (e.g., capacitors, inductors) and active microelectronic devices (e.g., transistors, photo-detectors, lasers, diodes). Substrate 401 may include insulating materials that separate such active and passive microelectronic devices from a conductive layer or layers that are formed on top of them. In one embodiment, substrate 401 can include a p-type mono-crystalline silicon substrate that includes one or more insulating layers e.g., silicon dioxide, silicon nitride, sapphire, and other insulating materials.

As described above, the substrate 401 may comprise a film stack having one or more thin films disposed between the substrate 401 and the layer of radiation-sensitive material 402. Each thin film may comprise a conductive layer, a nonconductive layer, or a semi-conductive layer. For instance, the thin film may include a material layer that can include a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

According to one embodiment, the radiation-sensitive material 402 can include photo-resist. According to another embodiment, the radiation-sensitive material 402 can include a 248 nm photo-resist, a 193 nm photo-resist, a 157 nm photo-resist, or an extreme ultraviolet photo-resist, or a combination of two or more thereof. According to another embodiment, the radiation-sensitive material 402 can include a positive-tone photo-resist, or a negative-tone photo-resist. According to another embodiment, the radiation-sensitive material 402 can include a dual-tone photo-resist. According to another embodiment, the radiation-sensitive material 402 can include poly(hydroxystyrene)-based resist or a (meth)acrylate-based resist. According to another embodiment, the radiation-sensitive material 402 can include a photo-resist that switches solubility due to a change in polarity upon exposure to the pattern of radiation and an optionally elevation of the temperature of the substrate following the exposure. According to another embodiment, the radiation-sensitive material 402 can include a photo-resist that provides acid-catalyzed de-protection upon exposure to the pattern of radiation and an optional elevation of the temperature of the substrate following the exposure.

The layer of radiation-sensitive material 402 may be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Following the application of the layer of radiation-sensitive material 402 to substrate 401, the layer of radiation-sensitive material may be thermally treated in a post-application bake (PAB). For example, a temperature of the substrate may be elevated to about 50 degrees C. to about 200 degrees C. for a time duration of about 30 seconds to about 180 seconds. A track system having post-application substrate heating and cooling equipment may be used to perform the PAB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Figure 4B:
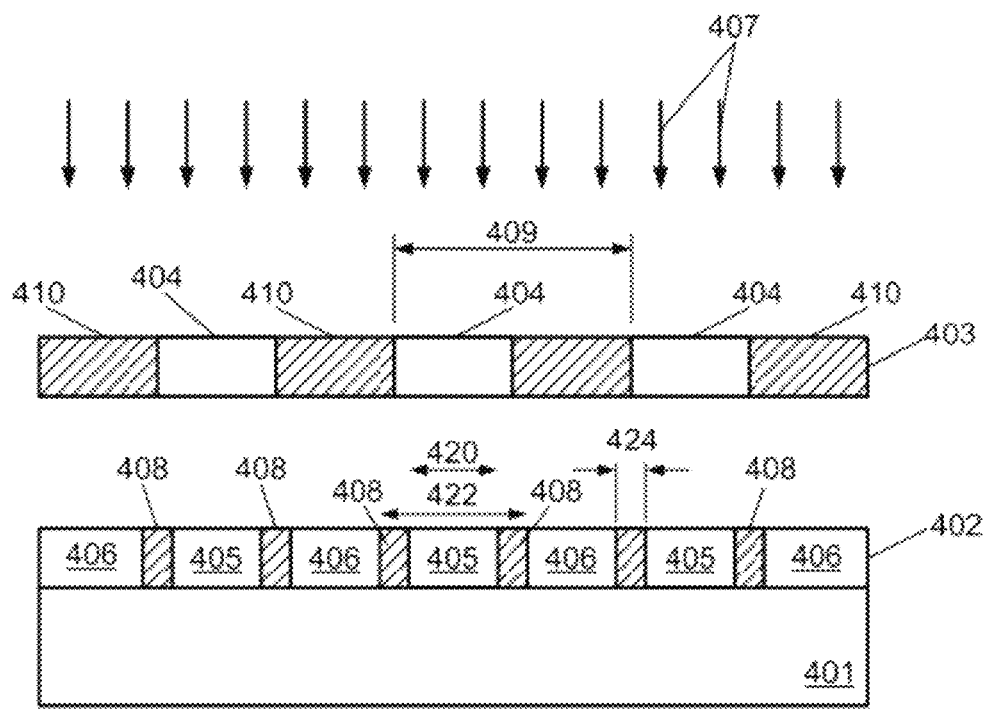

As shown in FIG. 4B, the layer of radiation-sensitive material 402 is exposed to radiation 407 through a mask 403. The mask 403 can include opaque features 410 that prevent radiation 407 from being transmitted to the layer of radiation-sensitive material 402 and transparent portions 404 that transmit the radiation 407 to the layer of radiation-sensitive material 402. Mask 403 may include any mask suitable for use in wet or dry lithography, including wavelengths ranging from about 365 nm to about 13 nm. Mask 403 may include a binary mask or chrome on glass mask. Alternatively, mask 403 may include an alternating phase shift mask, or an embedded phase shift mask.

The exposure of the layer of radiation-sensitive material 402 to the pattern of EM radiation may be performed in a dry or wet photo-lithography system. The lithography system may be capable of providing a pattern of EM radiation at wavelengths of 365 nm, 248 nm, 193 nm, 157 nm, and 13 nm. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Mask 403 can be illuminated, for example, with normal incident light and off-axis illumination light, such as annular illumination, quadrupole illumination, and dipole illumination. These methods of illumination and exposing the layer of radiation-sensitive material 402 to radiation using the mask 403 are known to one of ordinary skill in the art of microelectronic device manufacturing.

As shown in FIG. 4B, radiation 407 is projected through mask 403 to the layer of radiation-sensitive material 402. The radiation exposure forms one or more first radiation-sensitive material portions 405, one or more second radiation-sensitive material portions 406, and one or more third radiation-sensitive material portions 408 in the layer of radiation-sensitive material 402. As shown in FIG. 4B, the one or more second radiation-sensitive material portions 406 that correspond to opaque features 410 of mask 403 have low exposure to radiation 407, the one or more first radiation-sensitive material portions 405 that correspond to transparent portions 404 of mask 403 have high exposure to radiation 407, and the one or more third radiation-sensitive material portions 408 that correspond approximately to the edges of opaque features 410 of mask 403 have an intermediate exposure to radiation 407. The one or more third radiation-sensitive material portions 408 of intermediate radiation exposure are created because of diffraction of radiation 407 from the edges of opaque features 410.

In one embodiment, the one or more first radiation-sensitive material portions 405 corresponding to high radiation exposure receive about 50% or more of radiation 407 incident on substrate 401, the one or more second radiation-sensitive material portions 406 corresponding to low radiation exposure receive less than 15% of the radiation 407 incident on substrate 401, and the one or more third radiation-sensitive material portions 408 corresponding to intermediate radiation exposure receive between about 15% and about 50% of the radiation 407 incident on substrate 401.

In one embodiment, high exposure to radiation 407 increases the concentration of an acid in the one or more first radiation-sensitive material portions 405 to a level higher than an upper acid concentration threshold. The upper acid concentration threshold is a first solubility threshold of the layer of radiation-sensitive material 402. In one embodiment, when the concentration of the acid in the one or more first radiation-sensitive material portions 405 increases to a level higher than the first threshold of solubility of the layer of radiation-sensitive material 402 (e.g., acid or base concentration threshold), the one or more first radiation-sensitive material portions 405 become soluble when a first chemistry is applied.

In another embodiment, when the chemical concentration of de-protected polymers in the one or more first radiation-sensitive material portions 405 increases to a level higher than the first threshold of solubility of the layer of radiation-sensitive material 402 (e.g., acid or base concentration threshold), the one or more first radiation-sensitive material portions 405 become soluble when a first chemistry is applied.

In yet another embodiment, when the average polymer molecular weight in the one or more first radiation-sensitive material portions 405 increases to a level higher than the first threshold of solubility of the layer of radiation-sensitive material 402, the one or more first radiation-sensitive material portions 405 become soluble when the first chemistry is applied.

In the one or more second radiation-sensitive material portions 406 corresponding to low radiation exposure, a concentration of an acid and/or chemical concentration of de-protected polymers is less than a lower threshold of solubility of the layer of radiation-sensitive material 402 (e.g., acid or base concentration threshold). The one or more second radiation-sensitive material portions 406 become soluble when a second chemistry is applied.

In another embodiment, when the concentration of average polymer molecular weight in one or more second radiation-sensitive material portions 406 is lower than the second threshold of solubility of the layer of radiation-sensitive material 402, the one or more second radiation-sensitive material portions 406 become soluble when the second chemistry is applied.

Typically, the first solubility threshold and the second solubility threshold are determined by a material property of the layer of radiation-sensitive material 402. The one or more third radiation-sensitive material portions 408 corresponding to an intermediate radiation exposure have an acid concentration between about the first solubility threshold and the second solubility threshold. That is, the one or more third radiation-sensitive material portions 408 are not soluble when each of the first chemistry and the second chemistry is applied to layer of radiation-sensitive material 402.

Following the exposure of the layer of radiation-sensitive material 402 to EM radiation, the exposed layer of radiation-sensitive material may be thermally treated in a post-exposure bake (PEB). For example, a temperature of the substrate may be elevated to about 50 degrees C. to about 200 degrees C. for a time duration of about 30 seconds to about 180 seconds. A track system having post-exposure substrate heating and cooling equipment may be used to perform the PEB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Referring still to FIG. 4B, the one or more first radiation-sensitive material portions 405 may be characterized by a first critical dimension 420. For example, the first critical dimension may be related to a positive-tone critical dimension following positive-tone developing. Additionally, the one or more second radiation-sensitive material portions 406 may be characterized by a second critical dimension 422. As shown in FIG. 4B, the second critical dimension 422 represents an inner dimension of the one or more second radiation-sensitive material portions 406 (beyond which these portions exist). For example, the second critical dimension 422 may be related to a negative-tone critical dimension following negative-tone developing. Furthermore, the one or more third radiation-sensitive material portions 408 may be characterized by a third critical dimension 424. For example, the third critical dimension 424 may be related to a feature critical dimension for the features 430 (see FIG. 4D) remaining on substrate 401.

Figure 4C:
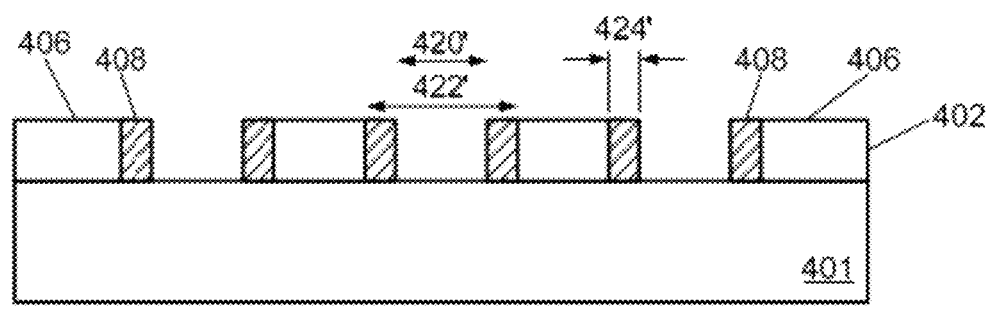

Referring now to FIG. 4C, the one or more first radiation-sensitive material portions 405 corresponding to high radiation exposure are selectively removed using a first developing process that can include a first chemistry. In one embodiment, the first chemistry to selectively remove the one or more first radiation-sensitive material portions 405 includes a base, e.g., alkali, amines, etc. In one embodiment, the first chemistry to selectively remove the one or more first radiation-sensitive material portions 405 includes tetramethylammonium hydroxide (TMAH). In another embodiment, the first chemistry to selectively remove the one or more first radiation-sensitive material portions 405 includes a base, water, and an optional surfactant.

In one embodiment, substrate 401 having the exposed layer of radiation-sensitive material 402 is immersed into a development solution containing the first chemistry to remove soluble one or more first radiation-sensitive material portions 405. Thereafter, the substrate 401 is dried. The developing process may be performed for a pre-specified time duration (e.g., about 30 seconds to about 180 seconds), a pre-specified temperature (e.g., room temperature), and a pre-specified pressure (atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4C, a first critical dimension 420' (corresponding to the one or more first radiation-sensitive material portions 405), a second critical dimension 422' (corresponding to the one or more second radiation-sensitive material portions 406), or a third critical dimension 424' (corresponding to the one or more third radiation-sensitive material portions 408) may be adjusted, controlled, and/or optimized, as will be discussed below.

As illustrated in FIG. 4C, the one or more second radiation-sensitive material portions 406 and the one or more third radiation sensitive material portions 408 remain on substrate 401.

Figure 4D:
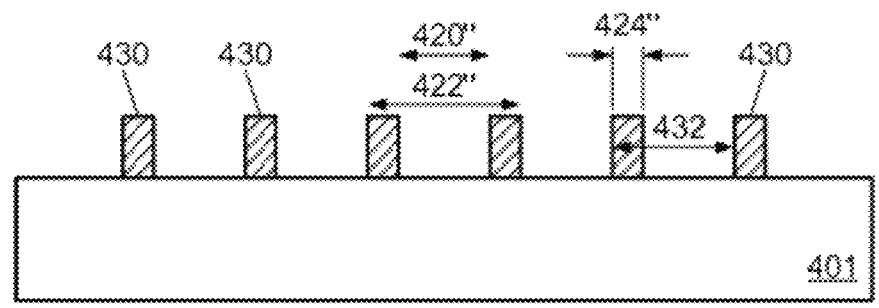

Referring now to FIG. 4D, the one or more second radiation-sensitive material portions 406 corresponding to low radiation exposure are selectively removed using a second developing process that can include a second chemistry. In one embodiment, the second chemistry to selectively remove the one or more second radiation-sensitive material portions 406 includes an organic solvent. In one embodiment, the second chemistry to selectively remove the one or more second radiation-sensitive material portions 406 includes an organic solvent, optionally water, and an optional surfactant. In one embodiment, the second chemistry to selectively remove the one or more second radiation-sensitive material portions 406 includes an alcohol or acetone.

In one embodiment, substrate 401 having the exposed layer of radiation-sensitive material 402 is immersed into a development solution containing the second chemistry to remove soluble one or more second radiation-sensitive material portions 406. Thereafter, the substrate 401 is dried. The developing process may be performed for a pre-specified time duration (e.g., about 30 seconds to about 180 seconds), a pre-specified temperature (e.g., room temperature), and a pre-specified pressure (atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4D, a first critical dimension 420" (corresponding to the one or more first radiation-sensitive material portions 405), a second critical dimension 422" (corresponding to the one or more second radiation-sensitive material portions 406), or a third critical dimension 424" (corresponding to the one or more third radiation-sensitive material portions 408) may be adjusted, controlled, and/or optimized, as will be discussed below.

As illustrated in FIG. 4D, the one or more second radiation-sensitive material portions 406 are removed, so that the one or more third radiation sensitive material portions 408 remain on substrate 401. Since an image corresponding to each mask feature (e.g., transparent portions 404) has two regions of intermediate radiation exposure (or transitions regions ranging from low radiation intensity to high radiation intensity), the resulting resist pattern can include twice the number of features 430 than the mask pattern on mask 403. As illustrated in FIG. 4D, for every one transparent portion 404 of mask 403, two features 430 are produced and a reduced feature pitch 432 between features 430 is achieved.

Pitch 432 between features 430 is less than or equal to about half of mask pitch 409 between opaque features 410 of mask 403, as shown in FIG. 4D. In one embodiment, feature pitch 432 between features 430 may range from about 5 nm to about 30 nm.

The order of the positive-tone development (i.e., development using first chemistry) and the negative-tone development (i.e., development using second chemistry) of the layer of radiation-sensitive material 402, as described above with respect to FIGS. 4C and 4D, may be performed in any order without changing the resulting pattern. In one embodiment, the one or more first radiation-sensitive material portions 405 corresponding to high radiation exposure are selectively removed from substrate 401 before removing the one or more second radiation-sensitive material portions 406 corresponding to low radiation exposure from substrate 401. In another embodiment, the one or more first radiation-sensitive material portions 405 corresponding to high radiation exposure are selectively removed from substrate 401 after removing the one or more second radiation-sensitive material portions 406 corresponding to low radiation exposure from substrate 401.

Figure 5:
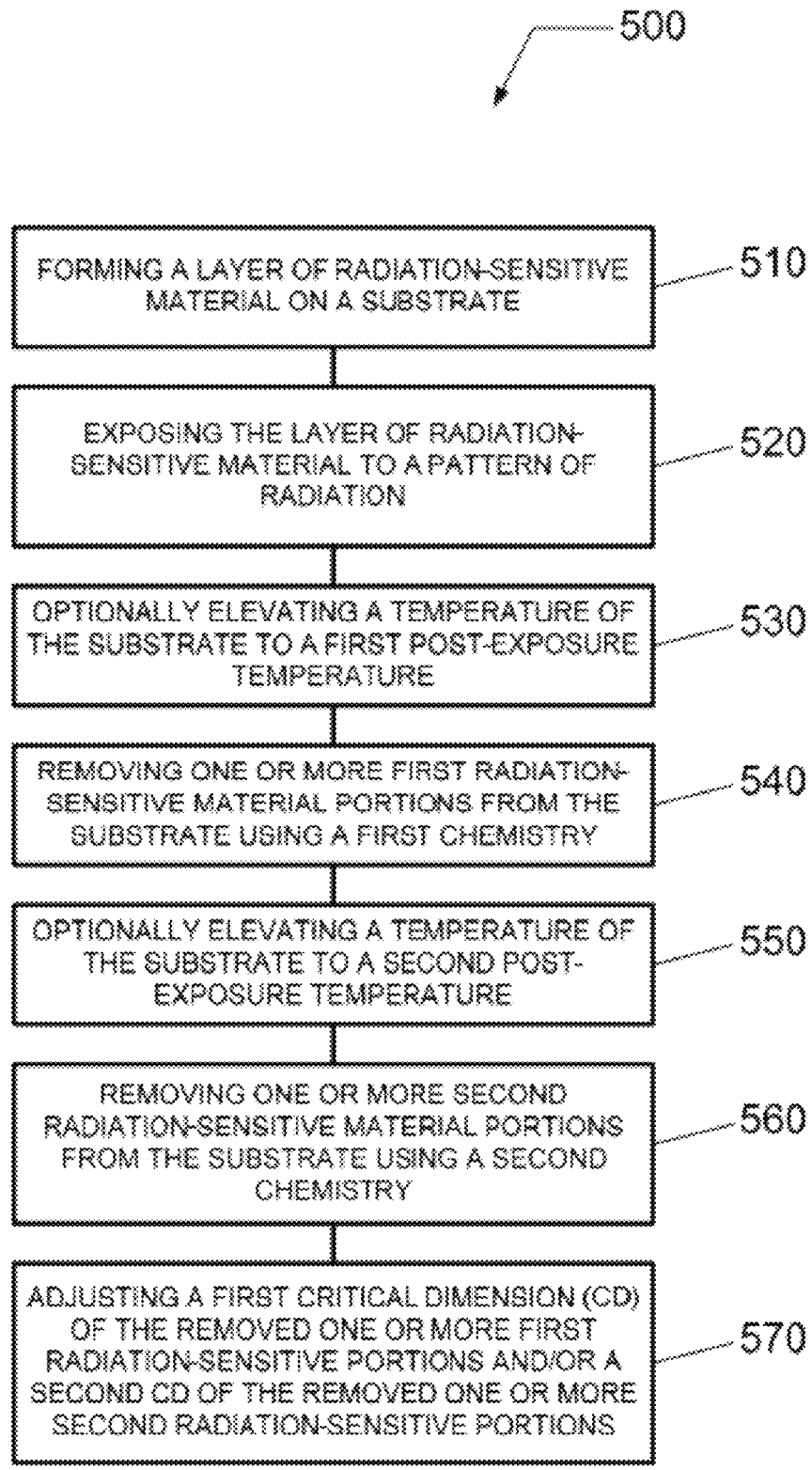
FIG. 5 illustrates a method of patterning a substrate.

Referring now to FIG. 5, a flow chart 500 of a method for patterning a substrate is presented according to an embodiment. Flow chart 500 begins in 510 when a layer of radiation-sensitive material is formed on a substrate and, in 520, the layer of radiation-sensitive material is exposed to a pattern of radiation using a mask having a mask critical dimension to form one or more first radiation-sensitive material portions, one or more second radiation-sensitive material portions, and one or more third radiation-sensitive material portions. The one or more first radiation-sensitive material portions may comprise first radiation-sensitive material portions subjected to high radiation exposure. The one or more second radiation-sensitive material portions may comprise second radiation-sensitive material portions subjected to low radiation exposure. The one or more third radiation-sensitive material portions may comprise third radiation-sensitive material portions subjected to intermediate radiation exposure characterized by a third critical dimension.

In 530, a temperature of the substrate is optionally elevated to a first post-exposure temperature. The thermal treatment process may comprise a first post-exposure bake (PEB), as described above. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof. The first post-exposure temperature may be ramped, or stepped.

In 540, the one or more first radiation-sensitive material portions are removed from the substrate using a first chemistry. The removal of the one or more first radiation-sensitive material portions may be characterized by a first critical dimension. The removal of the one or more first radiation-sensitive material portions may be performed using a first development process, such as a positive-tone development process or a negative-tone development process. The first development process may comprise setting a composition of the first chemistry, a time duration for the first development process, or a temperature for the first development process, or any combination of two or more thereof. The first chemistry may comprise a base solution. The first chemistry may further comprise a base solution, water, and an optional surfactant.

In 550, a temperature of the substrate is optionally elevated to a second post-exposure temperature. The thermal treatment process may comprise a second post-exposure bake (PEB). The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof. The second post-exposure temperature may be ramped, or stepped.

In 560, the one or more second radiation-sensitive material portions are removed from the substrate using a second chemistry. The removal of the one or more second radiation-sensitive material portions may be characterized by a second critical dimension. The removal of the one or more second radiation-sensitive material portions may be performed using a second development process, such as a positive-tone development process or a negative-tone development process. The second development process may comprise setting a composition of the second chemistry, a time duration for the second development process, or a temperature for the second development process, or any combination of two or more thereof. The second chemistry may comprise an organic solvent. The second chemistry may further comprise an organic solvent, optionally water, and an optional surfactant.

In 570, the first critical dimension, the second critical dimension, and/or third critical dimension (corresponding to the critical dimension of the third radiation-sensitive material portions) are adjusted, controlled and/or optimized to meet pre-specified pattern requirements that may include a pre-specified first critical dimension, second critical dimension, and/or third critical dimension (corresponding to the critical dimension of the third radiation-sensitive material portions). This adjusting, controlling and/or optimizing include altering the patterning process. The adjusting, controlling, and/or optimizing are discussed in greater detail below.

The adjusting of the patterning process to achieve a target first critical dimension and/or second critical dimension, and/or a target critical dimension for the critical dimension of third radiation-sensitive material portions can include performing one or more of the following: (1) adjusting an exposure dose for the exposing of the layer of radiation-sensitive material; (2) adjusting the mask critical dimension for the exposing of the layer of radiation-sensitive material; (3) adjusting the first post-exposure temperature, the time the substrate is elevated to the first post-exposure temperature, the heating rate for achieving the first post-exposure temperature, the cooling rate for reducing the first post-exposure temperature, the pressure of a gaseous environment surrounding the substrate during the elevation of the substrate to the first post-exposure temperature, or a composition of the gaseous environment surrounding the substrate during the elevation of the substrate to the first post-exposure temperature, or a combination of two or more thereof; (4) adjusting the second post-exposure temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof; (5) adjusting the composition of the first chemistry, the time duration for applying the first chemistry, or a temperature of the first chemistry, or a combination of two or more thereof; or (6) adjusting the composition of the second chemistry, the time duration for applying the second chemistry, or a temperature for the second chemistry, or a combination of two or more thereof; or (7) performing a combination of two or more thereof.

Figure 6:
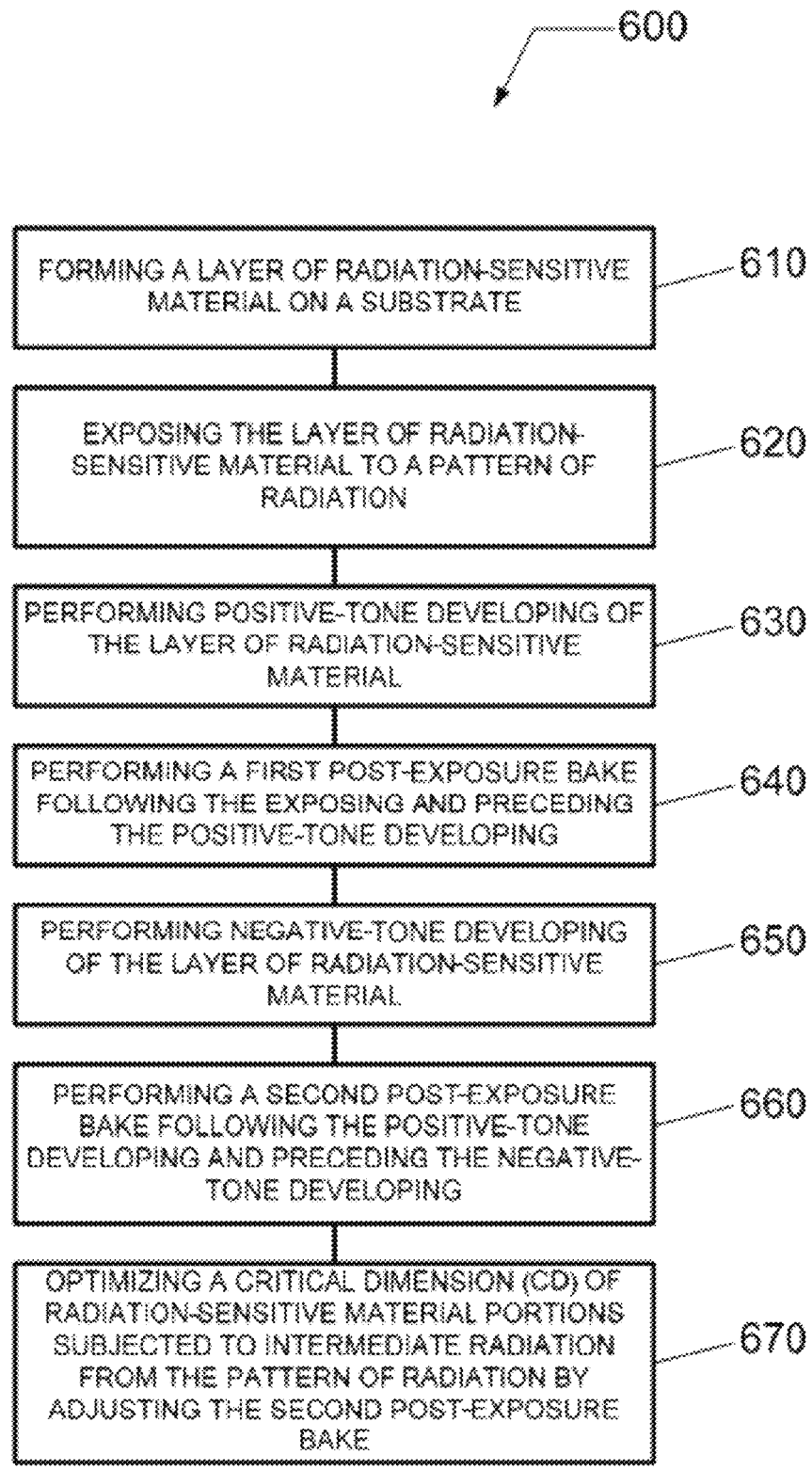
FIG. 6 illustrates a method of patterning a substrate.

Referring now to FIG. 6, a flow chart 600 of a method for double patterning a substrate is presented according to an embodiment. Flow chart 600 begins in 610 when a layer of radiation-sensitive material is formed on a substrate and, in 620, the layer of radiation-sensitive material is exposed to a pattern of radiation using a mask having a mask critical dimension to form first radiation-sensitive material portions having a high radiation exposure, second radiation-sensitive material portions having a low radiation exposure, and third radiation-sensitive material portions having an intermediate radiation exposure.

In 630, the first radiation-sensitive material portions are removed from the substrate by performing positive-tone developing of the layer of radiation-sensitive material from the substrate using a first chemistry. The removal of the first radiation-sensitive material portions may be characterized by a first critical dimension, or positive-tone critical dimension. The positive-tone development process may comprise setting a composition of the first chemistry, a time duration for the first positive-tone development process, or a temperature for the first positive-tone development process, or any combination of two or more thereof. The first chemistry may comprise a base solution. The first chemistry may further comprise a base solution, water, and an optional surfactant.

In 640, a temperature of the substrate is elevated to a first post-exposure temperature. The thermal treatment process may comprise a first post-exposure bake (PEB). The first PEB proceeds after the exposing and before the positive-tone developing of the layer of radiation-sensitive material. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof.

In 650, the second radiation-sensitive material portions are removed from the substrate by performing negative-tone developing of the layer of radiation-sensitive material from the substrate using a second chemistry. The removal of the second radiation-sensitive material portions may be characterized by a second critical dimension, or negative-tone critical dimension. The negative-tone development process may comprise setting a composition of the second chemistry, a time duration for the negative-tone development process, or a temperature for the negative-tone development process, or any combination of two or more thereof. The second chemistry may comprise an organic solvent. The second chemistry may further comprise an organic solvent, water, and an optional surfactant.

In 660, a temperature of the substrate is elevated to a second post-exposure temperature. The thermal treatment process may comprise a second post-exposure bake (PEB). The second PEB proceeds after the positive-tone developing of the layer of radiation-sensitive material and before the negative-tone developing of the layer of radiation-sensitive material. The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof.

The features remaining on the substrate occupy regions related to the third radiation-sensitive material regions (subject to intermediate radiation exposure) may be characterized by a third critical dimension.

In 670, the third critical dimension is adjusted, controlled and/or optimized to meet pre-specified pattern requirements that may include a pre-specified third critical dimension. This adjusting, controlling and/or optimizing include altering the patterning process.

The adjusting of the patterning process to achieve a target third critical dimension can include: the use of and the adjustment, control and/or optimization of the second post-exposure bake. The second PEB may be adjusted by: adjusting the second post-exposure temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof.

According to one example, as will be illustrated below, the second critical dimension, or negative-tone critical dimension (associated with negative-tone developing) may be increased by the mere addition of the second thermal treatment step and the elevation of the substrate to the second post-exposure temperature for a period of time. In this example, following the exposure to the pattern of radiation, the substrate is elevated to the first post-exposure temperature, followed by positive-tone developing, followed by elevating the substrate to the second post-exposure temperature, followed by negative-tone developing. The second post-exposure temperature should be sufficiently high to cause chemical modification of the layer of radiation-sensitive material remaining on the substrate prior to negative-tone developing. Additionally, an increase in the second post-exposure temperature may cause a further increase in the second critical dimension. When holding the first critical dimension or positive-tone critical dimension approximately constant, the third critical dimension may also be increased with the second PEB and an increase in the second post-exposure temperature.

According to another example, the first critical dimension, or positive-tone critical dimension (associated with positive-tone developing) may be increased by the addition of the second thermal treatment step and the elevation of the substrate to the second post-exposure temperature for a period of time. In this example, following the exposure to the pattern of radiation, the substrate is elevated to the first post-exposure temperature, followed by negative-tone developing, followed by elevating the substrate to the second post-exposure temperature, followed by positive-tone developing. The second post-exposure temperature should be sufficiently high to cause chemical modification of the layer of radiation-sensitive material remaining on the substrate prior to positive-tone developing. Additionally, an increase in the second post-exposure temperature may cause a further increase in the first critical dimension. When holding the second critical dimension or negative-tone critical dimension approximately constant, the third critical dimension may also be decreased with the second PEB and an increase in the second post-exposure temperature.

Figure 7:
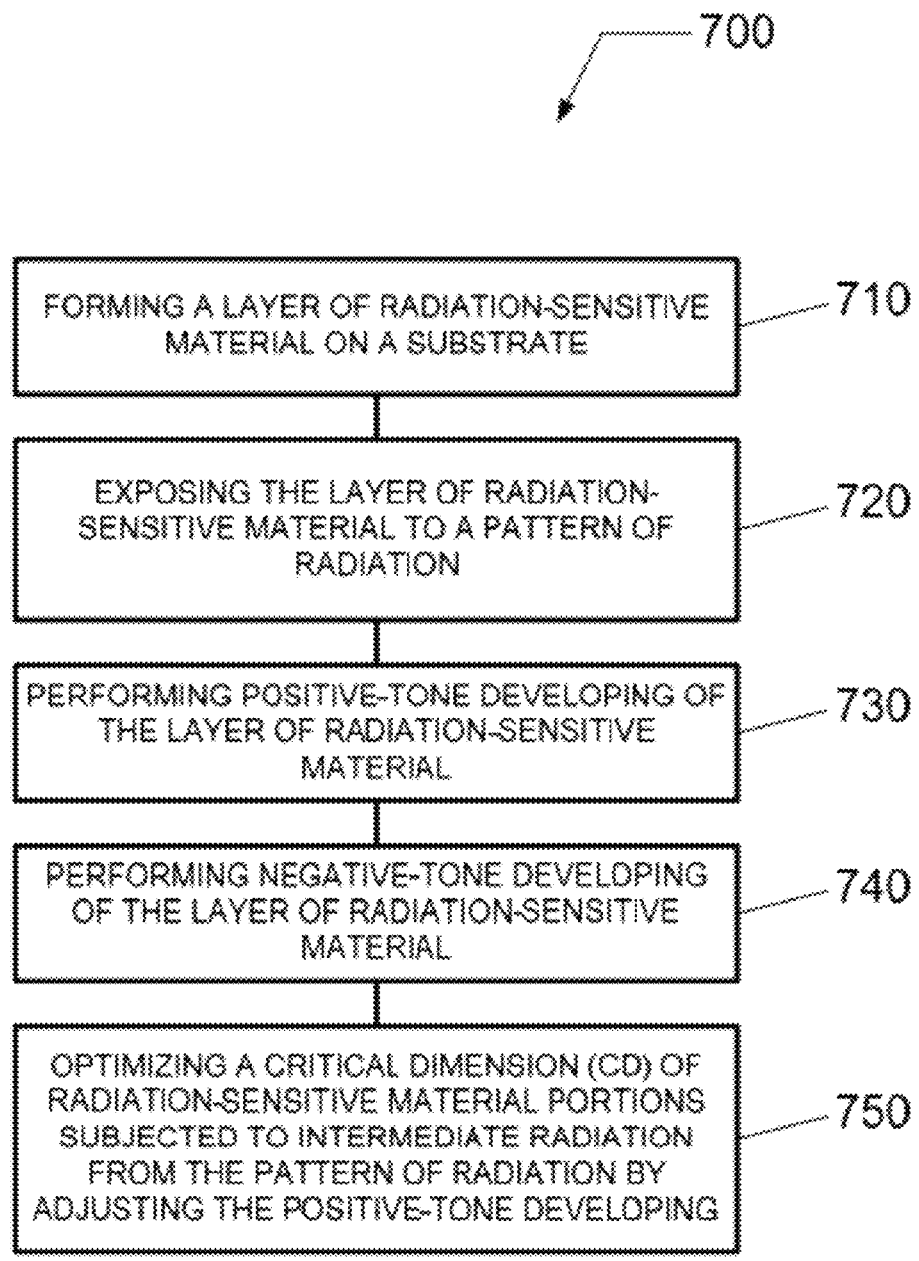
FIG. 7 illustrates a method of patterning a substrate.

Referring now to FIG. 7, a flow chart 700 of a method for double patterning a substrate is presented according to an embodiment. Flow chart 700 begins in 710 when a layer of radiation-sensitive material is formed on a substrate and, in 720, the layer of radiation-sensitive material is exposed to a pattern of radiation using a mask having a mask critical dimension to form first radiation-sensitive material portions having a high radiation exposure, second radiation-sensitive material portions having a low radiation exposure, and third radiation-sensitive material portions having an intermediate radiation exposure.

In 730, the first radiation-sensitive material portions are removed from the substrate by performing positive-tone developing of the layer of radiation-sensitive material from the substrate using a first chemistry. The removal of the first radiation-sensitive material portions may be characterized by a first critical dimension, or positive-tone critical dimension. The positive-tone development process may comprise setting a composition of the first chemistry, a time duration for the first development process, or a temperature for the first positive-tone development process, or any combination of two or more thereof. The first chemistry may comprise a base solution. The first chemistry may further comprise a base solution, water, and an optional surfactant.

Optionally, a temperature of the substrate is elevated to a first post-exposure temperature. The thermal treatment process may comprise a first post-exposure bake (PEB). The first PEB proceeds after the exposing and before the positive-tone developing of the layer of radiation-sensitive material. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof.

In 740, the second radiation-sensitive material portions are removed from the substrate by performing negative-tone developing of the layer of radiation-sensitive material from the substrate using a second chemistry. The removal of the second radiation-sensitive material portions may be characterized by a second critical dimension, or negative-tone critical dimension. The negative-tone development process may comprise setting a composition of the second chemistry, a time duration for the negative-tone development process, or a temperature for the negative-tone development process, or any combination of two or more thereof. The second chemistry may comprise an organic solvent. The second chemistry may further comprise an organic solvent, water, and an optional surfactant.

Optionally, a temperature of the substrate is elevated to a second post-exposure temperature. The thermal treatment process may comprise a second post-exposure bake (PEB). The second PEB proceeds after the positive-tone developing of the layer of radiation-sensitive material and before the negative-tone developing of the layer of radiation-sensitive material. The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof.

The features remaining on the substrate occupy regions related to the third radiation-sensitive material regions (subject to intermediate radiation exposure) may be characterized by a third critical dimension.

In 750, the third critical dimension is adjusted, controlled and/or optimized to meet pre-specified pattern requirements that may include a pre-specified third critical dimension. This adjusting, controlling and/or optimizing include altering the patterning process.

The adjusting of the patterning process to achieve a target third critical dimension can include: the adjustment, control and/or optimization of the positive-tone developing. The positive-tone developing may be adjusted by: adjusting the composition of the first chemistry, the time duration for applying the first chemistry, or a temperature of the first chemistry, or a combination of two or more thereof.

According to one example, as will be illustrated below, the first critical dimension, or positive-tone critical dimension (associated with positive-tone developing) may be decreased by an adjustment of the composition of the first chemistry. When the first chemistry includes a base with water and an optional surfactant, the dilution of the base in the solution may cause a decrease in the first critical dimension. When holding the second critical dimension or negative-tone critical dimension approximately constant, the third critical dimension may also be increased with the dilution of the positive-tone developing solution.

Figure 8:
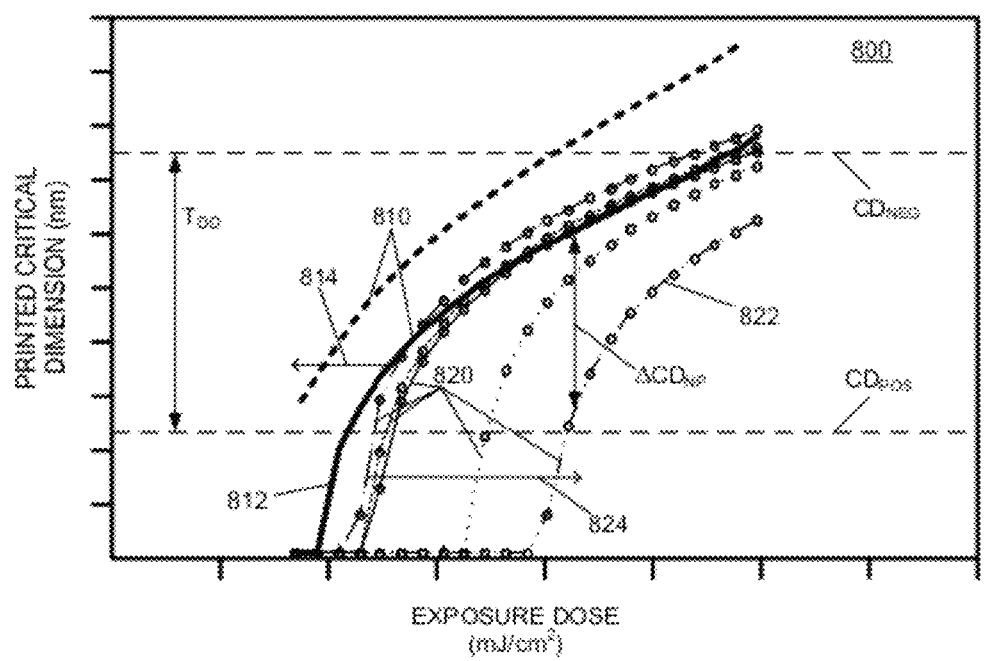
FIG. 8 presents exemplary data for patterning a substrate.

Referring now to FIG. 8, exemplary data 800 is provided for a dual-tone double patterning process. As illustrated in FIG. 8, the printed critical dimension (nm, nanometers) is provided as a function of exposure dose (mJ/cm$^2$, milli-Joules per square centimeters) for a set of negative-tone development characteristics 810 and a set of positive-tone development characteristics 820. The set of negative-tone development characteristics 810 and the set of positive-tone development characteristics 820 may be acquired using numerical simulation, experiment, or a combination thereof.

A characteristic defines a relationship between a critical dimension and a control parameter, such as an exposure dose, an activation energy, modification source; however, other control parameters may be used. The characteristic can be determined by setting a set of process parameters for performing the dual-tone patterning process, such as the processes described in FIGS. 3, 4A-4D, 5, 6, and 7, and the set of process parameters includes any one or more of the process parameters described above with respect to these processes. While holding these process parameters constant, a critical dimension is measured and/or computed as the control parameter is varied. This procedure for preparing a characteristic, such as activation energy, may be used to determine one or more negative-tone characteristics and/or one or more positive-tone characteristics. The characteristics, such as the activation energies, may be established using a negative-tone pattern development process, a positive-tone pattern development process, or a dual-tone pattern development process.

The set of negative-tone development characteristics 810 exhibit a variation in one or more parameters useful in adjusting or controlling the negative-tone critical dimension. For example, the one or more parameters may include any parameter, such as the activation energies or other parameter described above, for performing a second post-exposure bake following the positive-tone development. Additionally, for example, the one or more parameters may include any parameter for performing the negative-tone development and may include activation groups and activation energies.

Figure 9:
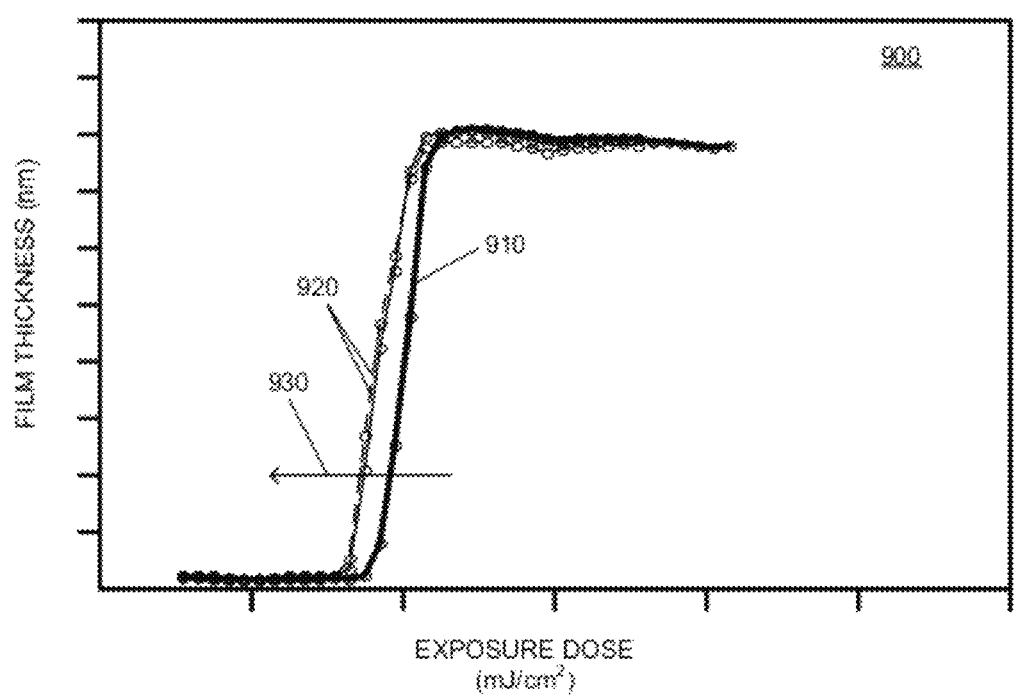
FIG. 9 presents exemplary data for patterning a substrate.

As shown in FIG. 9, a film thickness (nm) (or normalized film thickness) for a layer of radiation-sensitive material following negative-tone development is shown as a function of exposure dose (mJ/cm$^2$). A first contrast curve 910 in the exemplary data 900 is presented wherein the second post-exposure bake following positive-tone development is not performed. A second set of curves 920 are also presented wherein the second post-exposure bake following positive-tone development is performed. As depicted in FIG. 9, the contrast curves shift to lower exposure dose (indicated by arrow 930) indicating a decrease in the lower solubility threshold or a resulting increase in the negative-tone critical dimension. The shift to lower exposure dose of the negative contrast curves may be achieved by increasing the second post-exposure temperature and/or the time duration for elevation at the second post-exposure temperature (see trend 814 in FIG. 8).

In FIG. 8, the set of positive-tone development characteristics 820 exhibit a variation in one or more parameters useful in adjusting or controlling the positive-tone critical dimension. For example, the one or more parameters may include any parameter, activation energy or other parameters as described above, for performing a second post-exposure bake following the positive-tone development. Additionally, for example, the one or more parameters may include any parameter for performing the positive-tone development and may include activation groups and activation energies.

Figure 10:
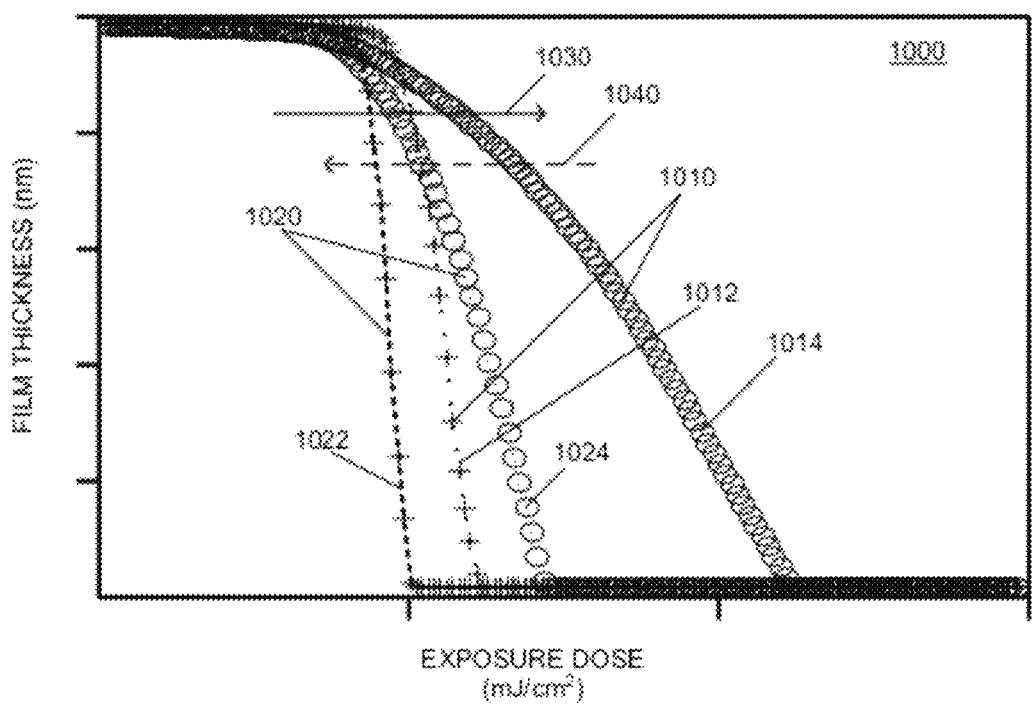
FIG. 10 presents additional exemplary data for patterning a substrate.

As shown in FIG. 10, a film thickness (nm) (or normalized film thickness) for a layer of radiation-sensitive material following positive-tone development is shown as a function of exposure dose (mJ/cm$^2$). A first set of positive contrast curves 1010 in exemplary data 1000 is provided having a first contrast curve 1012 and a second contrast curve 1014. The first contrast curve 1012 is acquired when the second post-exposure bake following positive-tone development is not performed. The second contrast curve 1014 is acquired when the second post-exposure bake following positive-tone development is not performed and the positive-tone development solution (e.g., first chemistry having a base, water, and optional surfactant) is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension. The shift to higher exposure dose of the positive contrast curves may be achieved by increasing the dilution of the positive-tone development chemistry (see trend 824 in FIG. 8).

A second set of curves 1020 is provided having a third contrast curve 1022 and a fourth contrast curve 1024. The third contrast curve 1022 is acquired when the second post-exposure bake following positive-tone development is performed and the positive-tone development solution is the same for the first contrast curve 1012. As depicted in FIG. 10, the contrast curves shift to lower exposure dose (indicated by arrow 1040) indicating a decrease in the upper solubility threshold or a resulting increase in the positive-tone critical dimension. The shift to lower exposure dose of the positive contrast curves may be achieved by increasing the second post-exposure temperature and/or the time duration for elevation at the second post-exposure temperature.

The fourth contrast curve 1024 is acquired when the second post-exposure bake following positive-tone development is performed and the positive-tone development solution is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension. In addition, the inventors believe that the contrast curves can be affected by the amount of activation energy that is required during a development process.

Figure 11:
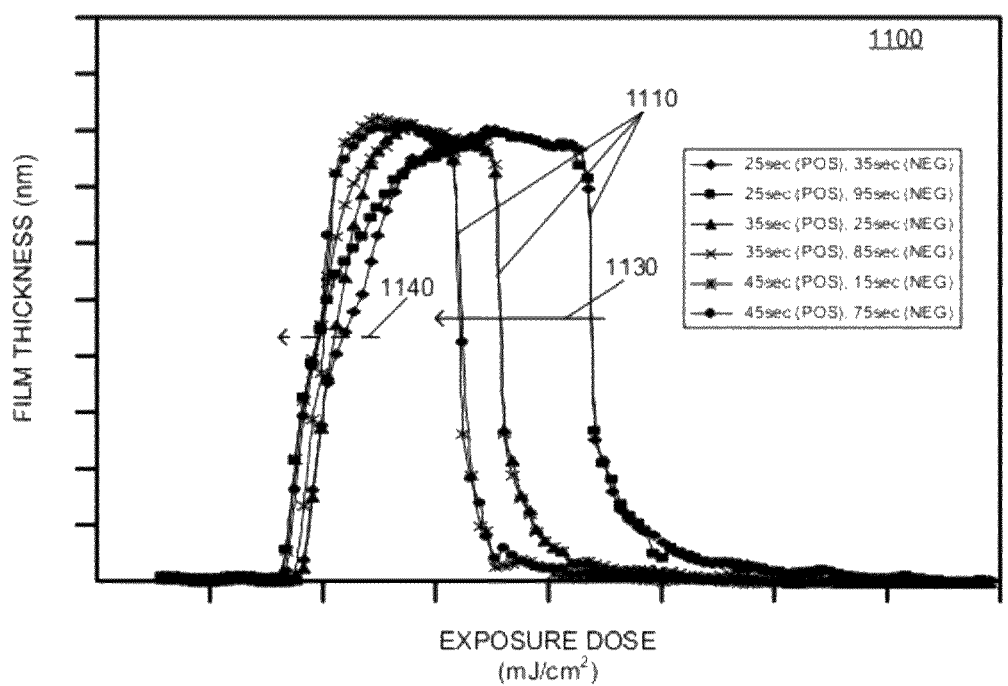
FIG. 11 presents additional exemplary data for patterning a substrate.

As shown in FIG. 11, a film thickness (nm) (or normalized film thickness) for a layer of radiation-sensitive material following negative-tone development is shown as a function of exposure dose (mJ/cm$^2$). Following the exposure of the layer of radiation-sensitive material to a pattern of radiation, the layer of radiation-sensitive material undergoes a first post-exposure bake for a first time duration followed by positive-tone development, and then undergoes a second post-exposure bake for a second time duration followed by negative-tone development. A family of contrast curves 1110 in the exemplary data 1100 is presented, and the first time duration for the first post-exposure bake (e.g., the first time duration is indicated in the legend by the time preceding "POS") and the second time duration for the second post-exposure bake (e.g., the second time duration is indicated in the legend by the time preceding "NEG") are varied.

As illustrated in FIG. 11, when the first time duration for the first post-exposure bake (preceding the positive-tone development) is held constant (i.e., at 25 sec (seconds), 35 sec, and 45 sec) while the second time duration for the second post-exposure bake (preceding the negative-tone development) is increased (i.e., 35 sec to 95 sec, 25 sec to 85 sec, and 15 sec to 75 sec), the lower exposure threshold shifts to the left (i.e., the lower exposure threshold decreases) (trend indicated by arrow 1140). The decrease in the lower exposure threshold manifests as an increase in the second critical dimension or negative-tone critical dimension. Furthermore, while the lower exposure threshold is decreased by increasing the second time duration during the second post-exposure bake, the upper exposure threshold remains substantially constant when the first time duration is held constant.

Additionally, as illustrated in FIG. 11, when the second time duration for the second post-exposure bake (preceding the negative-tone development) is held approximately constant with a slight variation (i.e., at 35 sec, 25 sec, and 15 sec; and at 95 sec, 85 sec, and 75 sec) while the first time duration for the first post-exposure bake (preceding the positive-tone development) is increased (i.e., 35 sec to 35 sec to 45 sec), the upper exposure threshold shifts to the left (i.e., the upper exposure threshold decreases) (trend indicated by arrow 1130). The decrease in the upper exposure threshold manifests as an increase in the first critical dimension or positive-tone critical dimension. Furthermore, while the upper exposure threshold is decreased by increasing the first time duration during the first post-exposure bake, the lower exposure threshold remains approximately constant when the second time duration is held approximately constant.

Referring again to FIG. 8, when printing a pattern of features on a substrate, a target positive-tone critical dimension ($CD_{POS}$) and a target negative-tone critical dimension ($CD_{NEG}$) may be selected or specified. Thereafter, a target difference ($T_{DD}$) between the target positive-tone critical dimension and the target negative-tone critical dimension may be computed for the double development metric. Alternatively, two or more of the target difference, the target positive-tone critical dimension and the target negative-tone critical dimension may be specified, while the third is computed.

Through inspection of the set of negative-tone development characteristics 810 and the set of positive-tone development characteristics 820, a target negative-tone characteristic 812 may be selected and a target positive-tone characteristic 822 may be selected that possesses a $\Delta CD_{NP}$ comparable to $T_{DD}$. Desirably, the selected characteristics possess a $\Delta CD_{NP}$ that is greater than $T_{DD}$.

The dual-tone double patterning process may be optimized by selecting the target negative-tone characteristic and the target positive-tone characteristic such that the target positive-tone characteristic intersects the target positive-tone critical dimension at a given exposure dose and the target negative-tone characteristic intersects the target negative-tone critical dimension at the same given exposure dose.

Alternatively, the dual-tone double patterning process may be optimized by selecting the target positive-tone characteristic such that the target positive-tone characteristic intersects the target positive-tone critical dimension at a given exposure dose. Then, the target negative-tone characteristic may be selected when $\Delta CD_{NP}$ is approximately comparable to $T_{DD}$ for the given exposure dose. Alternatively yet, the target negative-tone characteristic may be selected when DDM is approximately unity, where:

$$DDM = 1 - ([|\Delta CD_{NP}| - T_{DD}]/T_{DD}). \qquad (3)$$

Figure 12:
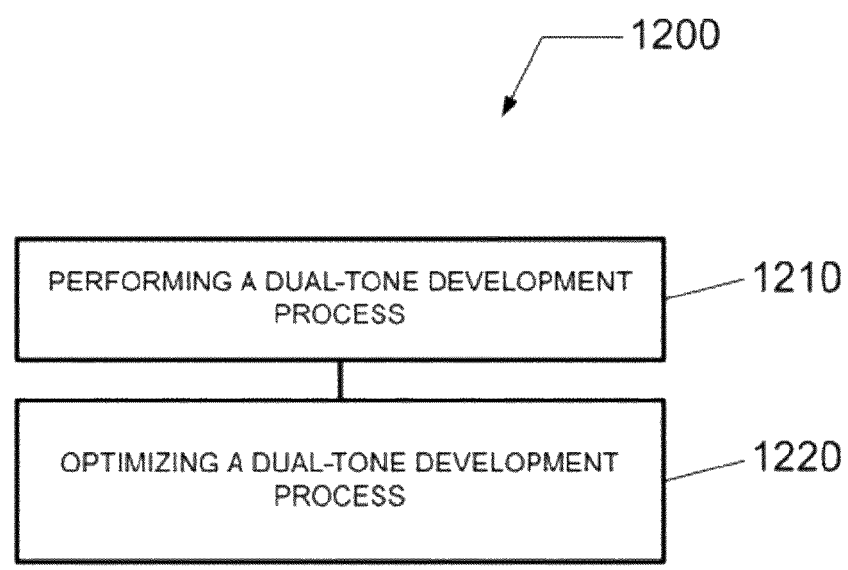
FIG. 12 illustrates a method of patterning a substrate.

Referring now to FIG. 12, a flow chart 1200 of a method for optimizing a double patterning process is presented according to an embodiment. Flow chart 1200 begins in 1210 with performing a dual-tone development process. The dual-tone development process can include: exposing a layer of radiation-sensitive material to a pattern of radiation, performing a positive-tone development process to remove a first radiation-sensitive material portion characterized by a positive-tone critical dimension, and performing a negative-tone development process to remove a second radiation-sensitive material portion characterized by a negative-tone critical dimension.

In 1220, the dual-tone development process is optimized to achieve a target difference between a target positive-tone critical dimension and a target negative-tone critical dimension. The optimization of the dual-tone development process can include: acquiring one or more positive-tone characteristics, and the one or more positive-tone characteristics relate the positive-tone critical dimension to a control parameter for a first set of process parameters; acquiring one or more negative-tone characteristics, and the one or more negative-tone characteristics relate the negative-tone critical dimension to the control parameter for a second set of process parameters; selecting a target positive-tone characteristic from the one or more positive-tone characteristics that approximately intersects the target positive-tone critical dimension at a target control parameter to within a first deviation; selecting a target negative-tone characteristic from the one or more negative-tone characteristics that approximately intersects the target negative-tone critical dimension at the target control parameter to within a second deviation; and establishing a process recipe for the performing the dual-tone development process using the target positive-tone characteristic, the target negative-tone characteristic, and the target control parameter.

The first deviation and the second deviation may be selected to be an absolute value, such as plus or minus 5 nm, plus or minus 2 nm. Alternatively, first deviation and the second deviation may be selected to be an relative value, such as plus or minus 10% of $T_{DD}$, plus or minus 5% of $T_{DD}$.

When resolution enhancement techniques (RET) are used in various dual-tone processing sequences, different reticle/mask types and different illuminator/exposure techniques can be used. For example, the different illuminators may deviate from known illuminator shapes, such as circular, dipole, annular, etc. In addition, the different reticle/masks can include:

1) Alternating PSMs (Phase Shift Mask). For instance, the use of a PSM mask and a trim mask.

2) Double-Dipole masks (2 masks+dipoles). For instance, a first exposure with a first mask including a dipole in a first arrangement (or pattern), followed by a second exposure with a second mask including a dipole in a second arrangement (or pattern).

3) Binary masks, i.e., masks with two degrees of transparency. For instance, a binary mask may have first regions that are approximately 100% transparent, and second regions that are opaque.

4) Tri-tone masks, i.e., masks with three degrees of transparency. For instance, a tri-tone mask may have first regions that are substantially transparent, second regions that are substantially opaque, and third regions that have a transparency intermediate to the first regions and the second regions.

Figure 13:
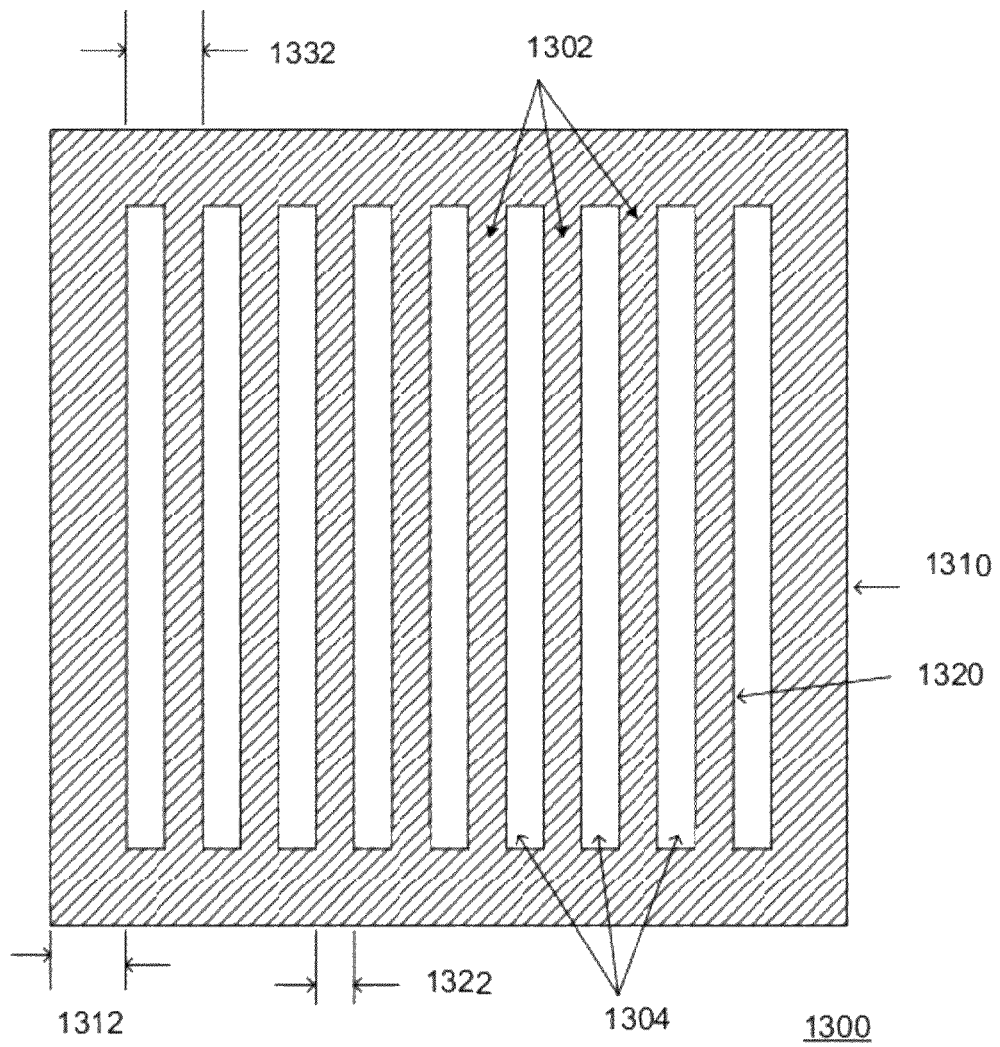
FIG. 13 illustrates an exemplary standard line pattern in accordance with embodiments of the invention.

5) Half-tone masks, i.e., masks having regions with a transparency between 0% and 100%. The square mask 1300 illustrated in FIG. 13 provides an example of a half tone mask 1310. The thickness (1312 and/or 1322) of the lines (1302 and/or 1320), the spaces 1304, and the pitch 1332 may be adjusted to alter the collective transparency of the square mask pattern.

In some embodiments, specific developing, rinsing, and/or activation solutions can be developed for integrating different mask geometries and illuminators with DTD processes (i.e., specific treatments to mask geometries and illuminator). For example, different mask attenuation values (tri-tone), can be developed (i.e., select intermediate transparency and develop selection rules). In other examples, different illuminator pole intensity ratios can be used, and/or different geometry values can be developed as functions of proximity environments (rules). In addition, half-toning rules (sub-resolution pitch/size/edge spacing) can be developed and used.

During various dual-tone procedures, the inventors believe that their invention can be used to determine the best processing parameters and feature profiles that are needed to give the overall best solution when half-tone masking features are being used. For example, when resolution enhancement techniques such as sub-resolution line/space features; are used, their invention can be used to determine the optimum pitch and/or size for a sub-resolution grating pattern.

Figure 14:
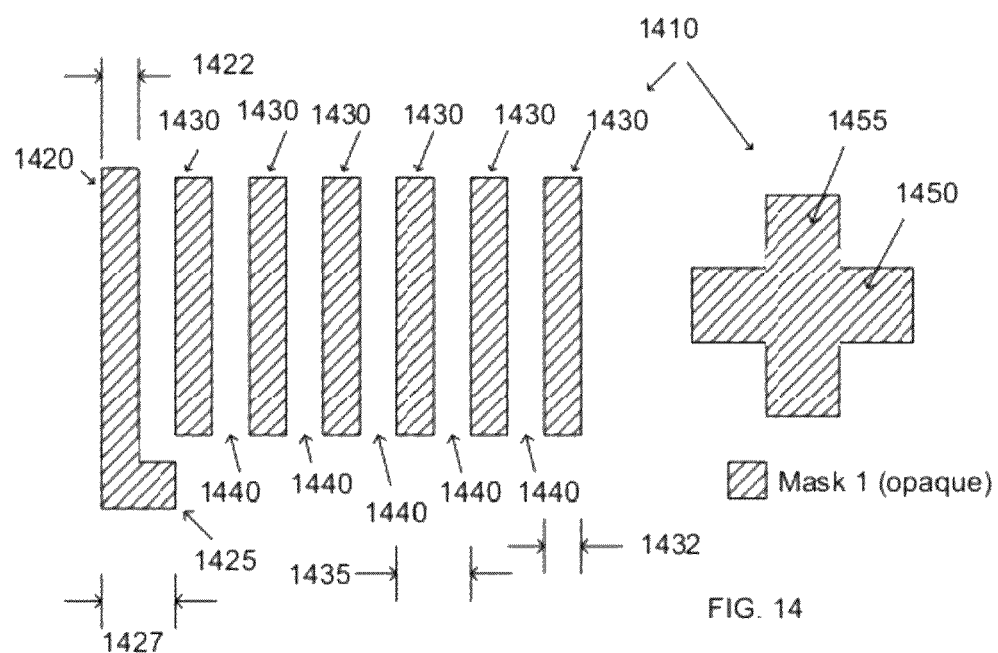
FIG. 14 illustrates exemplary exposure effects on line patterns in accordance with embodiments of the invention.

FIG. 14 illustrates an exemplary mask problem in accordance with embodiments of the invention. An exemplary target pattern 1410 is illustrated that can include a target pattern for a dual-tone resist layer on a substrate. The exemplary target pattern 1410 is illustrated having at least one first isolated opaque region (1420 and 1425), plurality of substantially symmetrical opaque regions 1430, and a plurality of substantially symmetrical transparent regions 1440. For example, the symmetrical opaque regions 1430 can illustrate lines in the semiconductor device. The first isolated opaque regions (1420 and 1425) can have a spacing thickness (1422 and 1427), and the substantially symmetrical opaque regions 1430 can have a feature thickness 1432. The substantially symmetrical opaque regions 1430 can be separated by a pitch 1435. In addition, the exemplary target pattern 1410 can include two additional isolated opaque regions (1450 and 1455). Alternatively, the exemplary target pattern 1410 may be configured differently.

Figure 15:
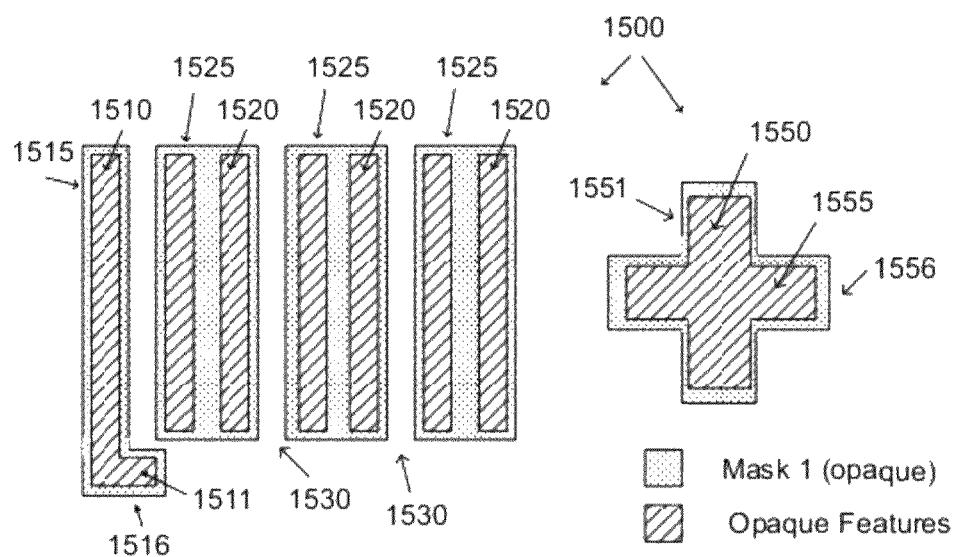
FIG. 15 illustrates exemplary space CD variations for line patterns in accordance with embodiments of the invention.

FIG. 15 illustrates an exemplary mask decomposition target pattern in accordance with embodiments of the invention. A first exemplary mask decomposition target pattern 1500 is illustrated that can include a first decomposition of a target pattern for a dual-tone resist layer on a substrate. The first exemplary mask decomposition target pattern 1500 is illustrated having at least one first isolated opaque mask regions (1515 and 1516) encompassing at least one first isolated features (1510 and 1511). The first exemplary mask decomposition target pattern 1500 can include a plurality of substantially symmetrical opaque mask regions 1525 encompassing one or more substantially symmetrical features 1520, and a plurality of substantially symmetrical transparent regions 1530. For example, the substantially symmetrical features 1520 can illustrate lines in the semiconductor device. The first isolated features (1510 and 1511) can have thicknesses as required (not shown), and the substantially symmetrical features 1520 can have feature thickness as required (not shown). The substantially symmetrical features 1520 can be separated by a pitch as required (not shown). In addition, the first exemplary mask decomposition target pattern 1500 can include two additional isolated opaque features (1550 and 1555) and a plurality of substantially isolated opaque mask regions (1551 and 1556) encompassing one or more of the additional isolated opaque features (1550 and 1555). Alternatively, the exemplary target pattern 1500 may be configured differently.

Figure 16:
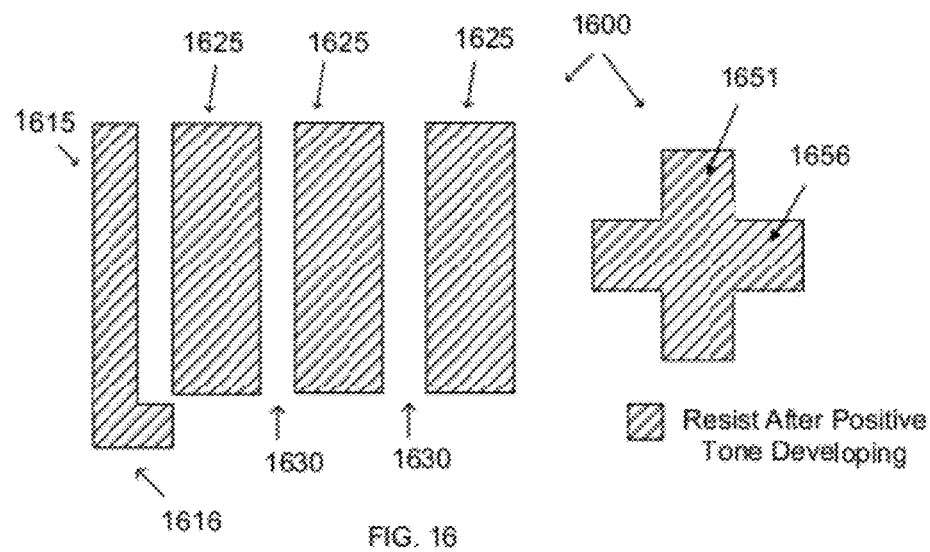
FIG. 16 illustrates an exemplary line pattern for determining target CD variations in accordance with embodiments of the invention.

FIG. 16 illustrates an exemplary first resist pattern in accordance with embodiments of the invention. An exemplary first resist pattern 1600 is illustrated that can be established after a first exposure procedure and a positive tone developing procedure are performed. The exemplary first resist pattern 1600 is illustrated having one or more isolated resist features (1615 and 1616) that were created using first isolated opaque mask regions (FIGS. 15, 1515 and 1516). The first resist pattern 1600 can include a plurality of substantially symmetrical first resist features 1625 that were created using the symmetrical opaque mask regions (FIGS. 15, 1525 and 1526), and a plurality of substantially symmetrical transparent regions 1630. For example, the substantially symmetrical resist features 1625 can illustrate lines in the semiconductor device. The isolated resist features (1615 and 1616) can have lengths and thicknesses as required (not shown), and the substantially symmetrical resist features 1625 can have feature lengths and thicknesses as required (not shown). The substantially symmetrical resist features 1625 can be separated by a pitch as required (not shown). In addition, the first resist pattern 1600 can include two additional isolated resist features (1651 and 1656) that were created using the substantially symmetrical opaque mask regions (FIGS. 15, 1551 and 1556). Alternatively, the exemplary first resist pattern 1600 may be configured differently.

Figure 17:
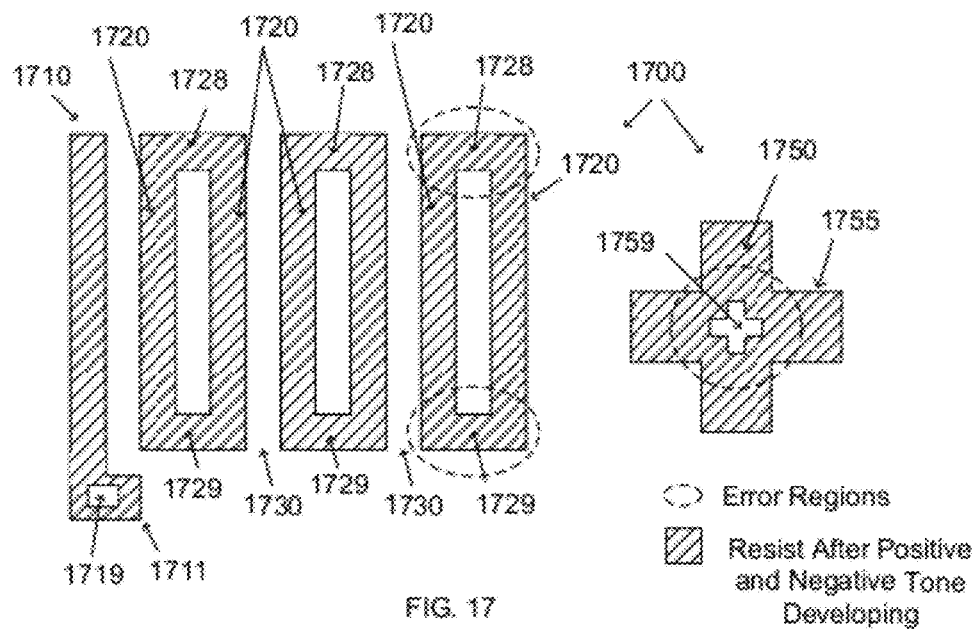
FIG. 17 illustrates an exemplary line pattern for determining specification window variations in accordance with embodiments of the invention.

FIG. 17 illustrates an exemplary second resist pattern in accordance with embodiments of the invention. An exemplary second resist pattern 1700 is illustrated that can be established after a first exposure procedure, a positive tone developing procedure, and a negative tone developing procedure are performed. The exemplary second resist pattern 1700 is illustrated having one or more incorrectly formed isolated resist features (1710 and 1711) that were created using the first isolated resist features (FIGS. 16, 1615 and 1616). For example, a void 1719 can be created in one or more of the incorrectly formed isolated resist features (1710 and 1711). The second resist pattern 1700 can include a plurality of incorrectly formed second resist features 1720 that were created using the first resist features (FIG. 16, 1625) and a plurality of substantially symmetrical transparent regions 1730. For example, one or more line end features (1728 and 1729) can be created in one or more of the incorrectly formed second resist features 1720. In addition, the second resist features 1720 can illustrate lines in the semiconductor device. The second isolated resist features (1710 and 1711) can have lengths and thicknesses (not shown) when they are correctly formed, and the substantially symmetrical second resist features 1720 can have feature lengths and thicknesses (not shown) when they are correctly formed. The substantially symmetrical second resist features 1720 can be separated by a pitch (not shown) when they are correctly formed. In addition, the second resist pattern 1700 can include one or more incorrectly formed additional isolated resist features (1750 and 1755) that were incorrectly created using the two additional isolated resist features (FIGS. 16, 1651 and 1656). For example, a void 1759 can be created in one or more of the incorrectly formed additional isolated resist features (1750 and 1755). Alternatively, the exemplary second resist pattern 1700 may be configured differently.

Figure 18:
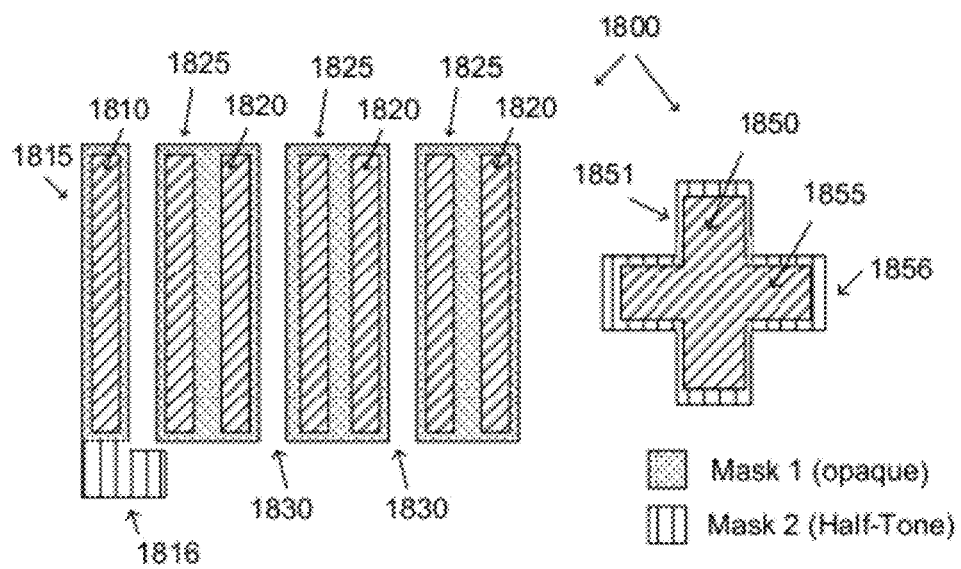
FIG. 18 illustrates an exemplary line pattern for determining additional specification window variations in accordance with embodiments of the invention.

FIG. 18 illustrates an exemplary view of a half-tone mask for use in a dual-tone development procedure in accordance with embodiments of the invention. An exemplary first half-tone mask pattern 1800 is illustrated that can include a first half-tone decomposition of a target pattern for a dual-tone resist layer on a substrate. The exemplary first half-tone mask pattern 1800 is illustrated having at least one isolated opaque mask regions 1815 encompassing at least one first isolated feature 1810, and a half-tone mask feature 1816 can be coupled to the isolated opaque mask regions 1815. The first half-tone mask pattern 1800 can include a plurality of substantially symmetrical opaque mask regions 1825 encompassing one or more substantially symmetrical features 1820, and a plurality of substantially symmetrical transparent regions 1830. For example, the substantially symmetrical features 1820 can illustrate lines in the semiconductor device. The first isolated features 1810 may have lengths and thicknesses (not shown) when required, and the substantially symmetrical features 1820 can have feature lengths and thicknesses (not shown) when required. The substantially symmetrical features 1820 can be separated by a pitch as required (not shown). In addition, the first half-tone mask pattern 1800 can include two additional opaque mask features (1850 and 1855) and two additional half-tone features (1851 and 1856) encompassing two additional opaque mask features (1850 and 1855). For example, the opaque portions can include 1810, 1815, 1820, and 1825. In some examples, the half-tone feature can be defined as a feature (or region) that has an overall mask transmittance between the darkest and brightest transmittance in a given mask/reticle. Alternatively, the first half-tone mask pattern 1800 may be configured differently.

Figure 19:
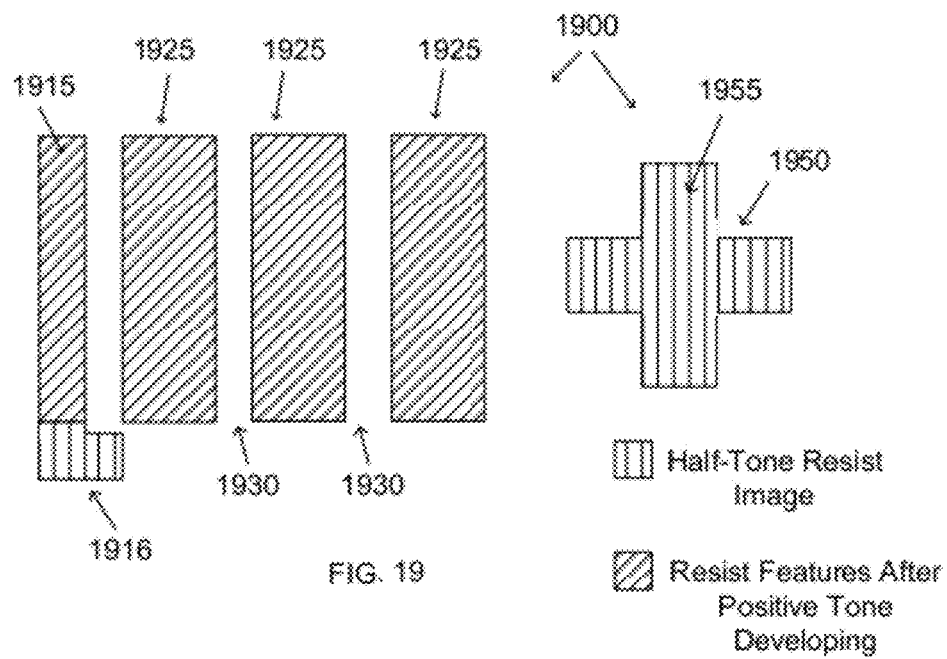
FIG. 19 and FIG. 20 show the general methodology for optimizing the profile in accordance with embodiments of the invention.

FIG. 19 illustrates an exemplary first half-tone resist pattern in accordance with embodiments of the invention. An exemplary first half-tone resist pattern 1900 is illustrated that can be established after a first exposure procedure and a positive tone developing procedure are performed. The exemplary first half-tone resist pattern 1900 is illustrated having one or more isolated resist features 1915 that were created using first isolated opaque mask regions (FIG. 18, 1816) and having one or more half-tone resist feature 1916 that were created using first half-tone mask feature (FIG. 18, 1816). The first half-tone resist pattern 1900 can include a plurality of substantially symmetrical first resist features 1925 that were created using the symmetrical opaque mask regions (FIG. 18, 1825), and a plurality of substantially symmetrical transparent regions 1930. For example, the substantially symmetrical first resist features 1925 can illustrate lines in the semiconductor device. The isolated resist features 1915 and the half-tone resist feature 1916 can have lengths and thicknesses (not shown) when required, and the substantially symmetrical resist features 1925 can have feature lengths and thicknesses (not shown) when required. The substantially symmetrical resist features 1925 can be separated by a pitch (not shown) when required. In addition, the first half-tone resist pattern 1900 can include two additional half-tone resist features (1950 and 1955) that were created using the additional opaque mask regions (FIGS. 18, 1851 and 1856). Alternatively, the exemplary first half-tone resist pattern 1900 may be configured differently.

Figure 20:
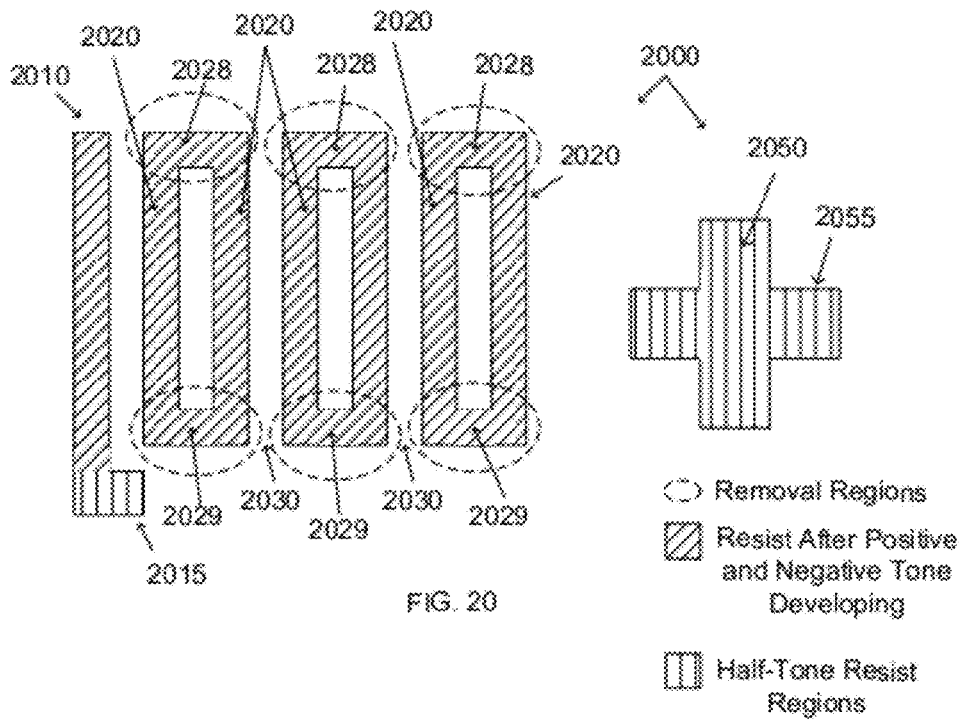

FIG. 20 illustrates another exemplary second resist pattern in accordance with embodiments of the invention. An exemplary second half-tone resist pattern 2000 is illustrated that can be established after a first exposure procedure, a positive tone developing procedure, and a negative tone developing procedure are performed. The exemplary second half-tone resist pattern 2000 is illustrated having one or more isolated resist features 2010 and one or more half-tone resist features 2015. The second half-tone resist pattern 2000 can include a plurality of incompletely formed second resist features 2020 that were created using the first resist features (FIG. 19, 1925) and a plurality of substantially symmetrical transparent regions 2030. For example, one or more line end features (2028 and 2029) can be created in one or more of the incompletely formed second resist features 2020 and an additional exposure procedure can be performed to remove the line end features (2028 and 2029). In addition, the second resist features 2020 can illustrate lines in the semiconductor device. The second isolated resist features 2010 and half-tone resist features 2015 can have lengths and thicknesses (not shown) when they are correctly formed, and the substantially symmetrical second resist features 2020 can have feature lengths and thicknesses (not shown) when they are correctly formed. The substantially symmetrical second resist features 2020 can be separated by a pitch (not shown) when they are correctly formed. In addition, the second half-tone resist pattern 2000 can include one or more half-tone resist features (2050 and 2055). In some embodiments, the half-tone resist image remains after both the positive and the negative tone developments. As shown in FIG. 3, the half tone mask can cause a resist exposure above the lower threshold (FIG. 3, 309) but below the upper threshold (FIG. 3, 308). Alternatively, the second half-tone resist pattern 2000 may be configured differently.

Figure 21:
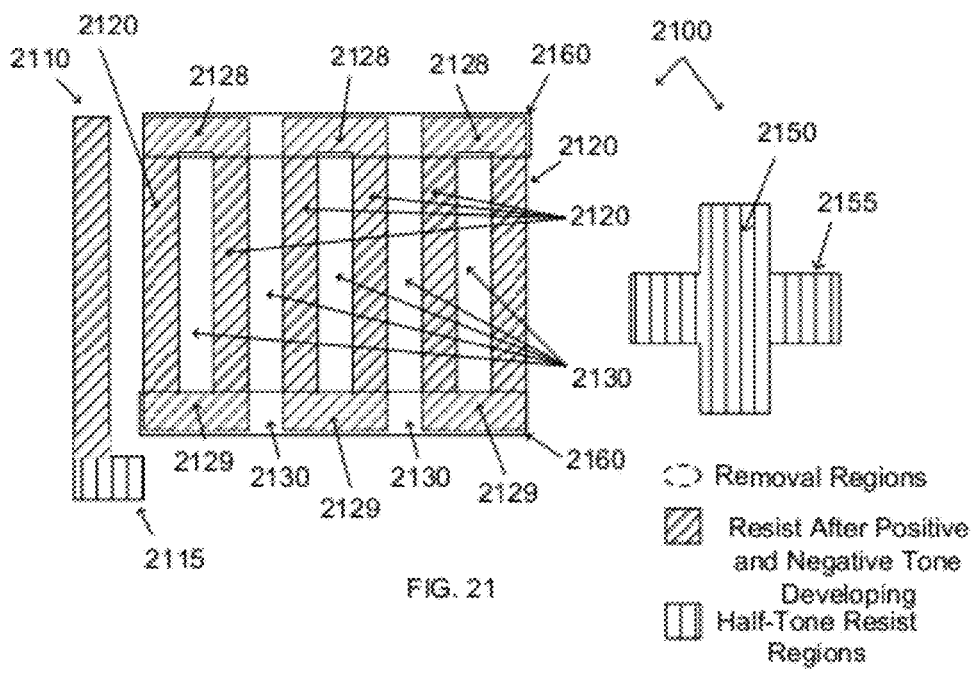
FIG. 21 illustrates an exemplary second exposure pattern in accordance with embodiments of the invention.

FIG. 21 illustrates an exemplary second exposure pattern in accordance with embodiments of the invention. An exemplary second exposure pattern 2100 is illustrated that can be established after a first exposure procedure, a positive tone developing procedure, a negative tone developing procedure, and a second exposure procedure are performed. The second exposure pattern 2100 is illustrated having one or more isolated resist features 2110 and one or more half-tone resist features 2115 that are not exposed during the second exposure procedure. The second exposure pattern 2100 can include a plurality of incompletely formed second resist features 2120 and a plurality of substantially symmetrical transparent regions 2130. For example, one or more of the line end features (2128 and 2129) can be removed using the second mask 2160 during the second exposure procedure. In addition, the second exposure pattern 2100 can include one or more half-tone resist features (2150 and 2155) that are not exposed during the second exposure procedure. Alternatively, the second exposure pattern 2100 may be configured differently.

Figure 22:
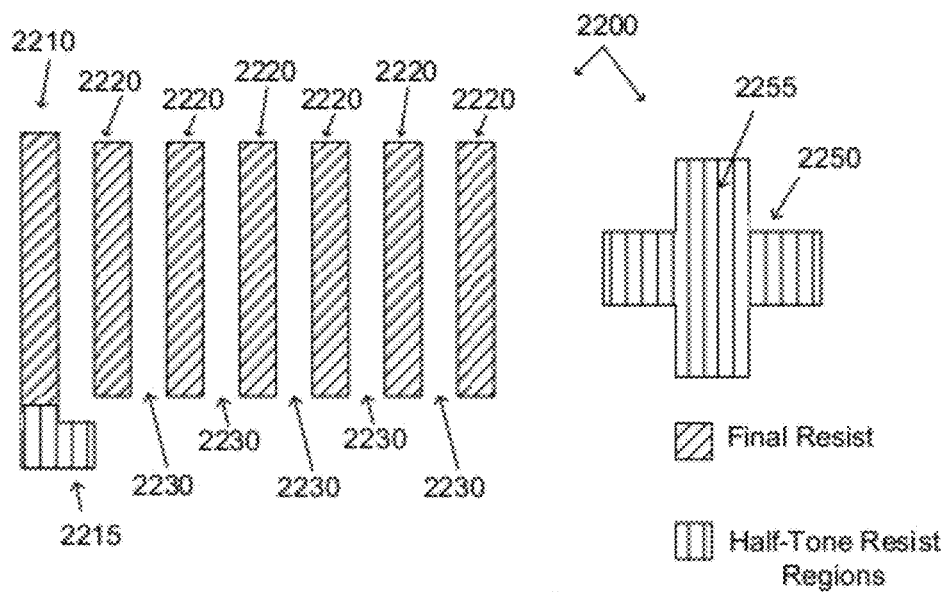
FIG. 22 illustrates an exemplary third resist pattern in accordance with embodiments of the invention.

FIG. 22 illustrates an exemplary third resist pattern in accordance with embodiments of the invention. An exemplary (final) third resist pattern 2200 is illustrated that can be established after a first exposure procedure, a positive tone developing procedure, a negative tone developing procedure, a second exposure procedure, and a second positive tone developing procedure are performed. The third resist pattern 2200 is illustrated having one or more isolated resist features 2210 and one or more half-tone resist features 2215. The third resist pattern 2200 can include a plurality of second resist features 2220 and a plurality of substantially symmetrical transparent regions 2230. For example, the second resist features 2220 can illustrate lines in the semiconductor device. The second isolated resist features 2210 and half-tone resist features 2215 can have lengths and thicknesses (not shown) when they are correctly formed, and the substantially symmetrical second resist features 2220 can have feature lengths and thicknesses (not shown) when they are correctly formed. The substantially symmetrical second resist features 2220 can be separated by a pitch (not shown) when they are correctly formed. In addition, the third resist pattern 2200 can include one or more half-tone resist features (2250 and 2255). In some embodiments, the half-tone resist features remains after both the positive and the negative tone developments. Alternatively, the third resist pattern 2200 may be configured differently.

Figure 23:
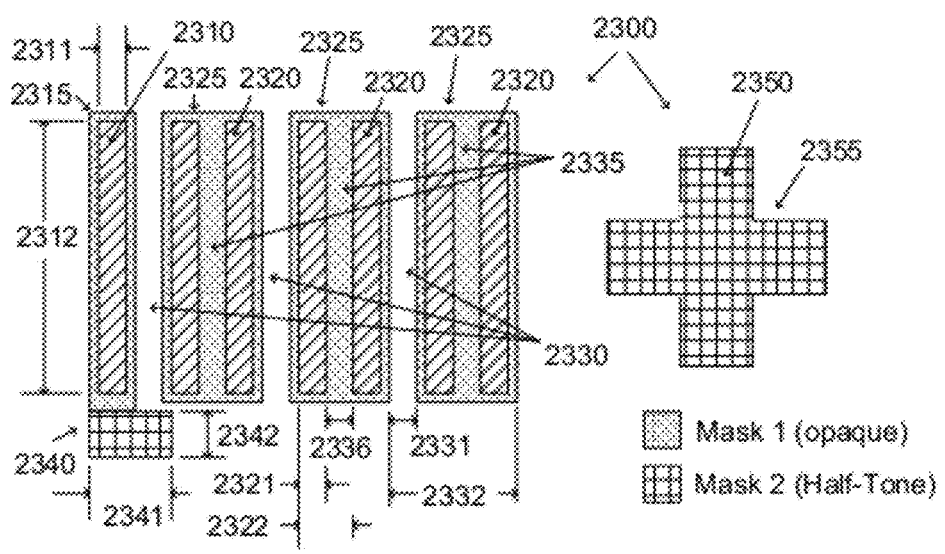
FIG. 23 illustrates a generalized view of a half-tone mask for use in a dual-tone development procedure in accordance with embodiments of the invention.

FIG. 23 illustrates a generalized view of a half-tone mask for use in a dual-tone development procedure in accordance with embodiments of the invention. A generalized half-tone mask pattern 2300 is illustrated that can include a first half-tone decomposition of a target pattern for a dual-tone resist layer on a substrate. The generalized half-tone mask pattern 2300 is illustrated having at least one isolated opaque mask region 2315 that encompasses at least one first isolated feature 2310, and a half-tone mask feature 2340 that can be coupled to the first isolated feature 2310. The first isolated feature 2310 can have a width 2311 that can vary from about 4 nm to about 40 nm and a length 2312 that can vary from about 20 nm to about 1000 nm. The half-tone mask feature 2340 can have a width 2341 that can vary from about 4 nm to about 40 nm and a length 2342 that can vary from about 4 nm to about 40 nm. The generalized half-tone mask pattern 2300 can include a plurality of substantially symmetrical opaque mask regions 2325 separated by a plurality of (transparent) symmetrical space regions 2330. The symmetrical space regions 2330 can have a width 2331 that can vary from about 4 nm to about 40 nm and a pitch 2332 that can vary from about 8 nm to about 80 nm. The opaque mask regions 2325 can encompass one or more substantially symmetrical resist features 2320, and one or more substantially symmetrical space features 2335. The resist features 2320 can have a width 2321 that can vary from about 4 nm to about 40 nm, the space features 2335 can have a width 2336 that can vary from about 4 nm to about 40 nm, and a pitch 2322 that can vary from about 8 nm to about 80 nm. For example, the substantially symmetrical features 2320 can illustrate lines in the semiconductor device. In addition, the generalized half-tone mask pattern 2300 can include two additional half-tone mask features (2350 and 2355). For example, the half-tone mask features (2350 and 2355) can include sub-resolution line/space features. In some examples, the half-tone feature can be defined as a feature (or region) that has an overall mask transmittance between the darkest and brightest transmittance in a given mask/reticle. Alternatively, the generalized half-tone mask pattern 2300 may be configured differently.

In various embodiments, the resist features (2310 and 2320) can comprise dual-tone resist material that can include photo-acid polymers and/or photo-base polymers. Alternatively, the resist features (2310 and 2320) can comprise partially-exposed and/or partially-developed dual-tone material.

During various dual-tone procedures, the inventors believe that their invention can be used to determine the best processing parameters and feature profiles that are needed to give the overall best solution when half-tone masking features are being used. For example, when resolution enhancement techniques such as sub-resolution line/space features; are used, their invention can be used to determine the optimum pitch and/or size for a sub-resolution grating pattern.

In some procedures, the method of patterning a substrate can comprise: forming a layer of radiation-sensitive material on a substrate, and the layer of radiation-sensitive material can include a dual-tone resist; performing one or more exposures of the layer of radiation-sensitive material to one or more patterns of radiation, and at least one of the one or more exposures can include using a resolution enhancement technique.

In addition, the at least one of the one or more exposures can include forming the pattern of radiation using a mask selected from the group consisting of a phase-shift mask, a tri-tone mask, and a half-tone mask. When the half-tone mask is used, a sub-resolution pitch, a sub-resolution size, or a mask edge spacing, or any combination of two or more thereof can be selected.

In some examples, the one or more exposures can comprise forming a first pattern of radiation using a first mask and forming a second pattern of radiation using a second mask, and the first mask can include a first dipole and the second mask can include a second dipole different than the first dipole.

In addition, the method can further comprise: defining rules for the resolution enhancement technique.

In other embodiments, the methods used to pattern a substrate can comprise: forming a layer of radiation-sensitive material on a substrate, and the layer of radiation-sensitive material can include a dual-tone resist; exposing the layer of radiation-sensitive material to a pattern of radiation using a mask to form one or more first radiation-sensitive material portions, one or more second radiation-sensitive material portions, and one or more third radiation-sensitive material portions; removing the one or more first radiation-sensitive material portions from the substrate using a first chemistry; and removing the one or more second radiation-sensitive material portions from the substrate using a second chemistry, and at least one region of the mask can include a half-tone mask.

In still other embodiments, the methods used to pattern a substrate can comprise: forming a layer of radiation-sensitive material on a substrate. For example, the layer of radiation-sensitive material can include a dual-tone resist; exposing the layer of radiation-sensitive material to a first pattern of radiation using a first mask, the first mask can include at least one half-tone mask portion; performing positive-tone developing of the layer of radiation-sensitive material to remove first radiation-sensitive material portions from the substrate using a first chemistry; performing negative-tone developing of the layer of radiation-sensitive material to remove second radiation-sensitive material portions from the substrate using a second chemistry. For example, third radiation-sensitive material portions remain on the substrate, and at least a part of the third radiation-sensitive material portions corresponds to the half-tone mask portion.

These methods can further comprise: exposing the layer of radiation-sensitive material to a second pattern of radiation using a second mask; and performing a second positive-tone developing of the layer of radiation-sensitive material to remove fourth radiation-sensitive material portions.

The method can still further comprise: performing a first post-exposure bake of the substrate following the exposing the substrate to the first pattern of radiation and preceding the positive-tone developing; and performing a second post-exposure bake of the substrate following the positive-tone developing and preceding the negative-tone developing.

The method can also comprise: performing a third post-exposure bake of the substrate following the exposing the substrate to the second pattern of radiation and preceding the second positive-tone developing.

During some dual-tone procedures, process window values and process window overlap values can be determined.

Figure 24:
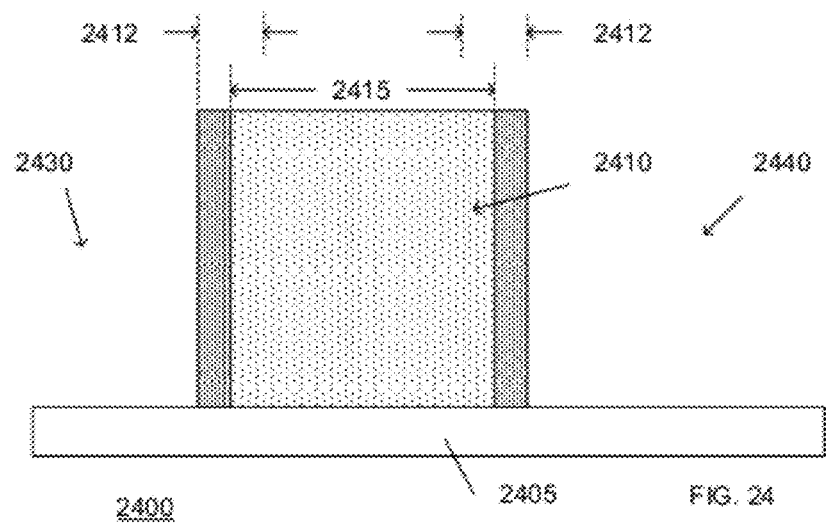
FIG. 24 illustrates an exemplary standard line pattern in accordance with embodiments of the invention.

FIG. 24 illustrates an exemplary standard line pattern in accordance with embodiments of the invention. The exemplary standard line pattern 2400 illustrated in FIG. 24 includes a substrate 2405, an exemplary line feature 2410, a first space region 2430, and a second space region 2440. In some examples, the first space region 2430 can be identified as a high exposure region in which the material was removed during positive-tone development procedures, and the second space region 2440 can be identified as a low exposure region in which the material was removed during negative-tone development procedures.

A target critical dimension (CD) 2415 and an edge tolerance value 2412 are shown for the exemplary line feature 2410. For example, when the edge tolerance value can be (+/−10%)*(CD spec), the individual line edge can vary by (0.05×CD). Typically, for normal line lithography, the CD change can be symmetrical.

Figure 25:
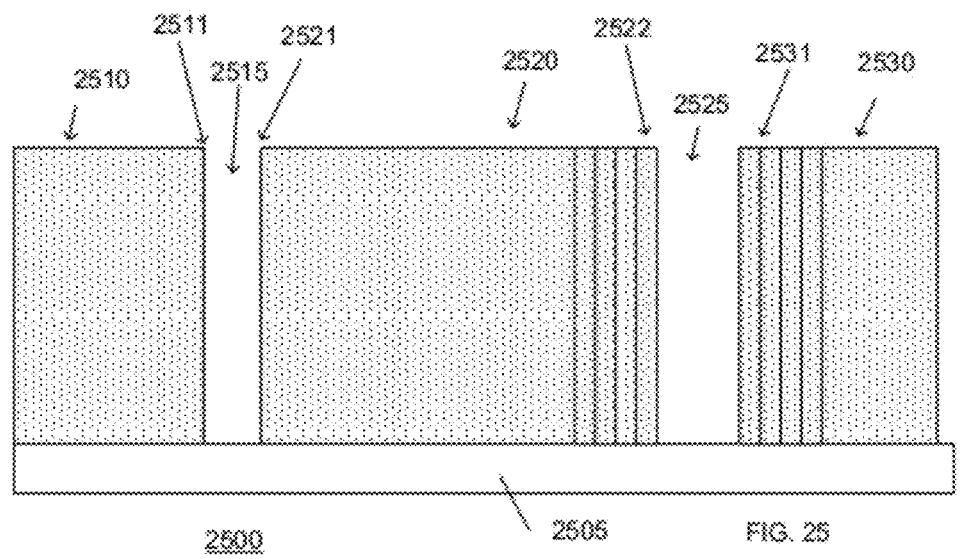
FIG. 25 illustrates exemplary exposure effects on line patterns in accordance with embodiments of the invention.

FIG. 25 illustrates exemplary exposure effects on line patterns in accordance with embodiments of the invention. The exemplary line pattern 2500 illustrated in FIG. 25 includes a substrate 2505, a first line feature 2510, a first space region 2515, a second line feature 2520, a second space region 2525, and a third line feature 2530. In some examples, the first space region 2515 and the second space region 2525 can be identified as high exposure regions in which the material was removed during positive-tone development procedures. Alternatively, the first space region 2515 and the second space region 2525 can be identified as low exposure regions in which the material was removed during negative-tone development procedures.

In FIG. 25, the first line feature 2510 has a first negative edge 2511 associated therewith, and the second line feature 2520 has another negative edge 2521 associated therewith. Alternatively, the first line feature 2510 may have a positive edge associated therewith, and the second line feature 2520 may have another positive edge associated therewith.

In addition, the second line feature 2520 has at least one first positive edge 2522 associated therewith, and the third line feature 2530 has at least one other positive edge 2531 associated therewith. Alternatively, the second line feature 2520 may have a negative edge associated therewith, and the third line feature 2530 may have another positive edge associated therewith.

During dual-tone procedures, each line can be constructed using one positive edge and one negative edge. For example, all of the lines can have the same CD that can be dose dependent (like traditional lithography); however, when there are exposure changes the positive edges (2522 and 2531) can change, and the size of the second space region 2525 can change.

In some examples, the first space regions 2515 can be formed using two negative edges (2511 and 2521), and the second space region 2525 can be formed using two positive edges (2522 and 2531). Alternatively, the first space regions 2515 may be formed using two positive edges, and the second space region 2525 may be formed using two negative edges.

Figure 26:
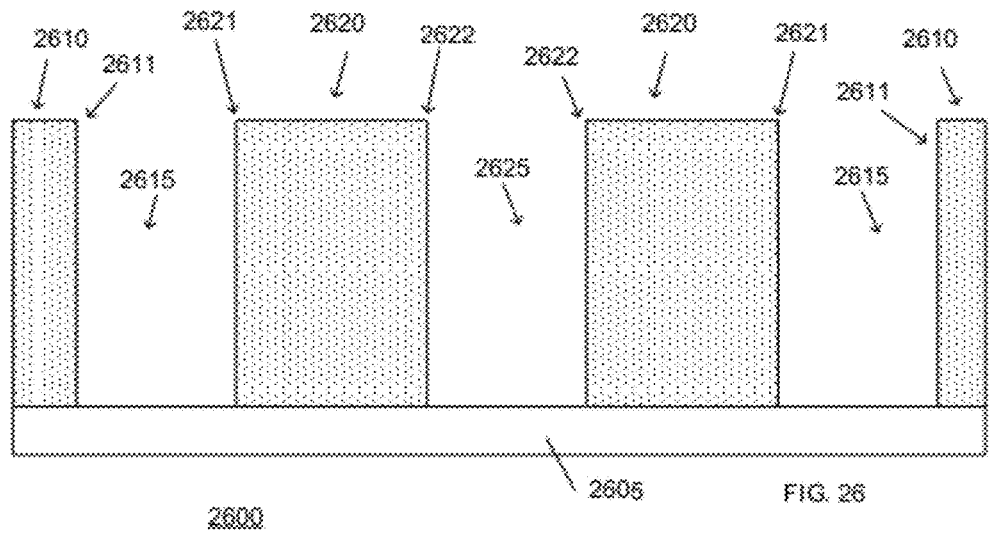
FIG. 26 illustrates exemplary space CD variations for line patterns in accordance with embodiments of the invention.

FIG. 26 illustrates exemplary space CD variations for line patterns in accordance with embodiments of the invention. The exemplary line pattern 2600 illustrated in FIG. 26 includes a substrate 2605, a plurality of first line features 2610, a plurality of first space regions 2615, a plurality of second line features 2620, and at least one second space region 2625. In some examples, the first space regions 2615 and the second space region 2625 can be identified as high exposure regions in which the material was removed during positive-tone development procedures. Alternatively, the first space region 2615 and the second space region 2625 can be identified as low exposure regions in which the material was removed during negative-tone development procedures.

The first line features 2610 can have first negative edges 2611 associated therewith, and the second line features 2620 can have a negative edge 2621 associated therewith. Alternatively, the first line features 2610 may have positive edges associated therewith, and the second line features 2620 may also have positive edges associated therewith.

In addition, the second line features 2620 can have at least one first positive edge 2622 associated therewith. Alternatively, the second line feature 2620 may have a negative edge associated therewith.

In some examples, the first space regions 2615 can be formed using two negative edges (2611 and 2621), and the second space region 2625 can be formed using two positive edges (2622 and 2622). Alternatively, the first space regions 2615 may be formed using two positive edges, and the second space region 2625 may be formed using two negative edges.

Both edges (2611 and 2621) of the first space regions 2615 can be defined by a first development process, and both edges (2622) of the second space regions 2625 can be defined by a second development process. The space regions (2615 and 2625) can have zero placement error because of this, and the CDs for the space regions (2615 and 2625) can be controlled by changing the dose-related parameters.

The inventors believe they have invented novel optimization techniques to control the CD variation and establish a specified amount of variation. In addition, their novel dual-tone procedures can be used to determine overlapping process windows for both the line feature and the space feature. In various examples, the inventors believe that the space feature can be treated as it always has been in traditional lithography, and they think that the line feature CD can shift and the feature position can walk as the exposure changes. In addition, the inventors have developed novel techniques to control the lines that have errors resembling traditional CD+ overlay, and their techniques provide a line process window that can be reduced relative to the traditional lithographic processes.

Figure 27:
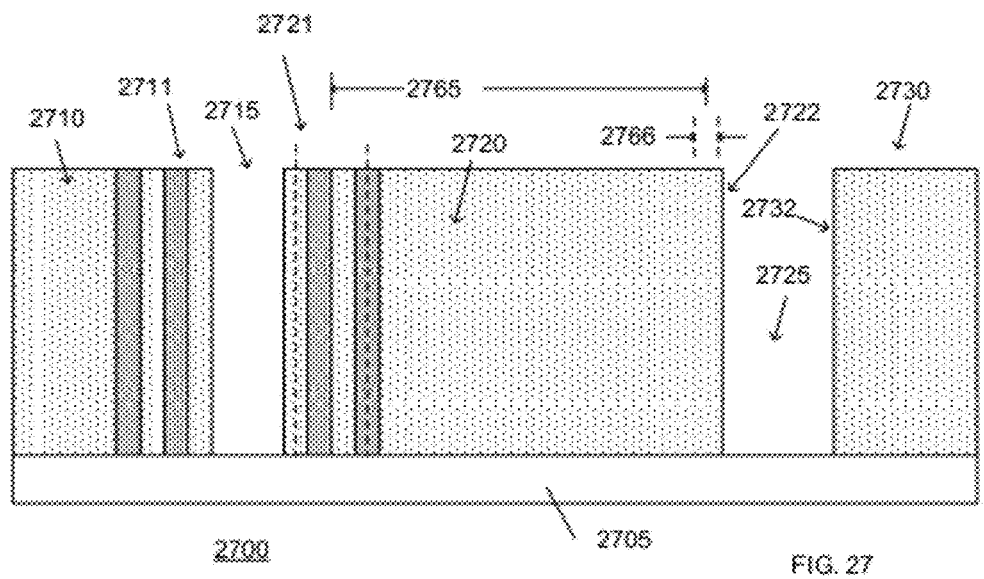
FIG. 27 illustrates an exemplary line pattern for determining target CD variations in accordance with embodiments of the invention.

FIG. 27 illustrates an exemplary line pattern for determining target CD variations in accordance with embodiments of the invention. The exemplary line pattern 2700 illustrated in FIG. 27 includes a substrate 2705, a first line feature 2710, a first space region 2715, a second line feature 2720, a second space region 2725, and a third line feature 2730. In some examples, the first space regions 2715 and the second space region 2725 can be identified as high exposure regions in which the material was removed during positive-tone development procedures. Alternatively, the first space region 2715 and the second space region 2725 can be identified as low exposure regions in which the material was removed during negative-tone development procedures.

The first line features 2710 can have first negative edges 2711 associated therewith, and the second line features 2720 can have other negative edges 2721 associated therewith. Alternatively, the first line features 2710 may have positive edges associated therewith, and the second line features 2720 may also have positive edges associated therewith.

For example, the second line features 2720 can have at least one first positive edge 2722 associated therewith. Alternatively, the second line feature 2720 may have a negative edge associated therewith. In addition, the third line feature 2730 can have a first positive edge 2732 associated therewith. Alternatively, the third line feature 2730 may have a negative edge associated therewith.

In some examples, the first space regions 2715 can be formed using two negative edges (2711 and 2721), and the second space region 2725 can be formed using two positive edges (2722 and 2732). Alternatively, the first space region 2715 may be formed using two positive edges, and the second space region 2725 may be formed using two negative edges.

Both edges (2711 and 2721) of the first space regions 2715 can be defined by a first development process, and both edges (2722 and 2732) of the second space regions 2725 can be defined by a second development process. The space regions (2715 and 2725) can have zero placement error because of this, and the target CD 2765 associated with the second line feature 2720 can be controlled by changing the dose-related parameters. In addition, the target CD 2765 can have a edge tolerance value 2766 that can be dependent on the type of dual-tone resist being used.

Figure 28:
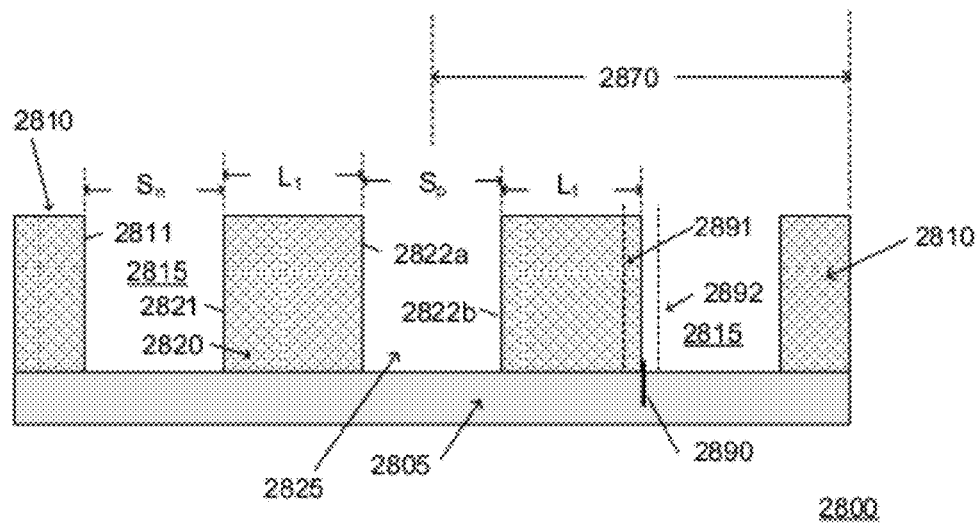
FIG. 28 illustrates an exemplary line pattern for determining specification window variations in accordance with embodiments of the invention.

FIG. 28 illustrates an exemplary line pattern for determining specification window variations in accordance with embodiments of the invention. The exemplary line pattern 2800 illustrated in FIG. 28 includes a substrate 2805, a plurality of first line features 2810, a plurality of first space regions 2815, a plurality of second line features 2820, and a second space region 2825. In some examples, the first space regions 2815 and the second space region 2825 can be identified as high exposure regions in which the material was removed during positive-tone development procedures. Alternatively, the first space region 2815 and the second space region 2825 can be identified as low exposure regions in which the material was removed during negative-tone development procedures.

At least one of the first line features 2810 can have a first negative edge 2811 associated therewith, and at least one of the second line features 2820 can have another negative edge 2821 associated therewith. Alternatively, the first line feature 2810 may have positive edges associated therewith, and the second line features 2820 may also have positive edges associated therewith.

For example, the second line features 2820 can have at least one first positive edge 2822a associated therewith. Alternatively, the second line feature 2820 may have a negative edge associated therewith.

In some examples, the first space regions 2815 can be formed using two negative edges (2811 and 2821), and when the first space region 2815 is formed using the two negative edges (2811 and 2821), a "negative" space can be established that has a negative space width ($S_n$). For example, the negative space width ($S_n$) can vary from about 4 nm to about 40 nm. In addition, the second space region 2825 can be formed using two positive edges (2822a and 2822b), and when the second space region 2825 is formed using the two positive edges (2822a and 2822b), a "positive" space can be established that has a positive space width ($S_p$). For example, the positive space width ($S_p$) can vary from about 4 nm to about 40 nm. Furthermore, the second line feature 2820 can have a length ($L_1$) that can vary from about 4 nm to about 40 nm.

Both edges (2811 and 2821) of the first space regions 2715 can be defined by a first development process, and both edges (2822 and 2832) of the second space regions 2825 can be defined by a second development process. In addition, a (¾) (pitch) value 2870 can also be used during the dual-tone procedure.

The exemplary line pattern 2800 can include an outside line edge placement target 2890 that can have a first tolerance limit 2891 and a second tolerance limit 2892 associated therewith. For example, the space regions (2815 and 2825) can have zero placement error, and the outside line edge placement target 2890 associated with the second line feature 2820 can be controlled by changing the dose-related parameters. In addition, the first tolerance limit 2891 and the second tolerance limit 2892 can be dependent on the type of dual-tone resist being used.

In some embodiments, the following equations can be used.

$$\text{pitch} = S_p + S_n + 2L_1 \quad (1)$$

$$\text{Outside Line Edge Placement} = (0.5)(S_p) + L_1 = (0.5)(S_n) + L_1 \quad (2)$$

$$\text{Outside Line Edge Placement Target} = (3*\text{pitch}/8) \pm (\text{pitch}/4)(0.05) \quad (3)$$

$$\{-(\text{pitch}/4)(0.05)\} <= \{(0.5)(S_p) + L_1 - (3*\text{pitch}/8)\} <= \{(\text{pitch}/4)(0.05)\} \quad (4)$$

$$\text{Error in Line Edge Placement} = \{(0.5)(S_p) + L_1 - (3*\text{pitch}/8)\} \quad (5)$$

Figure 29:
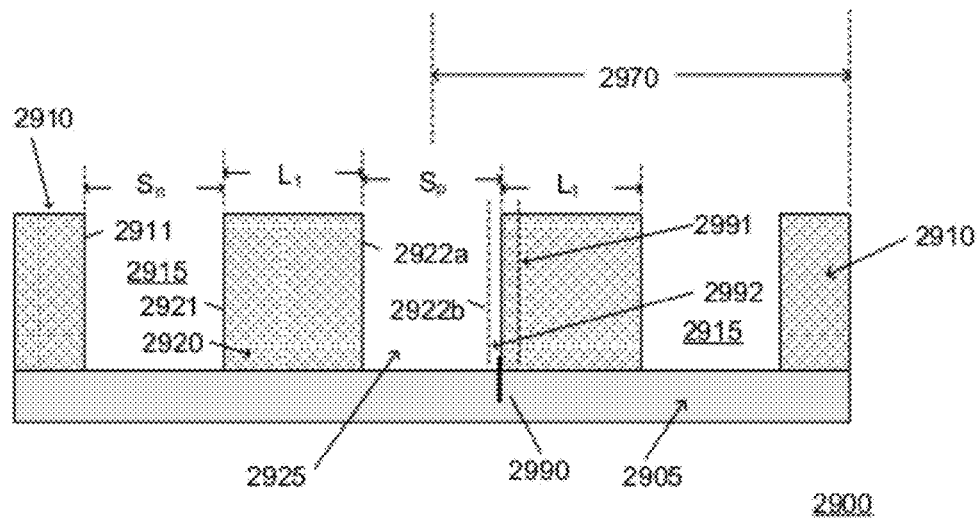
FIG. 29 illustrates an exemplary line pattern for determining additional specification window variations in accordance with embodiments of the invention.

FIG. 29 illustrates an exemplary line pattern for determining additional specification window variations in accordance with embodiments of the invention. The exemplary line pattern 2900 illustrated in FIG. 29 includes a substrate 2905, a plurality of first line features 2910, a plurality of first space regions 2915, a plurality of second line features 2920, and a second space region 2925. In some examples, the first space regions 2915 and the second space region 2925 can be identified as high exposure regions in which the material was removed during positive-tone development procedures. Alternatively, the first space region 2915 and the second space region 2925 can be identified as low exposure regions in which the material was removed during negative-tone development procedures.

At least one of the first line features 2910 can have a first negative edge 2911 associated therewith, and at least one of the second line features 2920 can have another negative edge 2921 associated therewith. Alternatively, the first line feature 2910 may have positive edges associated therewith, and the second line features 2920 may also have positive edges associated therewith.

For example, the second line features 2920 can have at least one first positive edge 2922a associated therewith. Alternatively, the second line feature 2920 may have a negative edge associated therewith.

In some examples, the first space regions 2915 can be formed using two negative edges (2911 and 2921), and when the first space region 2915 is formed using the two negative edges (2911 and 2921), a "negative" space can be established that has a negative space width ($S_n$). For example, the negative space width ($S_n$) can vary from about 4 nm to about 40 nm. In addition, the second space region 2925 can be formed using two positive edges (2922a and 2922b), and when the second space region 2925 is formed using the two positive edges (2922a and 2922b), a "positive" space can be established that has a positive space width ($S_p$). For example, the positive space width ($S_p$) can vary from about 4 nm to about 40 nm. Furthermore, the second line feature 2920 can have a length ($L_1$) that can vary from about 4 nm to about 40 nm.

Both edges (2911 and 2921) of the first space regions 2915 can be defined by a first development process, and both edges (2922a and 2922b) of the second space regions 2925 can be defined by a second development process. In addition, a (¾) (pitch) value 2970 can also be used during the dual-tone procedure.

The exemplary line pattern 2900 can include an inside line edge placement target 2990 that can have a first tolerance limit 2991 and a second tolerance limit 2992 associated therewith. For example, the space regions (2915 and 2925) can have zero placement error, and the inside line edge placement target 2990 associated with the second line feature 2920 can be controlled by changing the dose-related parameters. In addition, the first tolerance limit 2991 and the second tolerance limit 2992 can be dependent on the type of dual-tone resist being used.

For example, the CD specification and tolerances can be the same when the inside line edge placement target 2990 is used. In addition, when the space CDs is within the limits, the inside line edge will be within the specified limits as well. If the positive space 2925 meets the CD specification and both line edges (2922a and 2922b) meet their edge line specification limits, then the negative space 2915 must also meet its CD specifications as well, since the pitch is fixed. The inventors are establishing novel techniques that can be used to determine and/or optimize overlapping process windows by determining the overlap of the process window for one of the spaces, and the process window for the line edge defined by the opposite tone development.

In addition, the inventors further believe that they have invented one or more novel optimization routines for Dual-tone Development (DTD) procedures. Because the DTD procedures are complex, optimization can be very challenging. The inventors have developed several novel algorithms for optimizing the process based on various desired outputs: 1) Profile; 2) Profile+Exposure Latitude; 3) Profile+Exposure Latitude+Depth of Focus; 4) Profile+Exposure Latitude+Depth of Focus+MEF (Mask Error Factor); and 5) Profile+Exposure Latitude+Depth of Focus+MEF+additional output parameter (in this manner the methodology can be extended to include many variables.)

Figure 30:
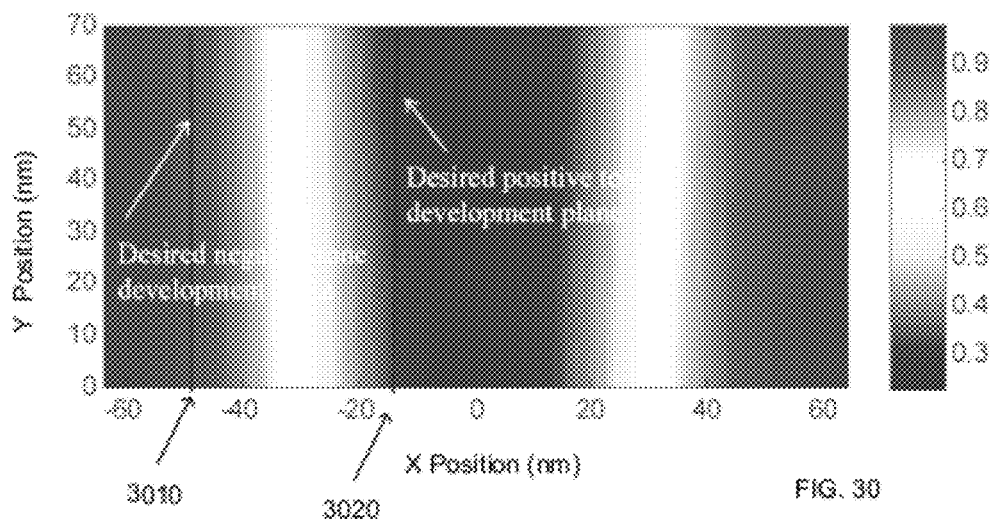
Figure 31:
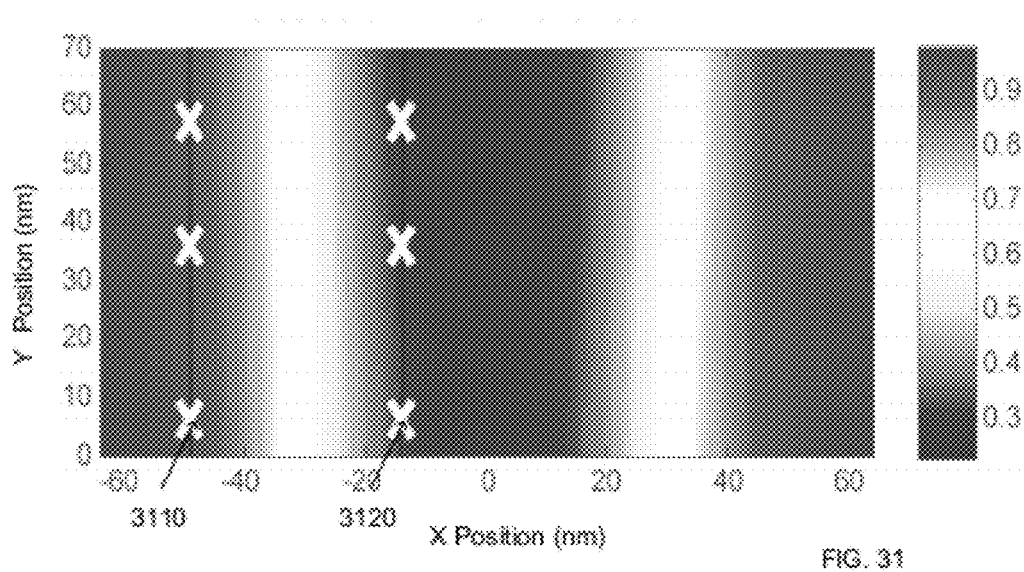

FIG. 30 and FIG. 31 show the general methodology for optimizing the profile. For DTD, there are two planes of concern, the first plane 3010 can be where the negative tone development occurs, and the second plane 3020 can be where the positive tone development occurs. The inventors can model and optimize the behavior at these planes (3010 and 3020) to optimize the process. In the simplest case, the inventors place the planes (3010 and 3020) where they want the final resist edges to be (zero bias condition); however, they are not limited to this placement; the inventors have developed novel techniques in which a user can specify a desired bias, a desired placement, a desired negative tone threshold, and a desired positive tone threshold.

Once the planes of interest have been established, the input parameters (scanner settings, process conditions, resist parameters) can be varied, and in some embodiments, the de-protection gradient and other associated parameters can be calculated and/or optimized at the planes of interest. In order to have a substantially vertical profile, the de-protection gradients can be calculated at (n) points in the vertical planes of interest (as shown in FIG. 31 as 3110 and 3120). The de-protection gradients can then optimized by determining the highest average de-protection gradient while minimizing the standard deviation of all of the de-protection gradients (means that de-protection is similar at both positive and negative planes of interest and is similar at the points of interest within those planes). To enhance the optimization, optimization routines can be used that intelligently move the input parameters to more quickly converge on optimal solutions.

After this particular methodology for optimizing a dual-tone development process is completed, additional metrics can be added to the optimization. For example, a user can monitor how the de-protection gradient metrics that were calculated for an ideal situation vary through dose and focus. The user can also see how the process responds to changes on the reticle (MEF) or to changes in track processing parameters like PEB time.

The inventors have developed techniques to co-optimize the gradients at two critical planes, and to balance the final image on both sides of line. The inventors also have developed techniques to monitor the contrast at multiple planes of resist depth in order to have good sidewalls. In addition, the inventors have used (10%, 50%, and 80%) values to minimize errors at the surface.

Figure 32A:
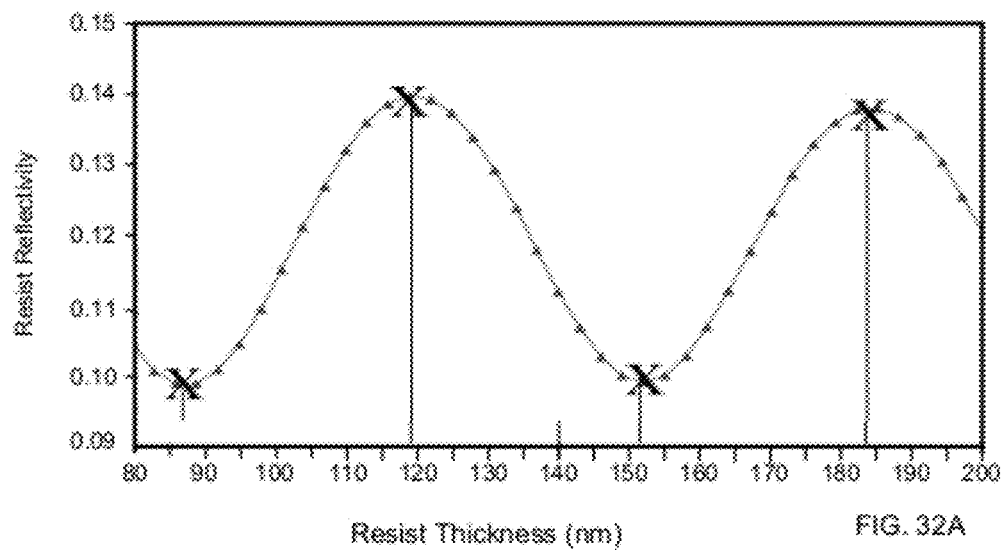
Figure 32B:
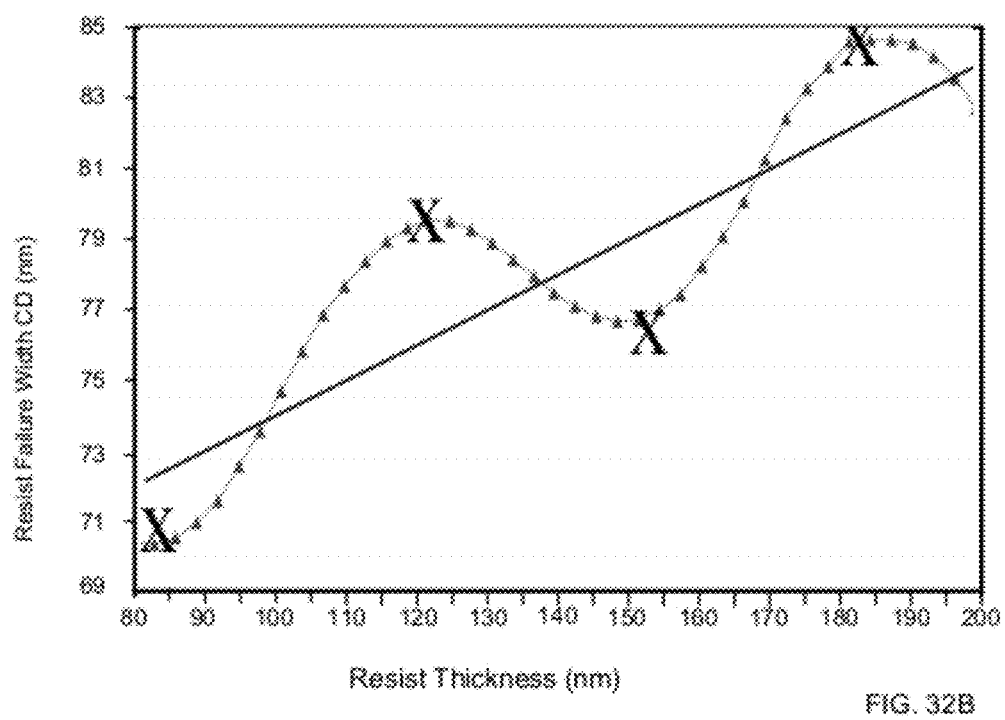
Figure 32C:
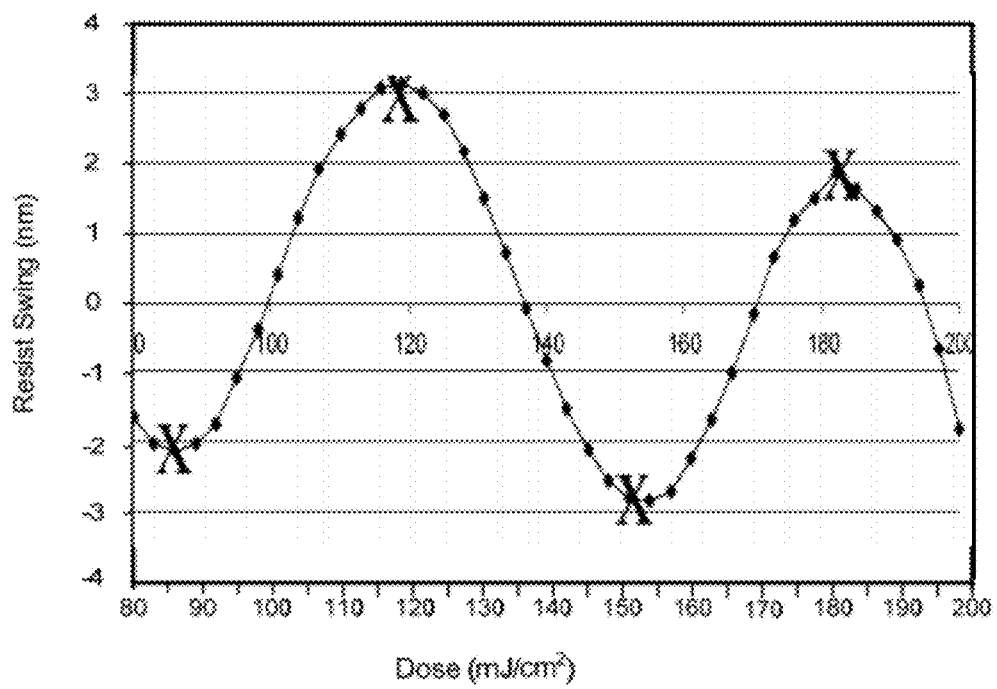

FIG. 32A illustrates an exemplary resist reflectivity graph in accordance with embodiments of the invention. FIG. 32B illustrates an exemplary resist failure width (CD) graph in accordance with embodiments of the invention. FIG. 32C illustrates an exemplary resist swing graph in accordance with embodiments of the invention.

The swing curve concept is well understood. Because of thin film interference effects, energy input into a resist film is dependent on the resist film itself. FIG. 32A shows the reflectivity off the top surface of the resist as a function of the resist thickness. This behavior translates into a shift in CD as a function of resist thickness (as shown in FIG. 32B) because the difference in reflectivity translates into a change in the dose that the resist sees. The CD shift has a "bulk effect" that is due to resist absorbance (the thicker the resist, the more energy is dissipated in the resist and the less is reflected) and a swing effect due the resist thickness. In FIG. 32C, the bulk effect has been subtracted out to show the CD variance due to resist thickness.

FIGS. 33A-33C illustrate a simplified view of how a positive resist responds to different exposure doses when the positive resist is used in a traditional lithographic procedure.

FIG. 33A illustrates a first patterned substrate 3300 after a first dose value (x) has been applied to the first patterned substrate 3300. For example, the first patterned substrate 3300 can include a substrate 3305, a first resist feature 3310, a first space 3320, a second resist feature 3330, a second space 3340, and a third resist feature 3350.

FIG. 33B illustrates a patterned substrate 3300' after a second dose value (x+Δx) has been applied to the patterned substrate 3300'. For example, the patterned substrate 3300' can include a substrate 3305, a smaller first resist feature 3310', a larger first space 3320', a smaller second resist feature 3330', a larger second space 3340', and a smaller third resist feature 3350'.

FIG. 33C illustrates a patterned substrate 3300" after a third dose value (x+2Δx) has been applied to the patterned substrate 3300". For example, this patterned substrate 3300" can include a substrate 3305, a slightly smaller first resist feature 3310", a slightly larger first space 3320", a slightly smaller second resist feature 3330", a slightly larger second space 3340", and a slightly smaller third resist feature 3350".

As shown in FIGS. 33A-33C, the CD changes size, and the change can be taken symmetrically from both edges of the feature so that the center of the line structure stays in the same place as exposure dose is changed. Lithographers use these results to determine the best resist thickness for the lithographic processes. In order to avoid large CD changes because of resist thickness changes, lithographers operate on the maximum or minimum of the swing curve where the curve is the most flat (least sensitive). In order to determine where this is, a lithographer will coat a series of wafers with different resist of different thickness, shoot all the wafers with the same exposure dose, and then measure the line CD 3360 from each wafer. Plotting the line CD 3360 versus the resist thickness results in a curve as shown in FIG. 32C, and finding the appropriate operating points is well known.

FIGS. 34A-34C illustrate a simplified view of how a dual-tone resist responds to different exposure doses when the dual-tone resist is used in a dual-tone development procedure.

FIG. 34A illustrates a first patterned substrate 3400 after a first dose value (x) has been applied to the first patterned substrate 3400. For example, the first patterned substrate 3400 can include a substrate 3405, a first resist feature 3410, a positive space 3420, a second resist feature 3430, a negative space 3440, and a third resist feature 3450.

FIG. 34B illustrates a patterned substrate 3400' after a second dose value (x+Δx) has been applied to the patterned substrate 3400'. For example, the patterned substrate 3400' can include a substrate 3405, an offset first resist feature 3410', a larger positive space 3420', an offset second resist feature 3430', a smaller negative space 3440', and an offset third resist feature 3450'.

FIG. 34C illustrates a patterned substrate 3400" after a third dose value (x+2Δx) has been applied to the patterned substrate 3400". For example, the patterned substrate 3400" can include a substrate 3405, a more offset first resist feature 3410", a slightly larger positive space 3420", a more offset second resist feature 3430", a slightly smaller negative space 3440", and a more offset third resist feature 3450".

As shown in FIGS. 34A-34C, there are several distinct differences between this scheme and the traditional lithographic process, and these differences can include:

1) The CD 3460 of the line may or may not change size. Each line feature can be composed of one edge defined by the positive development process and one line edge from the negative development process. If the responses of the positive and negative development processes to dose are equal in magnitude and opposite in sign, the CD 3460 of the line does not shift. (If the magnitudes are not equal, the CD 3460 of the line will change, but not symmetrically).

2) The center of the line can move, and this is because the positive tone space gets bigger while the negative tone space shrinks. Because of this behavior, it is not possible to use traditional swing curve methods (measurement of a line CD 3460) to determine the best operating point for a resist process. Instead a different figure of merit can be used based on the CD of adjacent spaces. Specifically, instead of plotting the CD 3460 of a line as a function of resist thickness, one could plot the (Space-positive tone and/or the Space-negative tone) as functions of resist thickness. This merit function will swing in a way similar to line CD 3460 for a traditional lithographic process.

FIG. 35A illustrates a simplified flow diagram of an exemplary dual-tone processing sequence in accordance with embodiments of the invention. FIG. 35B illustrates a first exemplary resist profile after a first develop procedure in accordance with embodiments of the invention. FIG. 35C illustrates a second exemplary resist profile after a second develop procedure in accordance with embodiments of the invention.

In still other embodiments of the invention, the inventors have developed novel dual-tone development code algorithms. The inventors believe that the commercially available software package does not do what they want to do with dual-tone development, and that is to use a single exposure to generate acid and then provide two different develop routines with the second operating on the output of the first.

The inventors have constructed novel code that uses a single exposure, and have used this novel code to understand and model the double development procedures. For example, FIG. 35A shows the flow. There is existing software that does all of the first four steps of the overall flow; the ATG code does the fifth step. Some of the novel aspects of the code include:

1) The boundary condition for the second development is no longer a flat surface but one with trenches that are already patterned, therefore, the programming involved is much more complex.

2) As a result of (1), interaction between the two development steps is captured. An imperfection in the features after the first development can lead to a dramatic imperfection after the second development.

Figure 36:
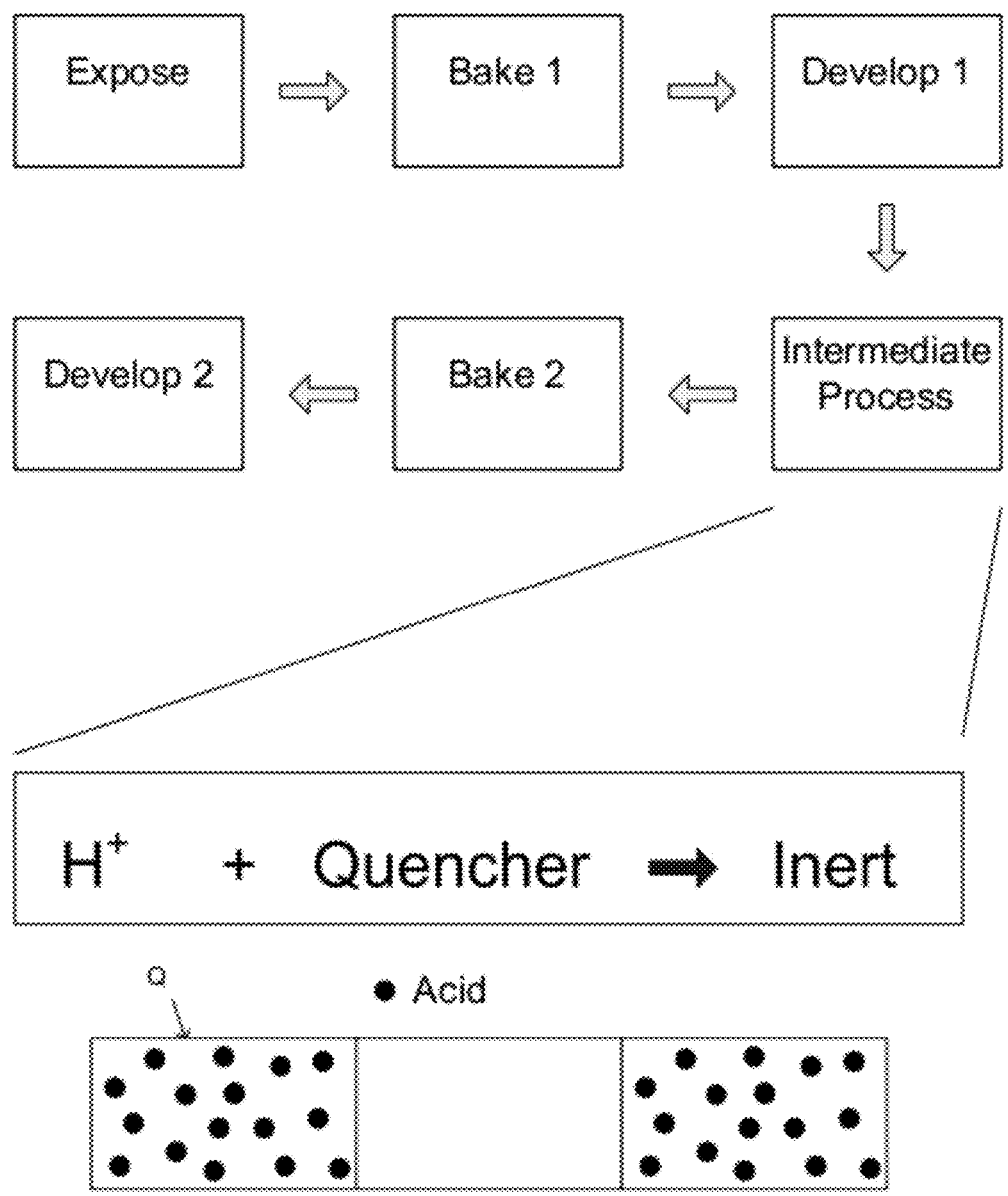
FIG. 36 presents additional exemplary data for patterning a substrate.

The inventors have developed novel models to predict the inter-development effects described herein. In the dual-tone development process flows, what happens during the first development step may impact the processing afterward. Consider the case where positive development is completed first, and in which it is desired to have a second PEB step to enhance the second development. If the first development is completed with an aqueous base developer as is commonly the case, the base may penetrate into the resist film and quench some of the acid that can be used during the second PEB to enhance the negative development (see reaction in FIG. 36). This is one example of the kind of behavior that can occur during the first and second development steps, and can be modeled in the routines that can be established.

In some embodiments, the inventors can establish additional modeling steps to account for such behavior. For example, the ideal acid profile can be calculated and perturbed using another mathematical function. The output of this function can then be input into the second PEB step, and the resultant de-protection profile can be used to calculate the second development step.

The example cited above can be an "undesired effect." This same technique could be applied to an intermediate process that can be intentionally injected into the system as well, and by including these extra modeling steps the accuracy can be improved.

The inventors have examined many different resist formulations during their dual-tone development (DTD) experiments. In some basic examples, one or more protecting (chemical) group species can be used (attached to polymer) during the resist formulation process. When two or more groups are attached to the polymer, they can have distinct activation energies so that discrimination of the negative and positive tone process can be achieved during multiple PEB steps.

The exemplary resists can include:

Different tertiary esters of carboxylic acids (e.g. methyladamantyl protecting group versus a t-butyl ester protecting group.)

t-butoxy carbonyl oxy carbonyloxy protecting groups of hexafluoro isopropanols.

Ratios of protecting group concentrations

Overall embodiment:

Idea is to take advantage of split PEB steps for dual-tone development.

In some examples, the resist formulation can require multiple PEB steps. If multiple PEB steps are essential to make DTD work, then multiple PEB steps can provide a better process.

Potential benefits:

Provide higher throughput (bake higher temperature/less PEB time on 2nd bake)

More control for CD sizing (temperature becomes another process knob)

Can be combined with PEB time control schemes (i.e., use both temperature and time control to center process)

May provide more flexibility in resist design/formulation

Figure 37A:
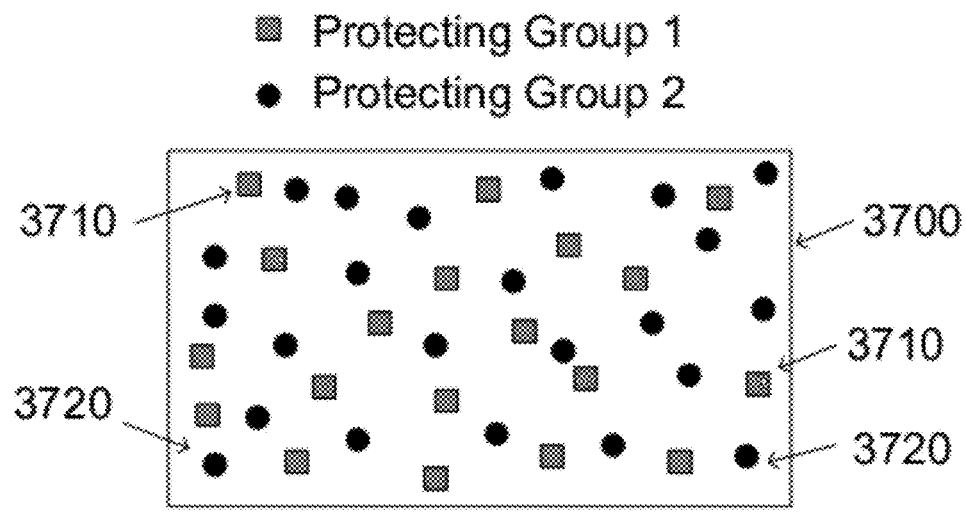
FIG. 37A illustrates a simplified diagram of a resist in accordance with embodiments of the invention.

FIG. 37A illustrates a simplified diagram of a resist in accordance with embodiments of the invention. FIG. 37A shows a simplified resist 3700 that includes a first protecting group 3710 and a second protecting group 3720.

Figure 37B:
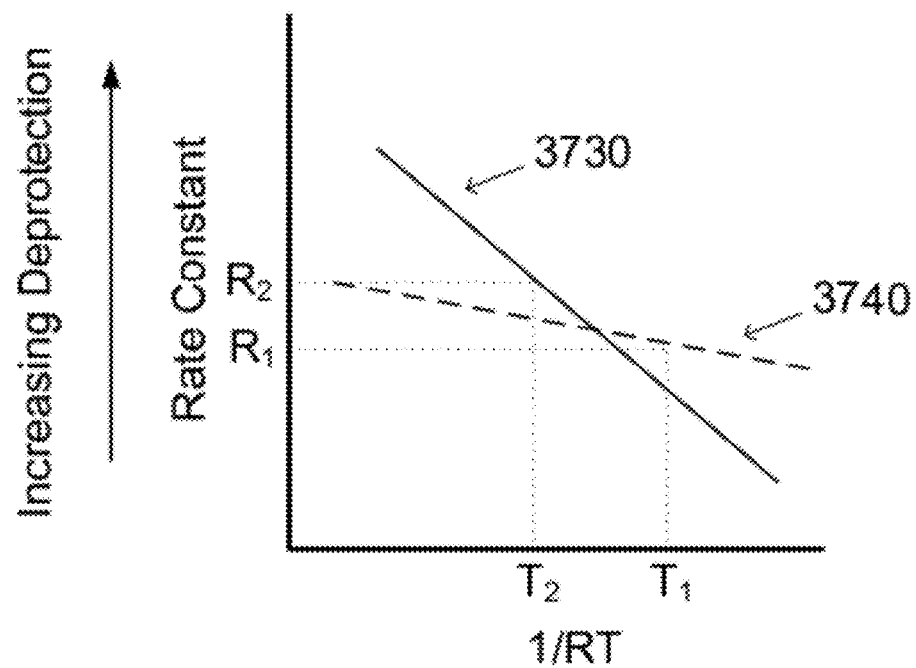
FIG. 37B illustrates a simplified rate constant graph in accordance with embodiments of the invention.

FIG. 37B illustrates a simplified rate constant graph in accordance with embodiments of the invention. For temperature $T_1$, $R_1$ dominates the rate of de-protection reaction. For temperature $T_2$, $R_2$ dominates the rate of de-protection reaction. Since $R_1$ dominates the reaction rate 3740 at temperature $T_1$, protecting group 1 can be thought of as the dominating specie for a given develop process (say, the positive tone). Then by shifting to higher temperature ($T_2$) on a second bake, the reaction rate 3740 is dominated by $R_2$, which is a result of protecting group 2. Rate $R_2$ can be used to increase or enhance the de-protection reaction for the negative tone process. This can be used as a "knob" for discriminating between two reactions (i.e., positive and negative tone de-protection reactions).

In some embodiments, a dual-tone resist can comprise: a backbone polymer that can include two or more side groups, each of the two or more side groups having distinct activation energies for de-protection.

In some embodiments, a method of patterning a substrate can comprise: forming a layer of radiation-sensitive material on a substrate. For example, the layer of radiation-sensitive material can include a backbone polymer that can include two or more side groups, each of the two or more side groups having a distinct activation energy for de-protection; exposing the layer of radiation-sensitive material to a pattern of radiation; performing a first post-exposure bake of the substrate to de-protect a first side group at a greater rate than a second side group; performing a first developing of the layer of radiation-sensitive material to remove first radiation-sensitive material portions from the substrate using a first chemistry; performing a second post-exposure bake of the substrate to de-protect the second side group at a greater rate than the first side group; performing a second developing of the layer of radiation-sensitive material to remove second radiation-sensitive material portions from the substrate using a second chemistry.

The method can further comprise: adjusting a ratio of an amount of a first side group to an amount of a second side group.

Some methods of patterning a substrate can comprise: forming a layer of radiation-sensitive material on a substrate. For example, the layer of radiation-sensitive material can include a backbone polymer that can include two or more side groups, each of the two or more side groups having a distinct activation energy for de-protection; and discriminating between a first de-protection reaction and a second de-protection reaction by selecting a temperature for heating the layer of radiation-sensitive material following an exposure of the layer of radiation-sensitive material to electromagnetic (EM) radiation.

Figure 38:
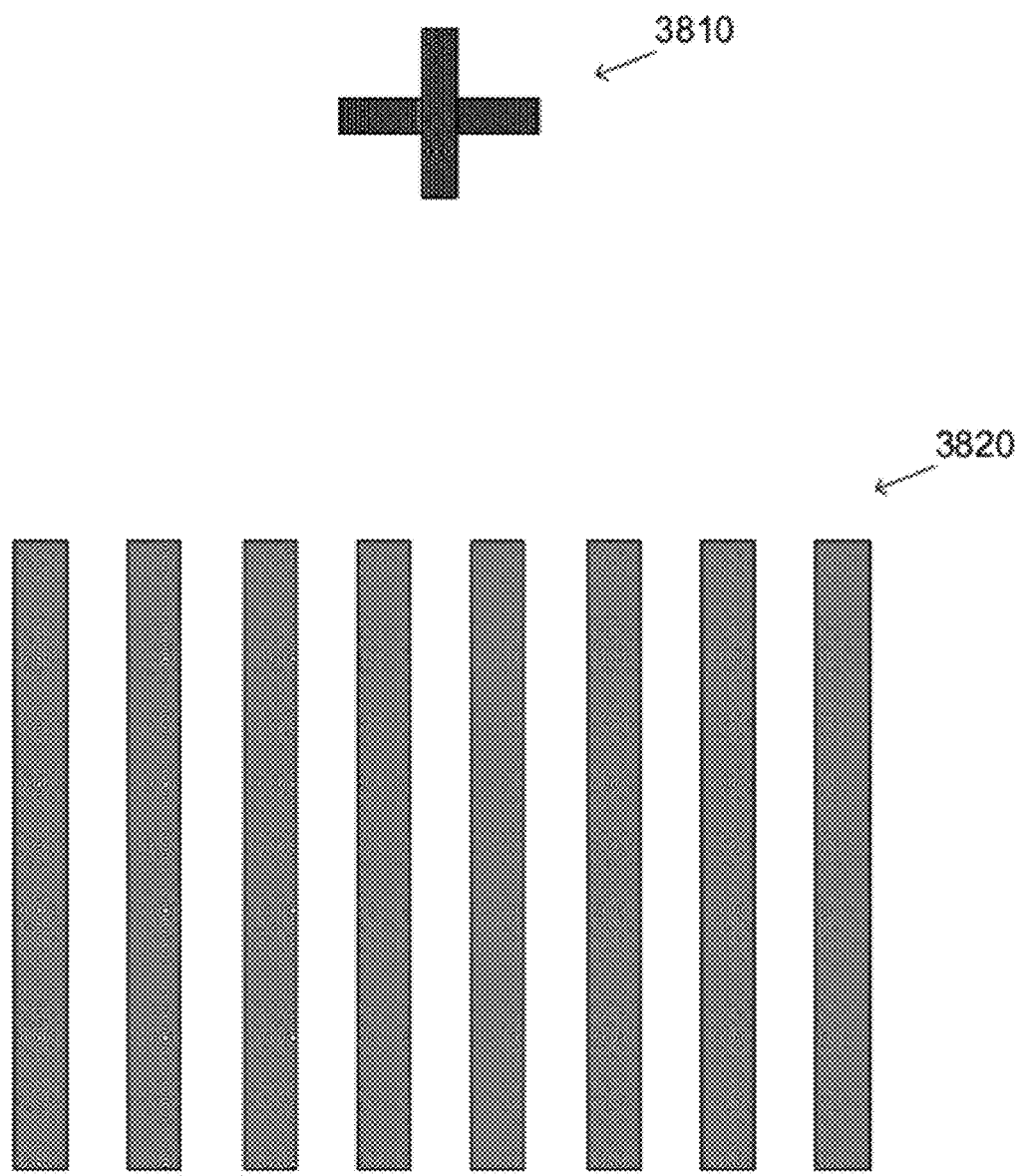
FIG. 38 presents additional exemplary data for patterning a substrate.

The inventors have also developed a Dual-tone Development (DTD) Metrology Strategy. In the dual-tone development DTD system, there are two types of spaces in the line/space patterns. Spaces delineated by a positive tone development process alternate with spaces delineated by a negative tone development process. When examining the grating itself, it is difficult to tell the difference between the positive tone and negative tone spaces. In order to detect and correct for pitch walking, it is important to know which space is which. Therefore, the inventors have developed a novel DTD metrology strategy that determines which space is which. In some embodiments, a metrology marker 3810 can be established in close proximity to the grating 3820 as depicted in FIG. 38. This marker 3810 can be used for pattern recognition of the metrology marker. The proximity of this feature must be close enough to the grating structure 3820 so that it is virtually impossible for a SEM to lose its alignment after completing the pattern recognition step and moving to measure the actual feature. In this way, a space can be measured and it can be known which tone of development defined it, thus making process control possible.

In some simulation based embodiments, the inventors have used zero-order approximation techniques to estimate and/or predict the resist profiles in the dual-tone simulation process. The dissolution behavior can be assumed to be independent from each develop step.

Figure 39A:
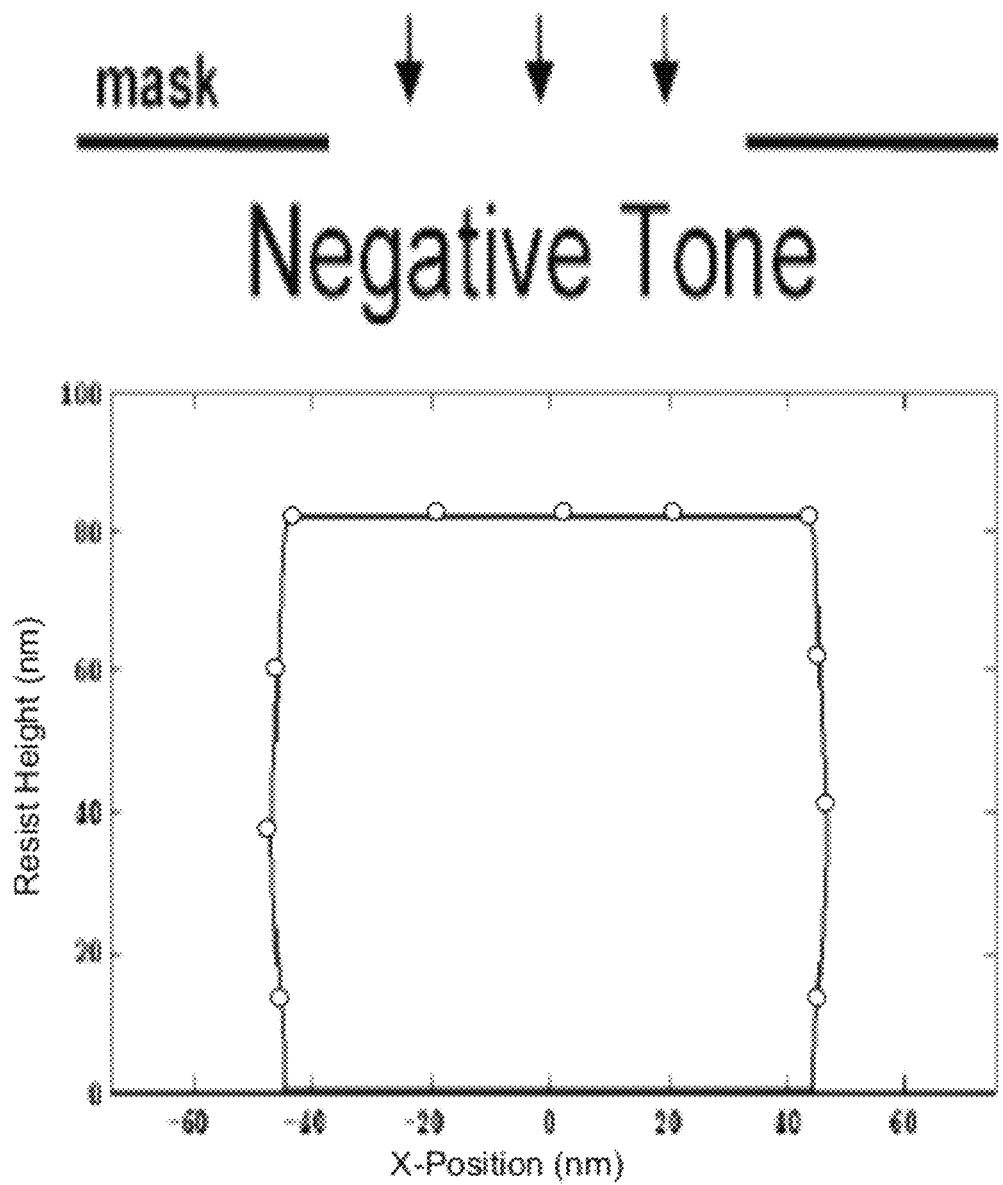
FIGS. 39A-39C illustrate a simplified view of a zero-order simulation technique in accordance with embodiments of the invention.
Figure 39B:
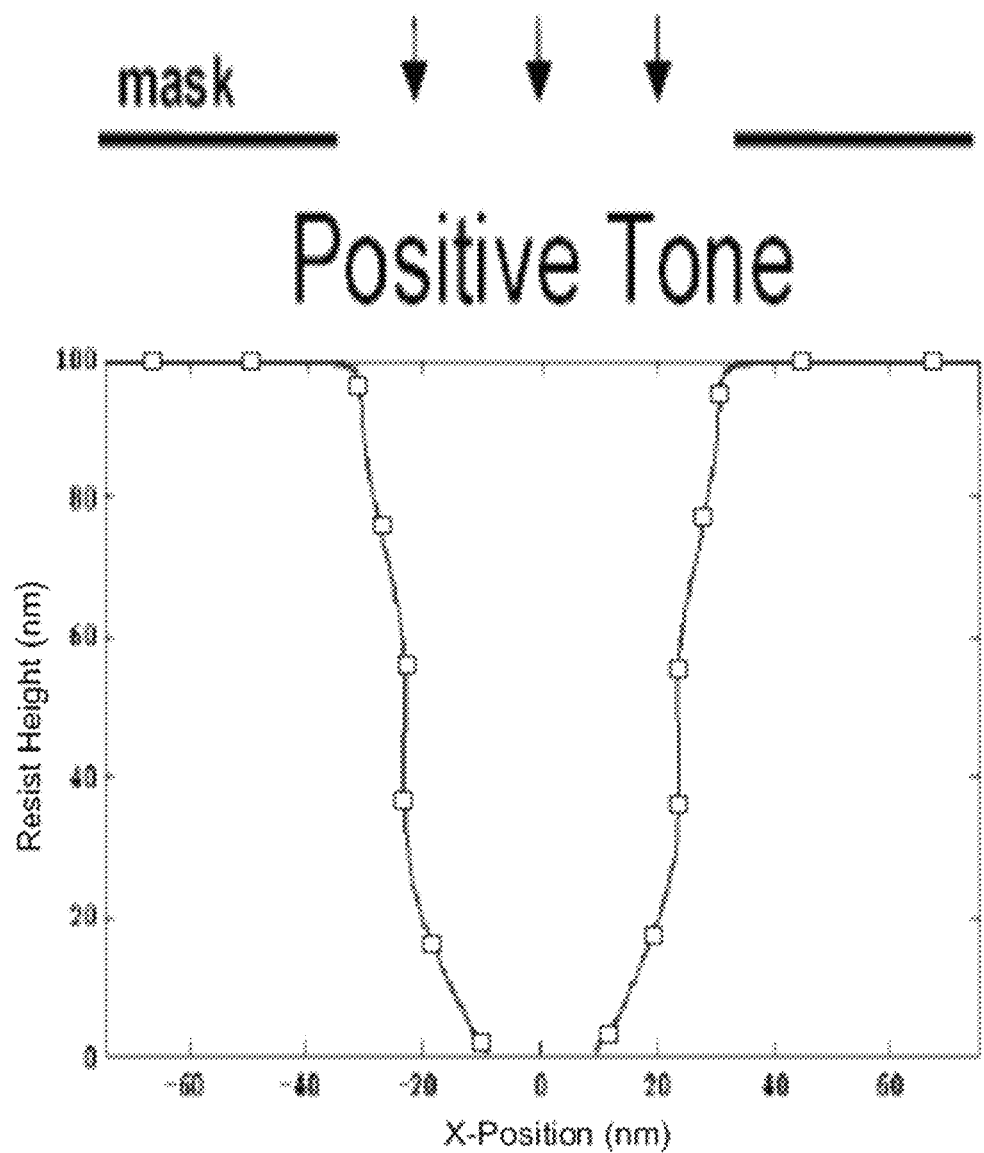
Figure 39C:
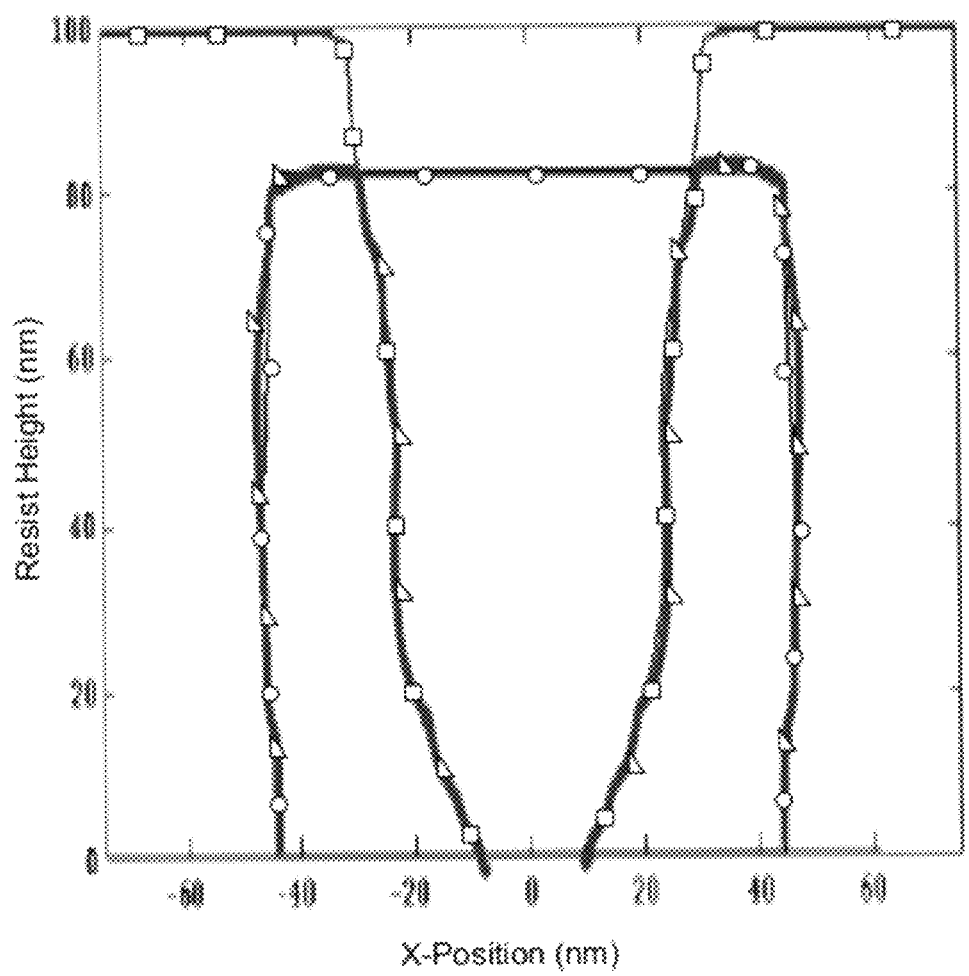

FIGS. 39A-39C illustrate a simplified view of a zero-order simulation technique in accordance with embodiments of the invention. FIG. 39A illustrates a first step in which a negative tone response is simulated. FIG. 39B illustrates a second step in which a positive tone response is simulated. FIG. 39C illustrates a third step in which the simulated negative tone response and the simulated positive tone response are combined.

In additional embodiments, the inventors have developed novel DT control strategies in which novel procedures, algorithms, and/or models are used to center a particular dual-tone development process by using experimental or simulated data. For example, the control strategy can include:

1) Measuring one or more CD responses versus PEB time/temperature, exposure dose, mask CD.

2) Creating one or more sensitivity maps (understand how wafer CD changes with PEB, mask CD, and exposure dose).

3) Expanding the process window parameters to include an expanded set of parameters that provide added information and can go beyond the typical PEB, mask CD, and dose variables.

The control strategies provide algorithmic-based procedures that can be used by a process engineer to center a given dual-tone process with whatever adjustable/control parameters are available to the process engineer.

Figure 40A:
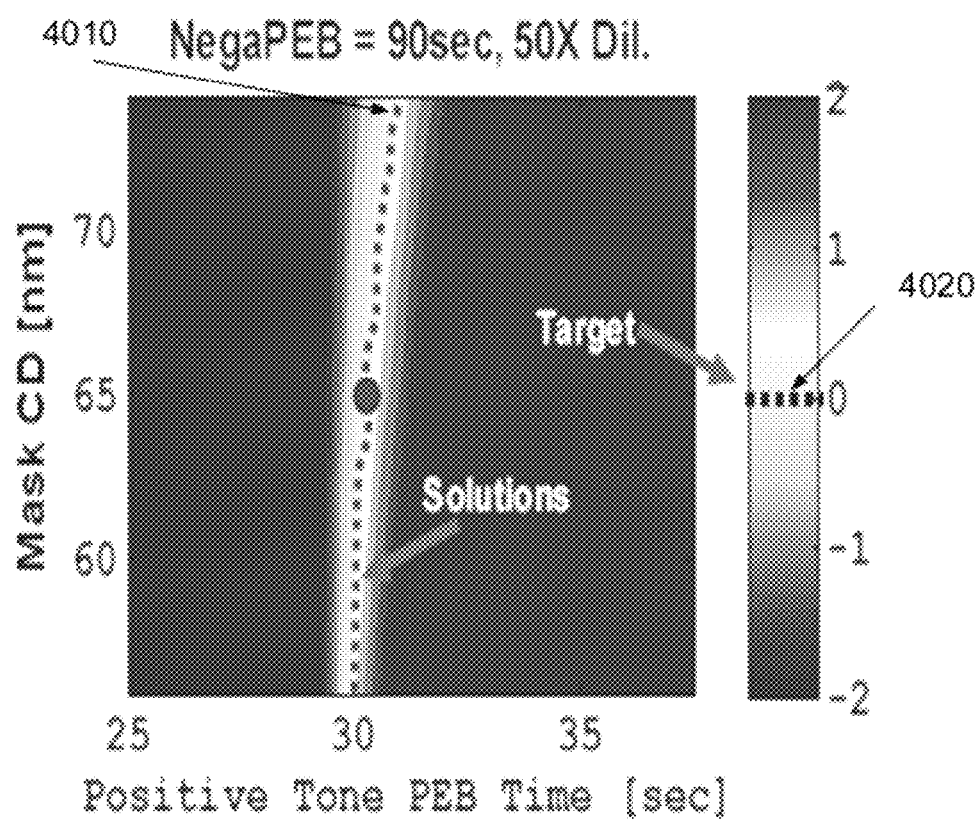
FIG. 40A and FIG. 40B illustrate a simplified view of a process centering technique in accordance with embodiments of the invention.
Figure 40B:
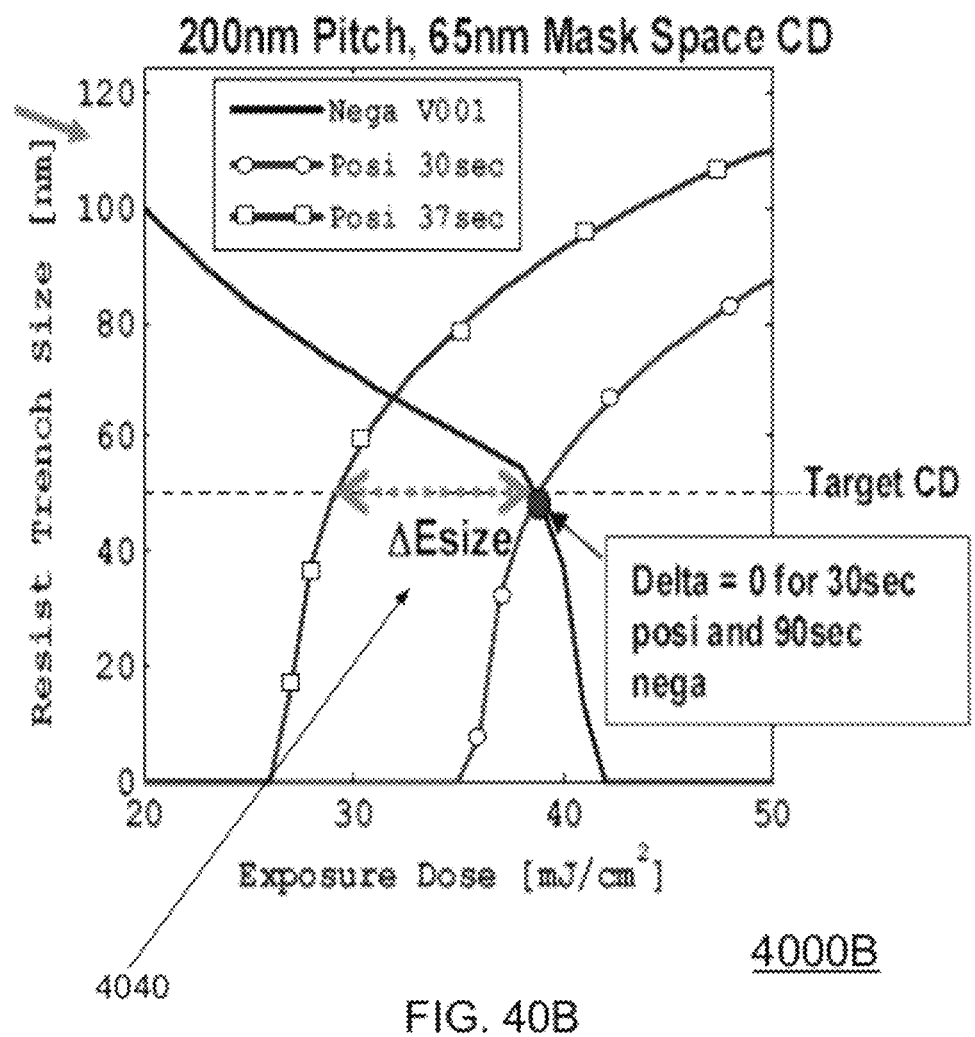

FIG. 40A and FIG. 40B illustrate a simplified view of a process centering technique in accordance with embodiments of the invention. FIG. 40A illustrates a graph 4000A that shows how the mask CD (nm) varies with respect to the positive tone PEB time (sec). FIG. 40B illustrates a graph 4000B that shows how the resist trench size (nm) varies with respect to the exposure dose (mJ/cm$^2$). The metric (4040) used in this centering technique is ($\Delta E_{size}$) is shown in 4000B. The graphs (4000A and 4000B) can be generated using experimental and/or simulated data. The solutions 4010 and the target 4020 are shown in 4000A.

In some other embodiments, the inventors have developed negative tone developer dilution techniques to use for dual-tone development (DTD). The inventors believe that specialized hardware and/or software can be developed to perform the proper developer dilution for the negative tone development process. The inventors believe that the chemicals used (developer and rinse chemicals) can be used in conjunction with other chemicals to create a range of diluted negative tone developers.

The exemplary developer dilution techniques can include:

1) Using two or more chemicals to make a diluted negative tone developer;

2) Using esters based chemicals (such as those currently available from FUJIFILM CORPORATION);

3) For a given class of negative tone developer, the inventors can create maps and/or tables for the different ranges of dilution possibilities, and then use the maps and/or tables to create the correct dilution.

The inventors believe there will be several solutions for the different dilution problems related to the different resist compositions and their solutions will include the dilution ranges that are necessary to make a better dual-tone process regardless of the resist composition. The reason for dilution of negative tone developer is to provide a better overlapped process with the positive tone process. Negative tone dilution is the most likely knob to use to tweak the negative tone process. There are other knobs that can be controlled for the positive tone development process.

Figure 41:
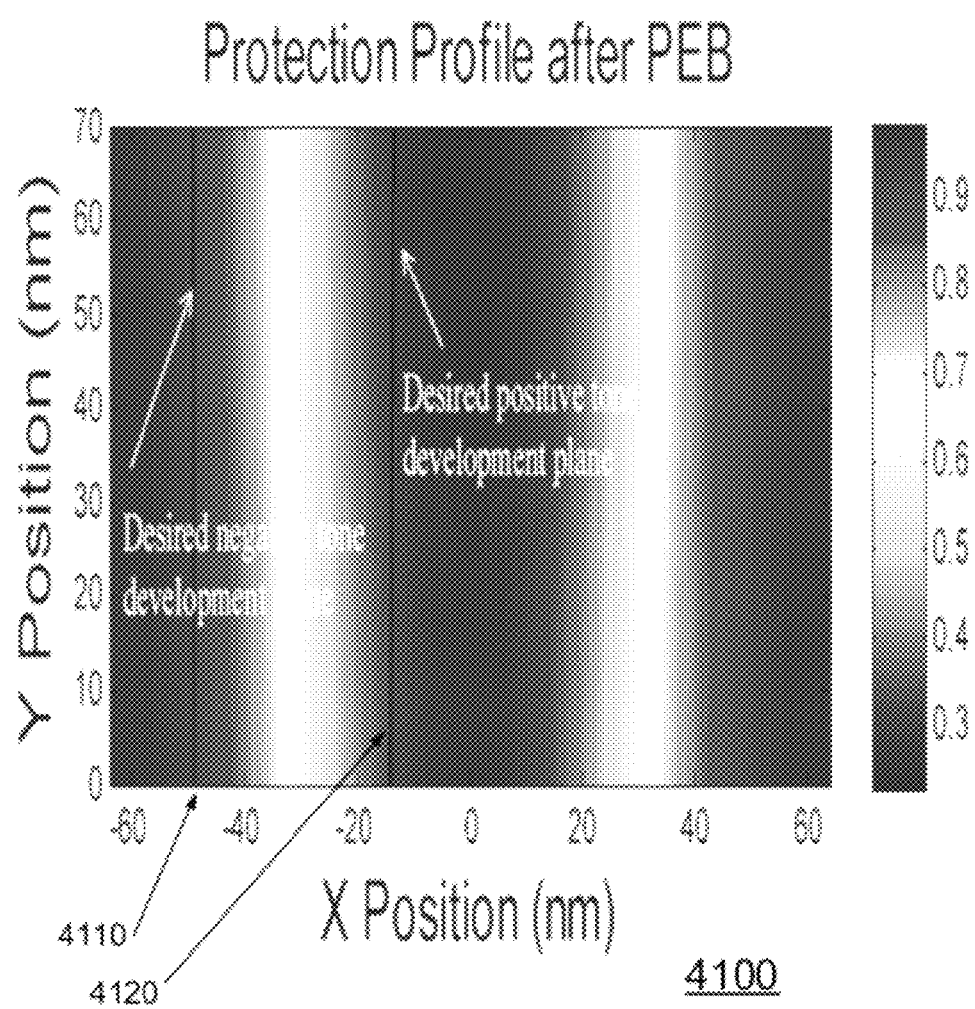
FIGS. 41-44 present additional exemplary data for patterning a substrate.
Figure 42:
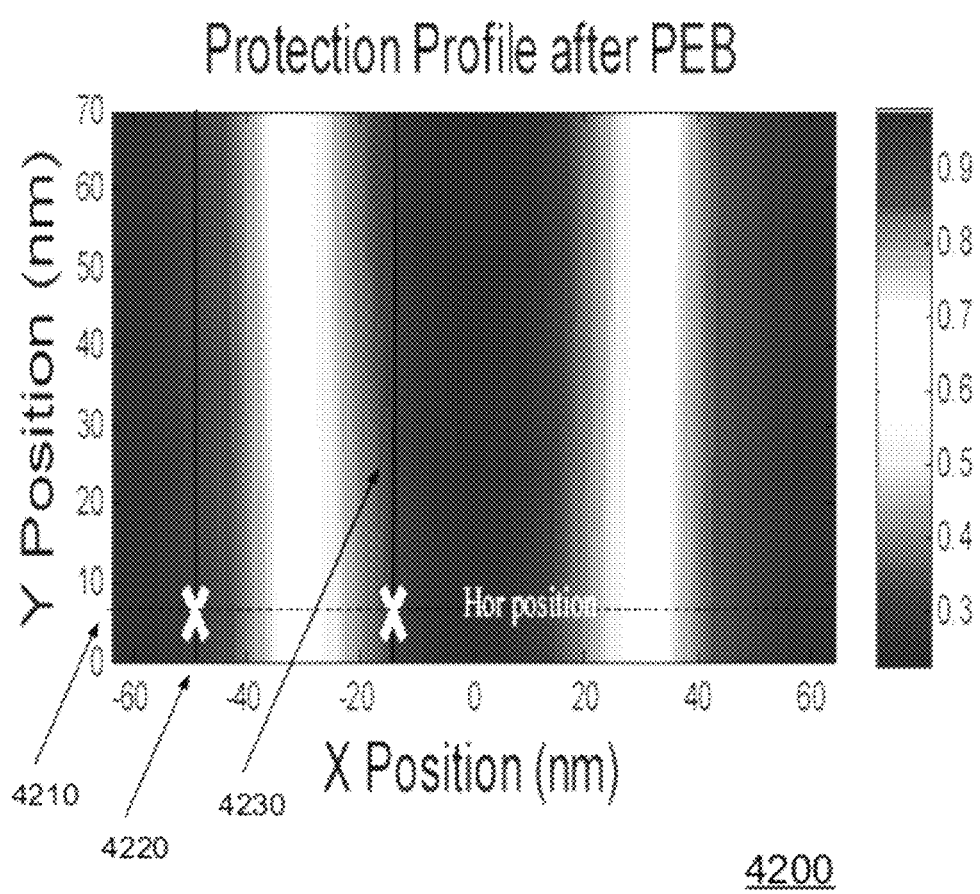
Figure 43:
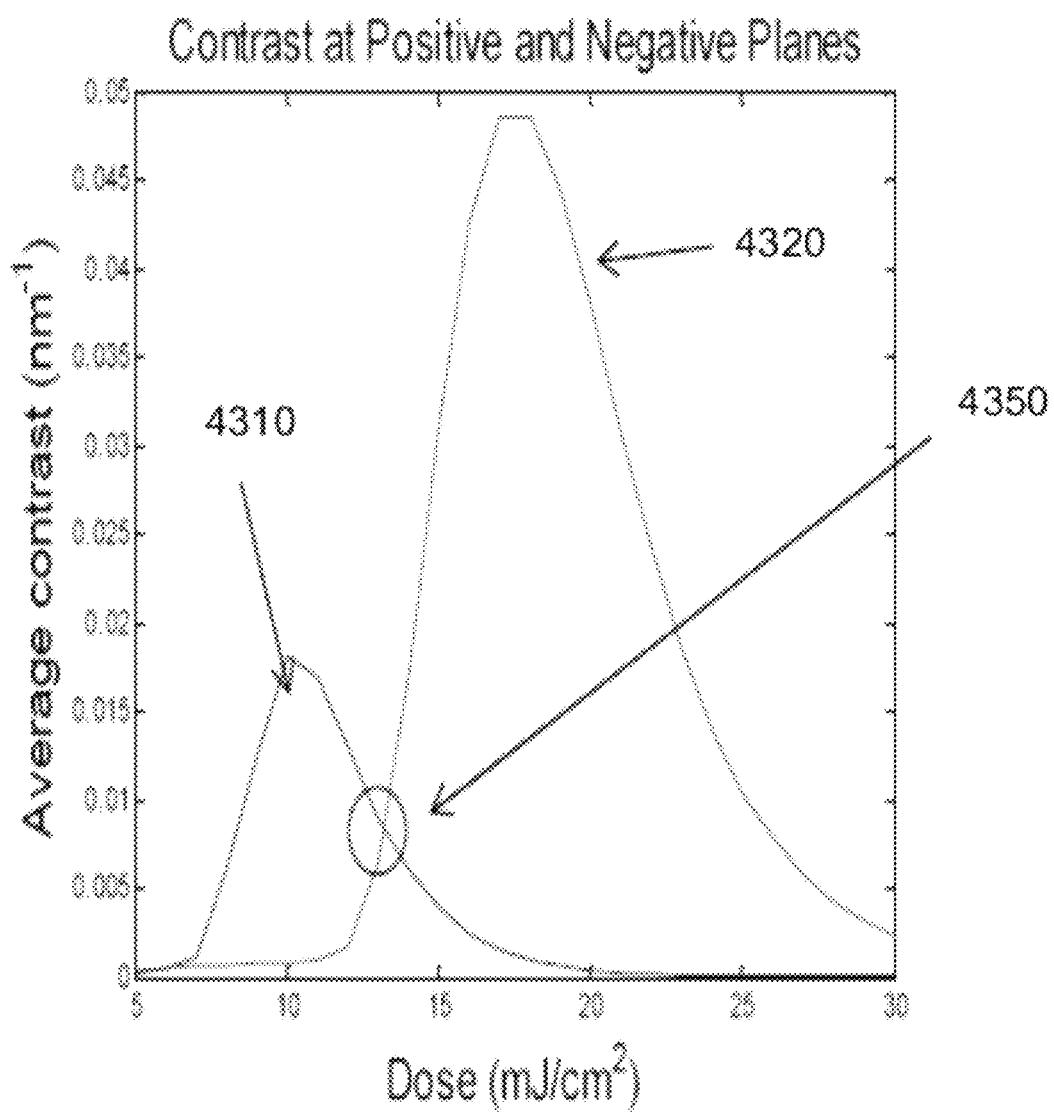

In still other embodiments, the inventors have developed novel dose determination methods for use in dual-tone double patterning. The nature of the dual-tone double patterning process means that a positive tone trench and a negative tone trench have to be printed with the same exposure dose. This means that mask/reticle, resist, and developer considerations must be balanced to get a positive tone and negative tone trench of the same CD (critical dimension) at the same dose. The inventors have determined an algorithm for determining the optimal dose given a set of circumstances. FIGS. 41-43 illustrate exemplary dose determination steps in accordance with embodiments of the invention.

1) Define critical planes for characterization of development threshold. One plane corresponds to the plane of positive tone development and the other to the plane of negative tone development. This plane can be equivalent to the resist feature edge (a zero bias process or can be positive or negative)

2) Cycle through exposure dose from low to high. Low dose can be around zero and high dose can be defined as a reasonable exposure dose for the tool set in question that would be determined by the user's circumstances.

3) At each plane of interest the gradient of polymer protection as a function of horizontal position is calculated. The inventors have developed techniques to calculate this data at some horizontal plane in the film, and this can be chosen by the user. Multiple planes may be used and averaged. This process is completed again at the negative tone plane of interest.

4) It is commonly understood that the best imaging is possible where the de-protection gradient is the steepest. The dual-tone procedure also needs the gradient at the positive and negative planes of interest to be steep at the same dose. "Steep" may be defined by the user. For example, if one development process is better than the other, then the user may determine that the de-protection gradient for that half of the process might be less steep than the opposite tone. The simplest manifestation is where equal weight is put on the positive and negative tone process. In this case, the dose to size will be the point where the difference between the positive and negative gradients is closest to zero. Alternatively, the ratio of the gradients may be used. In the case where the positive and negative tone processes are required to have equivalent gradients, the ratio will be one.

5) A similar algorithm may be used where the de-protection gradient is replaced by the gradient of development rate in the film as function of position in the film (the convolution of the de-protection gradient above with the development rate curve as a function of de-protection). The exact same analysis can be completed using development rate gradients instead of the de-protection rate 6) A similar algorithm may be used where the de-protection gradient is replaced by the gradient of the aerial image as a function of position.

FIG. 41 shows a protection profile 4100 that was established after PEB process. In step 1, the desired negative tone development plane 4110 and the desired positive tone development plane 4120 can be defined as critical planes. Next, the gradients can be co-optimized at these two critical planes (4110 and 4120). Then, threshold development procedures can be performed to determine if the DT image can be printed. Finally, the analysis can be move from threshold developers to real developers.

FIG. 42 shows another protection profile 4200 that was established in later process steps. For example, in these later steps, the gradient of de-protection can be calculated as a function of horizontal position in at least one horizontal plane 4210 and at the positive tone plane 4220 and negative tone plane 4230. Then, the calculations can be completed as function of dose.

FIG. 43 illustrates a graph 4300 that shows how the average contrast ($nm^{-1}$) varies with respect to the dose ($mJ/cm^2$). For example, the development processes can be prioritized to define the de-protection gradient that is desired for each (the ratio is a useful metric). FIG. 43 is used to illustrate a best dose condition in which equal weight is placed on positive and negative development (ratio of two gradients is 1 or the difference is zero). The graph 4300 includes a positive contrast curve 4310, a negative contrast curve 4320, and a crossover point 4350. For example, the crossover point 4350 represents an equal balance between the positive contrast curve 4310 and the negative contrast curve 4320, and the crossover point 4350 can be used to define a dose value.

Figure 44:
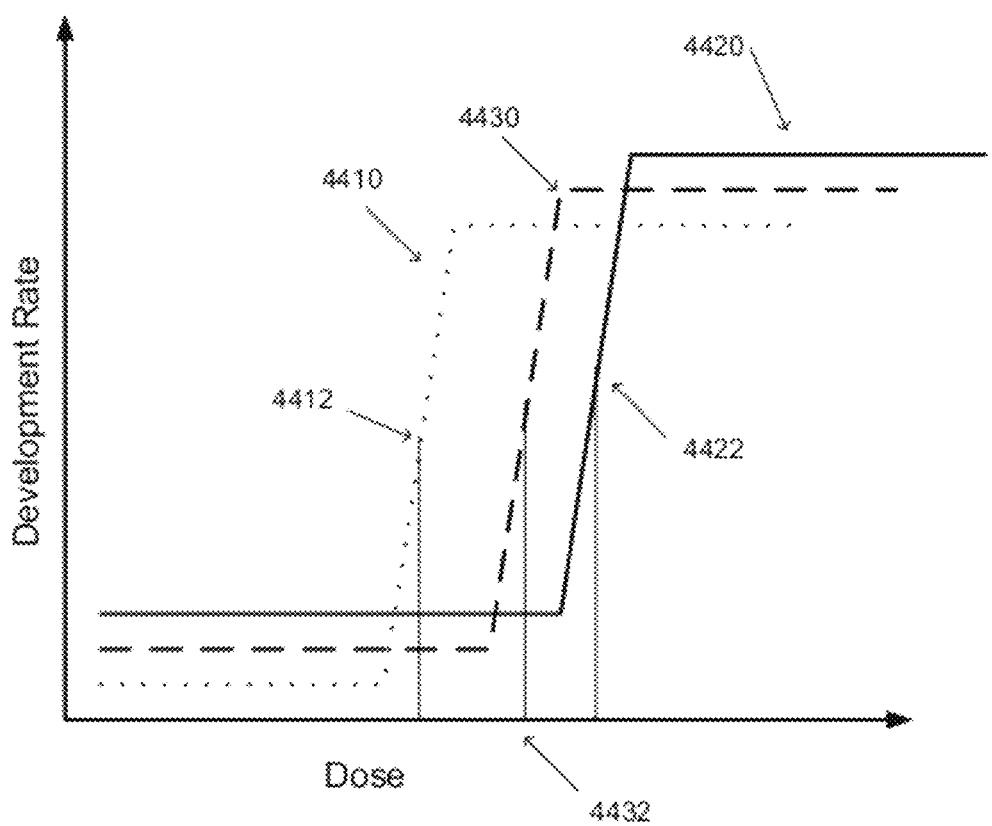

In additional embodiments, the inventors have developed novel procedures for using different acid functionalities for threshold control. FIG. 44 illustrates a simplified view of a threshold control technique in accordance with embodiments of the invention.

As described herein, a DT resist may include a backbone polymer with multiple protecting groups that have different reaction rates that can be used to control de-protection for the positive and negative tone. The inventors believe that this scheme provides for a novel method to manipulate the positive tone and negative tone development thresholds.

When there is at least one acidic species in the film, the development rates for polymers in an aqueous base can be dependent on one or more of the acidic functionalities. In 248 nm resists, it can be a phenolic group. In 193 nm resists, it can be a carboxylic acid or hexafluoroisopropanol group. If more than one acidic functionality can be used, the threshold for development can be manipulated.

FIG. 44 illustrates a graph 4400 that shows how the development rate varies with respect to the dose ($mJ/cm^2$). The first curve 4410 shows a first dissolution rate as a function of dose for a first protected polymer, and the second curve 4420 shows a second dissolution rate as a function of dose for a second protected polymer. The curves (4410 and 4420) represent the increase in dissolution rate as a function of dose for two different protected polymers having two different functionalities (when de-protected). Because they have different acidic functionalities, they turn on at different thresholds (4412 and 4422). A third curve 4430 is shown which represents making a copolymer that has both of the acidic functionalities. This copolymer's behavior can have an "average" behavior and so turns on at a third threshold 4432.

In the DTD process, the positive and negative development thresholds can be matched with vertical planes in the resist that correspond to the desired critical dimension. For example, a copolymer can have (x) percentage of one protected acidic functionality A, and (y) percentage of a different acidic functionality B. If the threshold is not lined up with the plane that gives the right CD, the feature will be off target. One way to resolve this issue would be to reformulate the resist to have the copolymer ratio of A and B so that the threshold can be shifted to the correct location that will give the correct CD. This same concept can be applied to blended homopolymers of A and B (instead of a copolymer containing the two functionalities on the same chain.)

FIG. 45 illustrates another simplified flow diagram for a method of patterning a substrate in accordance with embodiments of the invention. During procedure 4500, one or more substrates can be positioned on one or more substrate holders in one or more processing chambers for one or more lengths of time.

In 4510, a layer of radiation-sensitive material can be formed on at least one substrate, and the layer of radiation-sensitive material can include a resist material having polymer backbone, a plurality of radiation-sensitive positive tone groups attached to the polymer backbone and a plurality of radiation-sensitive negative tone groups attached to the polymer backbone. Alternatively, non-radiation-sensitive groups may be used.

In 4520, a first patterned layer of exposed radiation-sensitive material can be created by exposing the layer of radiation-sensitive material using first EM radiation and a reticle having a plurality of masking features. For example, the first patterned layer of exposed radiation-sensitive material can be heated to create a plurality of high exposure (intensity) regions that can include a high concentration of de-protected positive tone groups, a plurality of medium exposure (intensity) regions that can include a smaller concentration of de-protected positive tone groups, a plurality of low exposure (intensity) regions that can include a very low concentration of de-protected positive tone groups.

In 4530, a first threshold profile can be determined for a first dual-tone development procedure for the first patterned layer of exposed and heated radiation-sensitive material. In some examples, the first threshold profile can be established for the positive tone groups. In other examples, the first threshold profile can be established for the negative tone groups. In addition, the first dual-tone development procedure can include at least one positive tone development procedure and at least one negative tone development procedure.

During the first dual-tone development procedure at least one positive tone threshold and/or at least one negative tone threshold can be determined. In some embodiments, one or more response curves can be measured, calculated, and/or simulated, and the response curves can include at least one of exposure data, heating data, intensity data, concentration data, protecting group data, polymer data, de-protection data, temperature data, radiation data, positive tone data, and negative tone data.

In 4540, a first set of simulated (predicted) limits can be determined for the first dual-tone development procedure. For example, the first dual-tone development procedure can be simulated and can include at least one set of simulated (predicted) positive tone development limits and at least one set of simulated (predicted) negative tone development limits. In addition, during the first dual-tone development procedure at least one positive tone limit and/or at least one negative tone limit can be determined.

In 4550, the first threshold profile can be modified, if the first threshold profile exceeds at least one of the first set of simulated (predicted) limits. For example, one or more additional positive tone groups in the resist material in the first patterned layer can be de-protected during the modifying.

In 4560, the first patterned layer of exposed radiation-sensitive material can be developed, if the first threshold profile does not exceed one or more of the first set of simulated (predicted) limits.

In various embodiments, the reticle can include at least one of a phase-shift mask, a tri-tone mask, and a half-tone mask. In addition, the half-tone mask can include at least one of a sub-resolution pitch, a sub-resolution size, and a mask edge spacing. In addition, the masking features can include line features, some of which may be periodic, array features, some of which may be periodic, via features, some of which may be periodic, and resolution enhancement features.

Furthermore, the positive tone group or the negative tone group can be de-protected using at least one of thermal energy, optical energy, RF energy, DC energy, AC energy, UV energy, EUV energy, IR energy, chemical species, liquid, and a gas. In addition, the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

In some embodiments, when the first patterned layer is being developed, the procedure can include: performing a positive development procedure to remove one or more of the high exposure (intensity) regions from the substrate using a first de-protection energy, and a first chemistry; and performing a negative development procedure to remove one or more of the low exposure (intensity) regions from the substrate using a second de-protection energy, and a second chemistry. In addition, the second de-protection energy can be higher than the first de-protection energy. During some procedures, a first post-exposure bake (PEB) of the substrate can be performed to heat the substrate after exposing the layer of radiation-sensitive material using the first EM radiation. In addition, one or more post application bake (PAB) procedures may also be performed.

In alternate embodiments, when the first patterned layer is being developed, the procedure can include: performing a negative development procedure to remove one or more of the high exposure (intensity) regions from the substrate using a first de-protection energy, and/or a first chemistry; and performing a positive development procedure to remove one or more of the low exposure (intensity) regions from the substrate using a second de-protection energy, and a second chemistry.

In some embodiments, when the first threshold profile is being modified, the procedure can include: determining a first difference between the first threshold profile and a first limit; and applying additional thermal de-protection energy (heat) to resist material in the first patterned layer to de-protect at least one additional group, thereby creating a first modified resist material. For example, the additional thermal de-protection energy (heat) can be determined using at least one of the first difference, the polymer backbone, a first number of positive tone groups, and a second number of negative tone groups. In addition, the first modified resist material can include the polymer backbone and a different number of protecting groups.

In other embodiments, when the first threshold profile is being modified, the procedure can include: determining a first difference between the first threshold profile and a first limit; and applying first optical signal power to resist material in the first patterned layer to de-protect at least one additional group, thereby creating a first modified resist material, and the first optical signal power can be determined using at least one of the first difference, the polymer backbone, a first number of positive tone groups, and a second number of negative tone groups. In addition, the first modified resist material can include the polymer backbone and a different number of protecting groups.

For example, the first optical signal power can be provided by at least one of a single frequency source, multiple frequency source, a coherent source, a non-coherent source, a broadband source, a UV source, a EUV source, an IR source, a flood exposure source, and a visible light source.

In some other embodiments, when the first threshold profile is being modified, the procedure can include: determining a first difference between the first threshold profile and a first limit; and applying a first chemical solution to resist material in the first patterned layer to de-protect at least one additional group, thereby creating a first modified resist material. For example, the first chemical solution can be determined using at least one of the first difference, the polymer backbone, a first number of positive tone groups, and a second number of negative tone groups. In addition, the first modified resist material can include the polymer backbone and a different number of protecting groups.

For example, the first chemical solution includes at least one of a developing solution (TMAH), a modified developing solution (TMAH and water), a de-blocking group, a de-protection group, a de-coupling group, and a cleaving group.

In still other embodiments, when the first patterned layer is being developed, the procedure can include: performing a positive development procedure to remove one or more of the high exposure (intensity) regions from the substrate using a first chemistry, a first de-protecting group, and a first de-protection energy, and a first patterned layer of first modified resist material can be created; determining a second threshold profile for a second dual-tone procedure; de-protecting at least one of the negative tone groups in the first modified resist material to create a second modified resist material and to modify the second threshold profile, if the second threshold profile exceeds a second limit, and the second modified resist material can have the polymer backbone and a second number of protecting groups; and performing a negative development procedure to remove one or more of the low exposure (intensity) regions from the substrate using a second chemistry, and a third patterned layer can be created that can include developed second modified resist material, if the second threshold profile does not exceed the second limit.

In other alternate embodiments, when the first patterned layer is being developed, the procedure can include: performing a negative development procedure to remove one or more of the high exposure (intensity) regions from the substrate using a first chemistry, a first de-protection group, and a first de-protection energy, and a first patterned layer of first modified resist material is created; determining a second threshold profile for a second dual-tone development procedure; de-protecting a second de-protection group in the first modified resist material to create a second modified resist material and to modify the second threshold profile, if the second threshold profile exceeds a second simulated limit, and the second modified resist material has the polymer backbone and a second number of de-protected groups; and performing a positive development procedure to remove one or more of the low exposure (intensity) regions from the substrate using a second chemistry, and a third patterned layer can be created that can include developed second modified resist material, if the second threshold profile does not exceed the second limit.

In some processing sequences, a protection layer can be deposited on top of the layer of radiation-sensitive material and the substrate, and the protection layer can be substantially transparent to the first EM radiation. In other processing sequences, an interface layer can be deposited between the layer of radiation-sensitive material and the substrate, and the interface layer can be substantially opaque to the first EM radiation. In addition, the protection layer and/or the interface layer can include an antireflective coating (ARC) material, a bottom antireflective coating (BARC) material, a top antireflective coating (TARC) material, a photo-active acid, a photo-active base, a de-blocking group, a de-protecting group, a leaving group, or an activation group, or any combination thereof. In additional processing sequences both layers may be used.

When a semiconductor processing system is configured to pattern a substrate, the semiconductor processing system can include: a lithography system can be configured to form a layer of radiation-sensitive material on the substrate, and the layer of radiation-sensitive material can include a resist material having a polymer backbone, a plurality of positive tone groups, and a plurality of negative tone groups; an exposure system can be configured to create a first patterned layer of exposed radiation-sensitive material by exposing the layer of radiation-sensitive material using first EM radiation and a reticle/mask having a plurality of masking features, and the lithography system can heat the first patterned layer of exposed radiation-sensitive material to create a plurality of high exposure (intensity) regions, a plurality of medium exposure (intensity) regions, a plurality of low exposure (intensity) regions, and the exposure system can be coupled to the lithography system; and a computer system can be configured to determine a first threshold profile for a first dual-tone development procedure for the first patterned layer of exposed radiation-sensitive material and can be configured to determine a first set of simulated (predicted) limits for the first dual-tone development procedure, and the computer system can be coupled to the exposure system and the lithography system. The lithography system can be configured to de-protect a first protected group in the resist material in the first patterned layer of exposed radiation-sensitive material to modify the first threshold profile if the first threshold profile exceeds one or more of the first set of simulated (predicted) limits, and can be further configured to develop the first patterned layer of exposed radiation-sensitive material if the first threshold profile does not exceed at least one of the first set of simulated (predicted) limits.

When a computer readable medium is configured for the semiconductor processing system, the computer readable medium can contain program instructions for execution on a computer system coupled to a semiconductor processing system, which when executed by the computer system, cause the semiconductor processing system to perform a process, that can include: forming a layer of radiation-sensitive material on the substrate, and the layer of radiation-sensitive material can include a resist material having a polymer backbone, a plurality of positive tone groups, and a plurality of negative tone groups; creating a first patterned layer of exposed radiation-sensitive material by exposing the layer of radiation-sensitive material using first EM radiation and a mask/reticle having a plurality of periodic features, and heating the first patterned layer of exposed radiation-sensitive material to create a plurality of high exposure (intensity) regions, a plurality of medium exposure (intensity) regions, a plurality of low exposure (intensity) regions; determining a first threshold profile for a first dual-tone positive tone development procedure for the first patterned layer of exposed radiation-sensitive material; de-protecting a first protected group in the resist material in the first patterned layer of exposed radiation-sensitive material to modify the first threshold profile if the first threshold profile exceeds one or more of a first set of simulated (predicted) limits; and developing the first patterned layer, if the first threshold profile does not exceed at least one of the first set of simulated (predicted) limits.

FIGS. 46A, 46B, 47A, and 47B illustrate a simplified view of methods for correcting patterned substrates in accordance with embodiments of the invention. The first incorrectly patterned substrate 4600 illustrated in FIG. 46A includes a substrate layer 4605, an interface layer 4607, a plurality of first space regions 4615, and a plurality of line features 4620. The substrate layer 4605 can include semiconductor material, dielectric material, glass material, metallic material, or isolating material, or any combination thereof. The interface layer 4607 can include ARC material, BARC material, TARC material, or isolating material, or any combination thereof.

In some examples, the first space regions 4615 can be identified as high exposure regions in which the material was removed during positive-tone development procedures. Alternatively, the first space regions 4615 can be identified as low exposure regions in which the material was removed during negative-tone development procedures.

The first line features 4620 can have first positive edges (4618 and 4619) associated therewith. Alternatively, the first line features 4620 may have negative edges associated therewith.

For example, the first line features 4620 can have at least one incorrectly created threshold line 4629 that can be associated with a negative tone development procedure. Alternatively, the at least one incorrectly created threshold line 4629 may be associated with a positive tone development procedure. In addition, the first line features 4620 can have a first target CD 4665 associated therewith. For example, the incorrectly created threshold line 4629 can cause profile, CD, and/or sidewall angle problems to occur in the subsequence developing procedures.

In some examples, the first space regions 4615 can be formed using two positive edges (4618 and 4619). Alternatively, the first space region 4615 may be formed using two negative edges. Both edges (4618 and 4619) of the first space regions 4615 can be defined by a first development process.

Figure 46A:
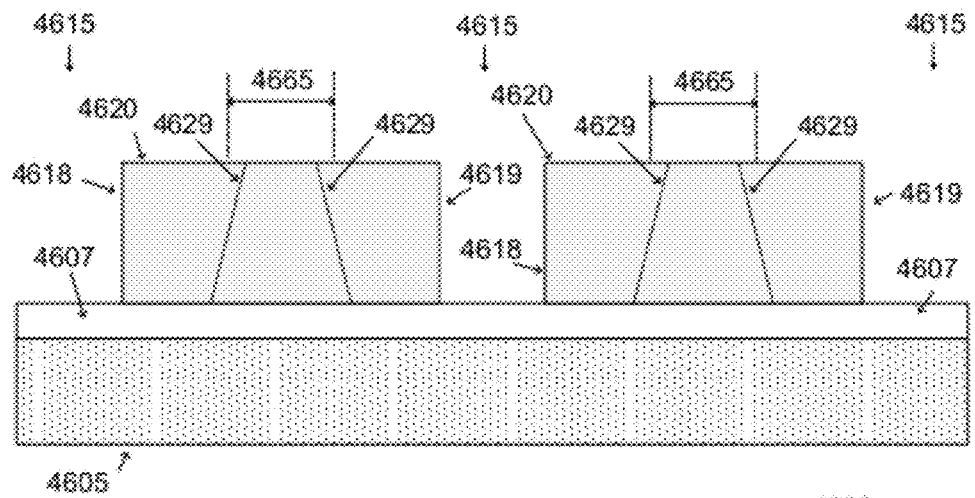
FIGS. 46A, 46B, 47A, and 47B illustrate a simplified view of methods for correcting patterned substrates in accordance with embodiments of the invention.
Figure 46B:
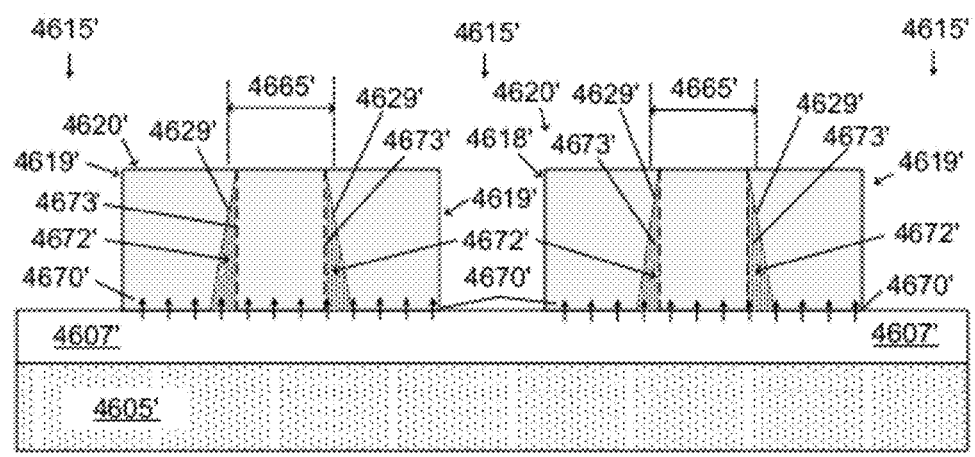

FIG. 46B illustrates a first correction procedure for an incorrectly processed substrate 4600'. The incorrectly processed substrate 4600' includes a substrate layer 4605', an interface layer 4607', a plurality of first space regions 4615', and a plurality of incorrectly formed line features 4620'. The substrate layer 4605' can include semiconductor material, dielectric material, glass material, metallic material, or isolating material, or any combination thereof. The interface layer 4607' can include ARC material, BARC material, TARC material, or isolating material, or any combination thereof.

The first incorrectly formed line features 4620' can have at least one incorrectly created threshold line 4629' that can be associated with a negative tone development procedure. Alternatively, the at least one incorrectly created threshold line 4629' may be associated with a positive tone development procedure. In addition, the first incorrectly formed line features 4620' can have a first target CD 4665' associated therewith.

In some examples, the first space regions 4615' can be identified as high exposure regions in which the material was removed during positive-tone development procedures. Alternatively, the first space regions 4615' may be identified as low exposure regions in which the material was removed during negative-tone development procedures. In addition, the first space regions 4615' can be formed using two positive edges (4618' and 4619'). Alternatively, the first space region 4615' may be formed using two negative edges. Both edges (4618' and 4619') of the first space regions 4615' can be defined by a first development process.

The incorrectly formed line features 4620' being corrected can have at least one "corrected" threshold line 4673' that can be associated with a negative tone development procedure and at least one correction region 4672' that was created using the flow 4670'. Alternatively, the corrected threshold line 4673' may be associated with a positive tone development procedure. In addition, the line features 4620' being corrected can have a first target CD 4665' associated therewith.

In some prevention procedures, one or more components can initiate flow 4670' out of the interface layer 4607' into the resist material in the incorrectly formed line features 4620'. For example, the components can initiate a de-protection process in the resist material, can initiate a de-blocking process in the resist material, can initiate an acid generation process in the resist material, and/or can initiate a base generation process in the resist material. The flow 4670' can be initiated by a thermal process, by an EM radiation process, by an optical process, by a rinsing process, by a polymer activation process, or by a polymer de-activation process, or any combination thereof. In addition, the components can include an acid, a base, gasses, liquids, surfactants, polymers, blocking groups, de-blocking groups, leaving groups, de-protecting groups, or protecting groups, or any combination thereof.

Figure 47A:
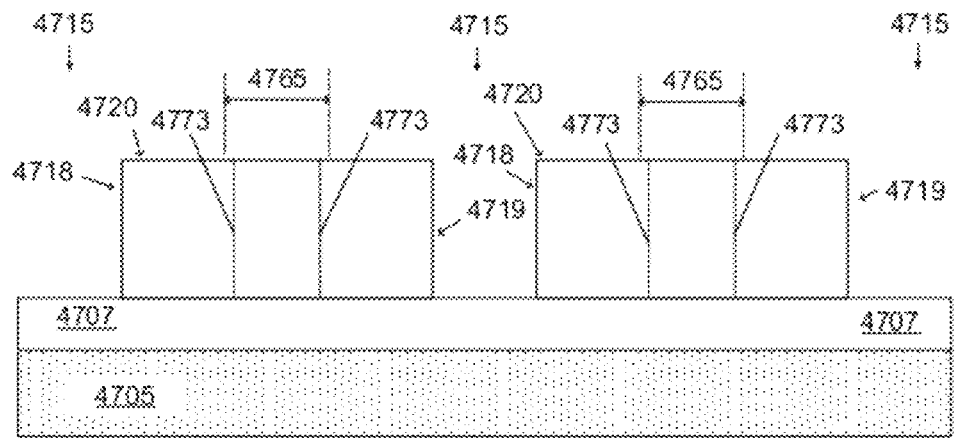
Figure 47B:
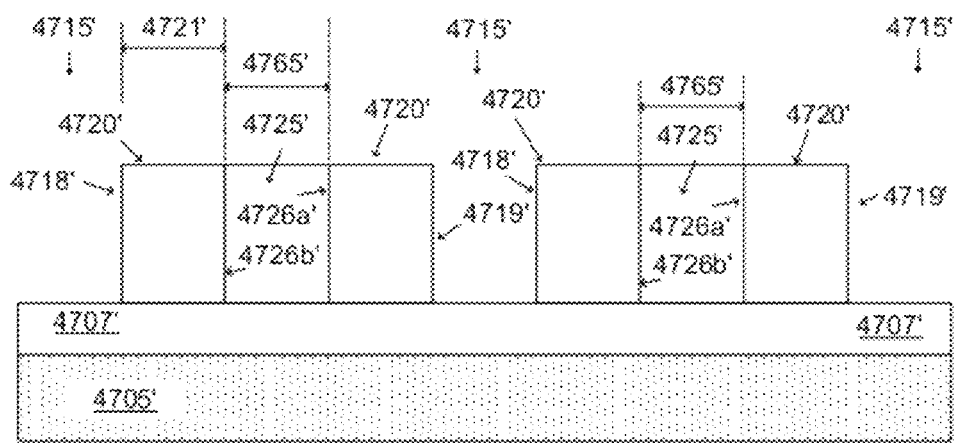

FIG. 47A and FIG. 47B illustrate additional procedures for preventing incorrectly patterned substrates in accordance with embodiments of the invention. A simplified view of a third patterned substrate 4700 is shown in FIG. 47A, and the illustrated embodiment shown in FIG. 47A can include a substrate layer 4705, an interface layer 4707, a plurality of first space regions 4715, and a plurality of corrected line features 4720. The substrate layer 4705 can include semiconductor material, dielectric material, glass material, metallic material, or isolating material, or any combination thereof. The interface layer 4707 can include ARC material, BARC material, TARC material, or isolating material, or any combination thereof.

In some examples, the first space regions 4715 can be identified as high exposure regions in which the material was removed during positive-tone development procedures. Alternatively, the first space regions 4715 may be identified as low exposure regions in which the material was removed during negative-tone development procedures. In addition, the first space regions 4715 can be formed using two positive edges (4718 and 4719). Alternatively, the first space region 4715 may be formed using two negative edges. Both edges (4718 and 4719) of the first space regions 4715 can be defined by a first development process.

The corrected line features 4720 can have at least one corrected threshold line 4773 that can be associated with a negative tone development procedure. Alternatively, the corrected threshold line 4773 may be associated with a positive tone development procedure. In addition, the corrected line features 4720 can have a first target CD 4765 associated therewith.

A simplified view of a fourth substrate 4700' is shown in FIG. 47B, and the illustrated embodiment shown in FIG. 47B can include a substrate layer 4705', an interface layer 4707', a plurality of first space regions 4715', a plurality of correctly created second line features 4720', and a plurality of correctly created second space regions 4725'. In addition, each correctly created line feature 4720' can have a correct CD (4721') associated therewith, and each correctly created second space region 4725' can have a correct CD (4765') associated therewith. The substrate layer 4705' can include semiconductor material, dielectric material, glass material, metallic material, or isolating material, or any combination thereof. The interface layer 4707' can include ARC material, BARC material, TARC material, or isolating material, or any combination thereof.

In some examples, the first space regions 4715' can be identified as high exposure regions in which the material was removed during positive-tone development procedures. Alternatively, the first space regions 4715' may be identified as low exposure regions in which the material was removed during negative-tone development procedures. In addition, the first space regions 4715' can be formed using two positive edges (4718' and 4719'). Alternatively, the first space region 4715' may be formed using two negative edges. Both edges (4718' and 4719') of the first space regions 4715' can be defined by a first development process.

In other examples, the correctly created second space regions 4725' can be identified as low exposure regions in which the material was removed during negative-tone development procedures. Alternatively, the correctly created second space regions 4725' may be identified as high exposure regions in which the material was removed during positive-tone development procedures. In addition, the correctly created second space regions 4725' can be formed using two positive edges (4726a' and 4726b'). Alternatively, the correctly created second space regions 4725' may be formed using two negative edges. Both edges (4726a' and 4726b') of the correctly created second space regions 4725' can be defined by a second development process.

FIGS. 48A, 48B, 49A, and 49B illustrate a simplified view of additional methods for correcting patterned substrates in accordance with embodiments of the invention. The first incorrectly patterned substrate 4800 illustrated in FIG. 48A includes a substrate layer 4805, an interface layer 4807, a protection layer 4809, a plurality of first space regions 4815, and a plurality of line features 4820. The substrate layer 4805 can include semiconductor material, dielectric material, glass material, metallic material, or isolating material, or any combination thereof. The interface layer 4807 and/or the protection layer 4809 can include ARC material, BARC material, TARC material, or isolating material, or any combination thereof.

In some examples, the first space regions 4815 can be identified as high exposure regions in which the material was removed during positive-tone development procedures. Alternatively, the first space regions 4815 can be identified as low exposure regions in which the material was removed during negative-tone development procedures.

The first line features 4820 can have first positive edges (4818 and 4819) associated therewith. Alternatively, the first line features 4820 may have negative edges associated therewith.

For example, the first line features 4820 can have at least one incorrectly created threshold line 4829 that can be associated with a negative tone development procedure. Alternatively, the at least one incorrectly created threshold line 4829 may be associated with a positive tone development procedure. In addition, the first line features 4820 can have a first target CD 4865 associated therewith. For example, the incorrectly created threshold line 4829 can cause profile, CD, and/or sidewall angle problems to occur in the subsequence developing procedures.

In some examples, the first space regions 4815 can be formed using two positive edges (4818 and 4819). Alternatively, the first space region 4815 may be formed using two negative edges. Both edges (4818 and 4819) of the first space regions 4815 can be defined by a first development process.

Figure 48A:
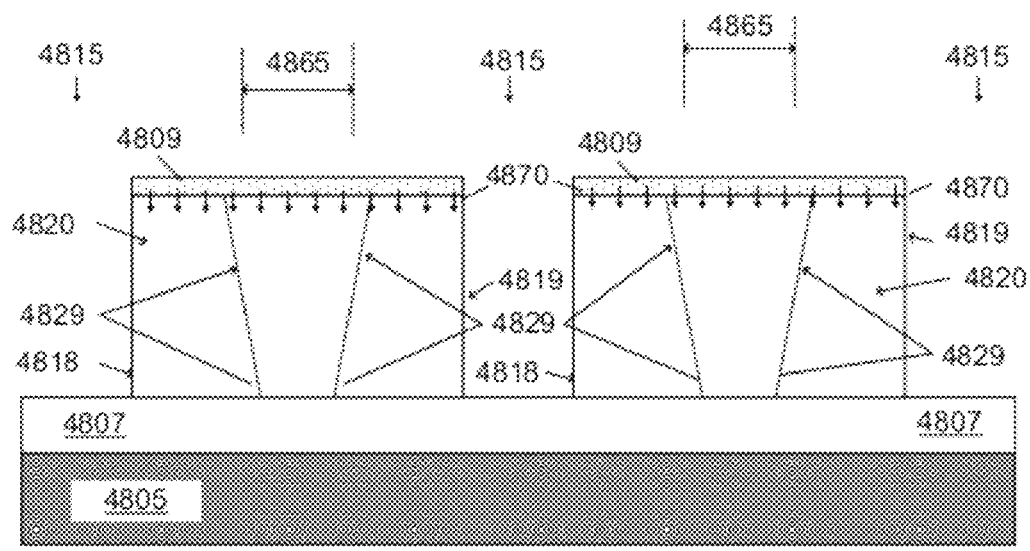
FIGS. 48A, 48B, 49A, and 49B illustrate a simplified view of additional methods for correcting patterned substrates in accordance with embodiments of the invention.
Figure 48B:
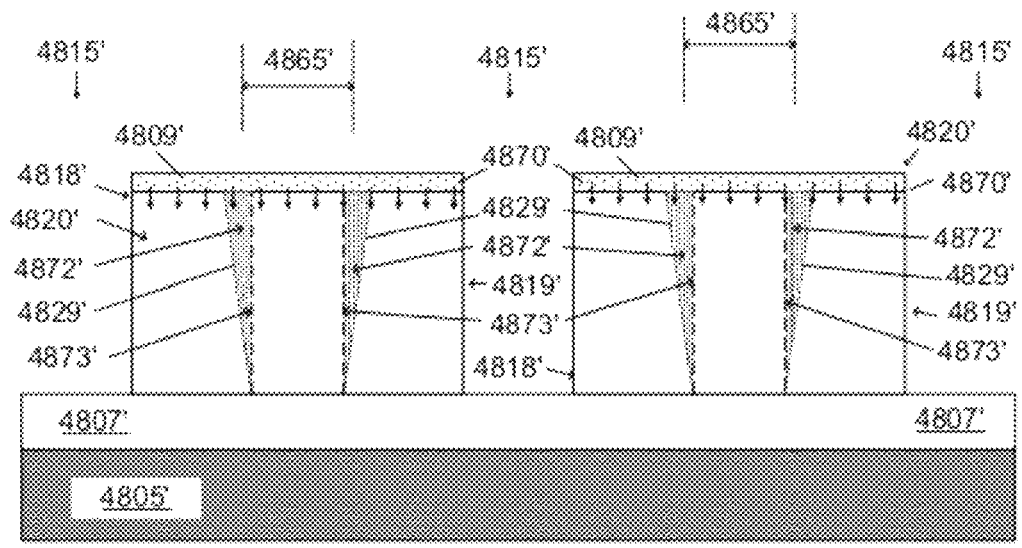

FIG. 48B illustrates a first correction procedure for an incorrectly processed substrate 4800'. The incorrectly processed substrate 4800' includes a substrate layer 4805', an interface layer 4807', a protection layer 4809', a plurality of first space regions 4815', and a plurality of incorrect line features 4820'. The substrate layer 4805' can include semiconductor material, dielectric material, glass material, metallic material, or isolating material, or any combination thereof. The interface layer 4807' and/or the protection layer 4809' can include ARC material, BARC material, TARC material, or isolating material, or any combination thereof.

The first line features 4820' can have at least one incorrectly created threshold line 4829' that can be associated with a negative tone development procedure. Alternatively, the at least one incorrectly created threshold line 4829' may be associated with a positive tone development procedure. In addition, the first line features 4820' can have a first target CD 4865' associated therewith.

In some examples, the first space regions 4815' can be identified as high exposure regions in which the material was removed during positive-tone development procedures. Alternatively, the first space regions 4815' may be identified as low exposure regions in which the material was removed during negative-tone development procedures. In addition, the first space regions 4815' can be formed using two positive edges (4818' and 4819'). Alternatively, the first space region 4815' may be formed using two negative edges. Both edges (4818' and 4819') of the first space regions 4815' can be defined by a first development process.

The line features 4820' being corrected can have at least one "corrected" threshold line 4873' that can be associated with a negative tone development procedure and at least one correction region 4872' that were created using the flow (4870, 4870'). Alternatively, the corrected threshold line 4873' may be associated with a positive tone development procedure. In addition, the line features 4820' being corrected can have a first target CD 4865' associated therewith.

In some prevention procedures, one or more components can flow (4870, 4870') out of the protection (top) layer (4809, 4809') into the resist material in the incorrect line features (4820, 4820'). For example, the components can initiate a de-protection process in the resist material, can initiate a de-blocking process in the resist material, can initiate an acid generation process in the resist material, and/or can initiate a base generation process in the resist material. The flow (4870, 4870') can be initiated by a thermal process, by an EM radiation process, by an optical process, by a rinsing process, by a polymer activation process, or by a polymer de-activation process, or any combination thereof. In addition, the components can include an acid, a base, gasses, liquids, surfactants, polymers, blocking groups, de-blocking groups, leaving groups, de-protecting groups, or protecting groups, or any combination thereof.

Figure 49A:
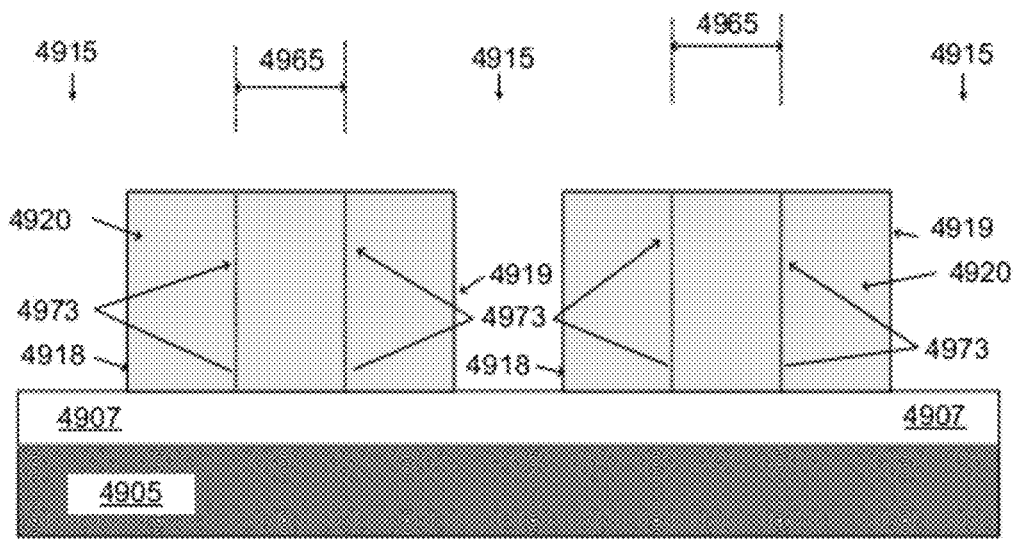
Figure 49B:
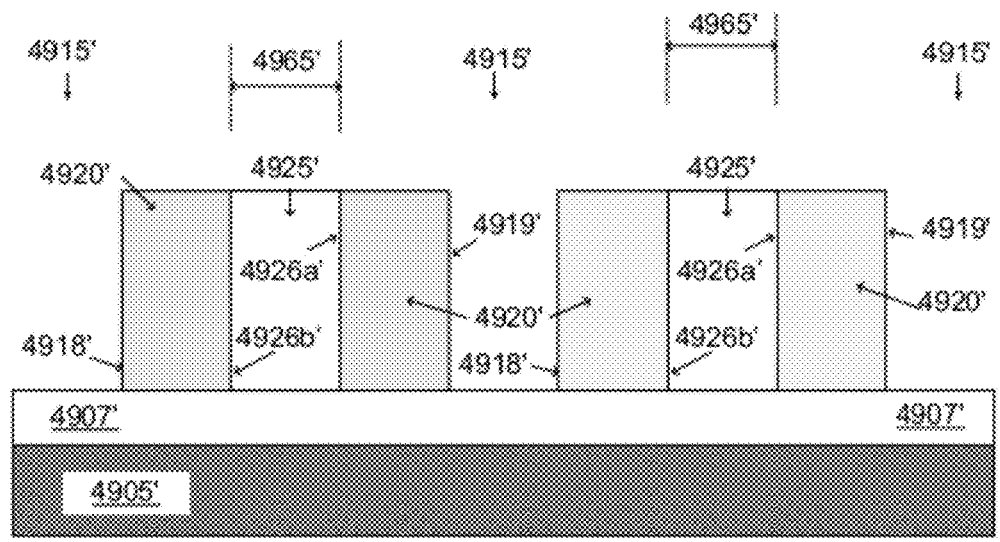

FIG. 49A and FIG. 49B illustrate additional procedures for preventing incorrectly patterned substrates in accordance with embodiments of the invention. A simplified view of a third patterned substrate 4900 is shown in FIG. 49A, and the illustrated embodiment shown in FIG. 49A can include a substrate layer 4905, an interface layer 4907, a plurality of first space regions 4915, and a plurality of corrected line features 4920. The substrate layer 4905 can include semiconductor material, dielectric material, glass material, metallic material, or isolating material, or any combination thereof. The interface layer and/or the protection layer 4907 can include ARC material, BARC material, TARC material, or isolating material, or any combination thereof.

In some examples, the first space regions 4915 can be identified as high exposure regions in which the material was removed during positive-tone development procedures. Alternatively, the first space regions 4915 may be identified as low exposure regions in which the material was removed during negative-tone development procedures. In addition, the first space regions 4915 can be formed using two positive edges (4918 and 4919). Alternatively, the first space region 4915 may be formed using two negative edges. Both edges (4918 and 4919) of the first space regions 4915 can be defined by a first development process.

The corrected line features 4920 can have at least one corrected threshold line 4973 that can be associated with a negative tone development procedure. Alternatively, the corrected threshold line 4973 may be associated with a positive tone development procedure. In addition, the first line features 4920 can have a first target CD 4965 associated therewith.

A simplified view of a fourth substrate 4900' is shown in FIG. 49B, and the illustrated embodiment shown in FIG. 49B can include a substrate layer 4905', an interface layer and/or a protection (top-) layer 4907', a plurality of first space regions 4915', a plurality of correctly created second line features 4920', and a plurality of correctly created second space regions 4925'. The substrate layer 4905' can include semiconductor material, dielectric material, glass material, metallic material, or isolating material, or any combination thereof. The interface layer and/or protection layer 4907' can include ARC material, BARC material, TARC material, or isolating material, or any combination thereof.

In some examples, the first space regions 4915' can be identified as high exposure regions in which the material was removed during positive-tone development procedures. Alternatively, the first space regions 4915' may be identified as low exposure regions in which the material was removed during negative-tone development procedures. In addition, the first space regions 4915' can be formed using two positive edges (4918' and 4919'). Alternatively, the first space region 4915' may be formed using two negative edges. Both edges (4918' and 4919') of the first space regions 4915' can be defined by a first development process.

In other examples, the correctly created second space regions 4925' can be identified as low exposure regions in which the material was removed during negative-tone development procedures. Alternatively, the correctly created second space regions 4925' may be identified as high exposure regions in which the material was removed during positive-tone development procedures. In addition, the correctly created second space regions 4925' can be formed using two positive edges (4926a' and 4926b'). Alternatively, the correctly created second space regions 4925' may be formed using two negative edges. Both edges (4926a' and 4926b') of the correctly created second space regions 4925' can be defined by a second development process.

The inventors have developed novel procedures for profile control using acid concentration control and/or base concentration control from properly designed interface layers and/or properly designed protection layers. Acid and base mobility have a big impact on how dual-tone development patterns are formed. Properly designed interface layers and/or properly designed protection layers can be used to add or subtract acid and/or base from the resist film and can therefore impact how these patterns are formed. For example, the addition (or subtraction) of acid and/or base components can affect at least one of the profile of the feature, the CD of the features, the CD (4965') of the spaces, the SWA of the features, the SWA of the spaces, the height of the features, and the amount of footer material.

In some examples, during a positive tone development procedure, profile control can be performed if the resist can be positioned on a BARC that can inject acid after getting to a certain temperature. In this situation, one can square up the negative tone space by baking the film past the point where acid could migrate from the BARC layer to the resist. This acid would add to the acid that is already present in the photoresist to cause more de-protection than would normally occur. This de-protection would shift the location of the negative tone threshold in the resist film and would also shift the CD (4965'). Effectively, such manipulation would serve to "square up" the resist profile (4920'). This results in a different de-protection profile in the resist as well as a different developed profile having a different CD (4965'). Similar procedures can be performed with base resists.

There are numerous combinations that can be used and modeled depending on 1) which development is completed first 2) whether the extra species is acidic or basic 3) what the profile shape might be in the absence of this extra component. In addition, different examples can be used and modeled where the top of the resist is manipulated through the use of a protection layer (top coat) that adds or subtracts acid and/or base material from the system. Furthermore, examples can be used and modeled where a rinse containing either acid or base can be used between development steps to impact the second development. In general, the concept is the same—acid and/or base can be added to or subtracted from the system to change how the profile looks.

FIG. 50 illustrates a simplified flow diagram for an additional method of patterning a substrate in accordance with embodiments of the invention. Procedure 5000 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one protection layer activation procedure, and a plurality of other procedures.

In 5010, a layer of radiation-sensitive material can be formed on the substrate, and the layer of radiation-sensitive material can include a dual-tone (D-T) resist material having a polymer backbone and a plurality of protected groups.

In 5020, a protection layer can be formed on the layer of radiation-sensitive material on the substrate, and the protection layer can include at least one activation component and/or at least one de-activation component. For example, an activation component can be used to activate one or more protecting groups when it moves into (reacts with) the (D-T) resist material, and a de-activation component can be used to de-protect one or more protecting groups when it moves into the (D-T) resist material.

In 5030, a first patterned layer of exposed radiation-sensitive material can be created by exposing the layer of radiation-sensitive material through the protection layer using first EM radiation and a reticle having a plurality of masking features, and the first patterned layer can be heated to create a plurality of high intensity regions, a plurality of medium intensity regions, and a plurality of low intensity regions. For example, the regions may be classified using exposure data, concentration data, acid data, base data, protecting group data, polymer data, protection layer data, temperature data, de-protection data, and/or chemistry data.

In 5040, a first threshold profile can be determined for a first dual-tone development procedure using at least one of the high intensity regions. Alternatively, threshold profile data may include exposure data, concentration data, acid data, base data, protecting group data, polymer data, protection layer data, temperature data, de-protection data, and/or chemistry data.

In 5050, a first limit can be established using a first simulated (predicted) threshold profile for the first dual-tone development procedure using at least one of the high intensity regions. Alternatively, other regions may be used. For example, the simulated threshold profile can be determined using calibrated models for the dual-tone resist material and the protection layer material. Alternatively, the simulation procedures may include exposure data, concentration data, acid data, base data, protecting group data, polymer data, protection layer data, temperature data, de-protection data, and/or chemistry data.

In 5060, the protection layer can be activated to create a modified patterned layer having a modified threshold profile if the first threshold profile exceeds the first limit. In some embodiments, when the protection layer is activated, one or more activation components can flow from the protection layer into the dual-tone resist material. In other embodiments, when the protection layer is activated, one or more resist groups can flow from the dual-tone resist material into protection layer.

In 5070, the first patterned layer of radiation-sensitive material can be developed, if the first threshold profile does not exceed the first limit.

In some embodiments, when the protection layer is being activated, the procedure can include: determining a first difference between the first threshold profile and the first limit; and applying first thermal activation energy (heat) to the protection layer, and the first thermal activation energy (heat) can be determined using at least one of the first difference, the dual-tone resist material, and the protection layer material.

In other embodiments, when the protection layer is being activated, the procedure can include: determining a first difference between the first threshold profile and the first limit; and applying first optical signal power to the protection layer, and the first optical signal power can be determined using the first difference, the dual-tone resist material, and the protection layer material.

For example, the first optical signal power can be provided by at least one of a single frequency source, multiple frequency source, a coherent source, a non-coherent source, a UV source, a EUV source, an IR source, and a visible light source.

In some other embodiments, when the protection layer is being activated, the procedure can include: determining a first difference between the first threshold profile and the first limit; and applying at least one chemical solution to the protection layer, and the chemical solution can be determined using the first difference, the dual-tone resist material, and the protection layer material.

In still other embodiments, when the first patterned layer is being developed, the procedure can include: performing a positive development procedure to remove one or more of the high intensity regions from the substrate using a first chemistry; determining a second threshold profile for a second dual-tone development procedure; activating the protection layer to modify the second threshold profile, if the second threshold profile exceeds a second limit; and performing a negative development procedure to remove one or more of the low intensity regions from the substrate using a second chemistry, if the second threshold profile does not exceed the second limit.

In alternate embodiments, when the first patterned layer is being developed, the procedure can include: performing a negative development procedure to remove one or more of the high intensity regions from the substrate using a first chemistry; determining a second threshold profile for a second dual-tone (negative tone or positive tone) development procedure; activating the protection layer to modify the second threshold profile, if the second threshold profile exceeds a second limit; and performing a positive development procedure to remove one or more of the low intensity regions from the substrate using a second chemistry, if the second threshold profile does not exceed the second limit.

In other additional embodiments, when the protection layer is being activated, the procedure can include: determining a first difference between the first threshold profile and the first limit; and applying second EM radiation to the protection layer, and the second EM radiation can be determined using the first difference, the dual-tone resist material, and the protection layer material. The second EM radiation can be different from the first EM radiation and can include a coherent and/or non-coherent signal.

FIG. 51 illustrates a simplified flow diagram for another additional method of patterning a substrate in accordance with embodiments of the invention. Procedure 5100 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one interface layer activation procedure, and a plurality of other procedures.

In 5110, a interface layer can be formed on the substrate, and the interface layer can include at least one activation component and/or at least one de-activation component. For example, an activation component can be used to de-protect one or more protecting groups when it moves into the (D-T) resist material, and a de-activation component can be used to establish one or more protecting groups when it moves into the (D-T) resist material. In addition, the interface layer can have reflective and/or transmission properties associated therewith.

In 5120, a layer of radiation-sensitive material can be formed on the interface layer, and the layer of layer of radiation-sensitive material can include a dual-tone resist material having a polymer backbone and a plurality of protecting groups.

In 5130, a first patterned layer of radiation-sensitive material can be created by exposing the layer of radiation-sensitive material using first EM radiation, the interface layer, and a reticle having a plurality of masking features, heating the first patterned layer to create a plurality of high intensity regions, a plurality of medium intensity regions, a plurality of low intensity regions. Alternatively, the regions may be classified using exposure data, concentration data, acid data, base data, protecting group data, polymer data, protection layer data, temperature data, de-protection data, and/or chemistry data.

In 5140, a first threshold profile can be determined for a first dual-tone (negative tone or positive tone) development procedure using at least one of the high intensity regions.

In 5150, a first limit can be established using a first simulated (predicted) threshold profile for the first dual-tone development procedure using at least one of the high intensity regions. For example, the simulated threshold profile can be determined using calibrated models for the dual-tone resist material and the interface layer material.

In 5160 the interface layer can be activated to create a modified patterned layer having a modified threshold profile, if the first threshold profile exceeds a first limit. In some embodiments, when the interface layer is activated, one or more activation components can flow from the interface layer into the dual-tone resist material. In other embodiments, when the interface layer is activated, one or more resist groups can flow from the dual-tone resist material into interface layer.

In 5170, the first patterned layer of radiation-sensitive material can be developed, if the first threshold profile does not exceed the first limit.

In some embodiments, when the interface layer is being activated, the procedure can include: determining a first difference between the first threshold profile and the first limit; and applying first thermal activation energy (heat) to the interface layer, and the first thermal activation energy (heat) can be determined using the first difference, the dual-tone resist material, and the interface layer material.

In other embodiments, when the interface layer is being activated, the procedure can include: determining a first difference between the first threshold profile and the first limit; and applying first optical signal power to the interface layer, and the first optical signal power can be determined using the first difference, the dual-tone resist material, and the interface layer material.

For example, the first optical signal power can be provided by at least one of a single frequency source, multiple frequency source, a coherent source, a non-coherent source, a UV source, a EUV source, an IR source, a flood source, and a visible light source.

In some other embodiments, when the interface layer is being activated, the procedure can include: determining a first difference between the first threshold profile and the first limit; and applying at least one chemical solution to the interface layer, and the chemical solution can be determined using the first difference, the dual-tone resist material, and the interface layer material.

In still other embodiments, when the first patterned layer is being developed, the procedure can include: performing a positive development procedure to remove one or more of the high intensity regions from the substrate using a first chemistry; determining a second threshold profile for a second dual-tone development procedure; activating the interface layer to modify the second threshold profile, if the second threshold profile exceeds a second limit; and performing a negative development procedure to remove one or more of the low intensity regions from the substrate using a second chemistry, if the second threshold profile does not exceed the second limit.

In alternate embodiments, when the first patterned layer is being developed, the procedure can include: performing a negative development procedure to remove one or more of the high intensity regions from the substrate using a first chemistry; determining a second threshold profile for a second dual-tone development procedure; activating the interface layer to modify the second threshold profile, if the second threshold profile exceeds a second limit; and performing a positive development procedure to remove one or more of the low intensity regions from the substrate using a second chemistry, if the second threshold profile does not exceed the second limit.

In other additional embodiments, when the interface layer is being activated, the procedure can include: determining a first difference between the first threshold profile and the first limit; and applying second EM radiation to the interface layer, and the second EM radiation can be determined using the first difference, the dual-tone resist material, and the interface layer material. The second EM radiation can be different from the first EM radiation and can include a coherent and/or non-coherent signal.

FIG. 52 illustrates a simplified flow diagram for an additional method of patterning a substrate in accordance with embodiments of the invention. Procedure 5200 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one resolution enhancement procedure, and a plurality of other procedures.

In 5210, a layer of radiation-sensitive material can be formed on the substrate, and the layer of radiation-sensitive material can include a dual-tone resist material that includes a plurality of radiation-sensitive acid groups and a plurality of radiation-sensitive base groups attached to a polymer backbone. In some alternate examples, the dual-tone resist material can include a plurality of radiation-sensitive acid groups and a plurality of non-radiation-sensitive base groups attached to a polymer backbone. In other alternate examples, the dual-tone resist material can include a plurality of non-radiation-sensitive acid groups and a plurality of non-radiation-sensitive base groups attached to a polymer backbone.

In 5220, a first patterned layer of exposed radiation-sensitive material can be created by exposing the layer of radiation-sensitive material using first EM radiation and a first reticle having a first set of masking features, and a first set of resolution enhancement features. For example, the masking features and the resolution enhancement features can be dependent upon the dual-tone resist material, and the first patterned layer of exposed radiation-sensitive material can be heated to create a plurality of high concentration (high acid) regions, a plurality of medium concentration (some acid and some base) regions, a plurality of low concentration (low base) regions.

In 5230, a first dual-tone (upper) threshold profile can be determined using at least one of the high concentration (high acid) regions in the first patterned layer of exposed radiation-sensitive material.

In 5240, a first simulated (predicted) dual-tone (upper) threshold profile can be established for a first positive tone development procedure in a dual-tone development procedure for the first patterned layer of exposed radiation-sensitive material. For example, the simulated dual-tone (upper) threshold profile can be determined using calibrated models for at least one of the first reticle, the first set of resolution enhancement features, the radiation-sensitive acid groups, the radiation-sensitive base groups, and the polymer backbone material.

In 5250, a first limit can be determined for the first positive tone development procedure in the dual-tone development procedure for the first patterned layer of exposed radiation-sensitive material using the first simulated (predicted) dual-tone (upper) threshold profile.

In 5260, additional procedures in the dual-tone (D-T) processing sequence can be performed, if the first threshold profile does not exceed a first limit of the first set of limits.

In 5270, at least one corrective action can be performed, if the first threshold profile exceeds the first limit.

In some embodiments, performing the at least one corrective action can include: creating a new dual-tone resist material having at least one of a new radiation-sensitive acid group, a new radiation-sensitive base group, a non-radiation-sensitive acid group, a non-radiation-sensitive base group, and a new polymer backbone; forming a new layer of new radiation-sensitive material on the substrate using the new dual-tone resist material; creating a new patterned layer of new exposed radiation-sensitive material by exposing the new layer of new radiation-sensitive material using the first EM radiation and a new reticle having a new set of resolution enhancement features, the new patterned layer of new exposed radiation-sensitive material can include a plurality of new high concentration (high acid) regions, a plurality of new medium concentration (some acid and some base) regions, a plurality of new low concentration (low base) regions; determining a new upper (first dual-tone) threshold profile using at least one of the new high concentration (high acid) regions in the new patterned layer of new exposed radiation-sensitive material; determining a new lower (second dual-tone) threshold profile using at least one of the new low concentration (low base) regions in the new patterned layer of exposed radiation-sensitive material; establishing a new simulated (predicted) dual-tone (upper) profile for a new positive tone development procedure in the dual-tone development procedure for the new patterned layer of new exposed radiation-sensitive material; determining a new set of limits for the new positive tone development procedure in the dual-tone development procedure for the new patterned layer of exposed radiation-sensitive material using the new simulated (predicted) dual-tone (upper) profile; performing the new positive tone development procedure in the dual-tone development procedure, if the new threshold profile does not exceed a new first limit of the new set of limits; and performing at least one new corrective action, if the new threshold profile exceeds the new limit.

In other embodiments, performing the at least one corrective action can include: determining a new set of limits for the first positive tone development procedure in the dual-tone development procedure for the first patterned layer of exposed radiation-sensitive material using the first simulated (predicted) dual-tone (upper) profile; performing the first positive tone development procedure in the dual-tone development procedure, if the first threshold profile does not exceed a new limit of the new set of limits; and performing at least one new corrective action, if the new threshold profile exceeds the new limit. In this manner, the process window limits can be increased.

In some other embodiments, performing the at least one corrective action can include: performing the first positive tone development procedure in the dual-tone development procedure, if the first threshold profile does not exceed a first limit of the first set of limits; determining a lower (second dual-tone) threshold profile using at least one of the low concentration (low base) regions in the first patterned layer of exposed radiation-sensitive material; establishing a second simulated (predicted) dual-tone (lower) profile for a first negative tone development procedure in the dual-tone development procedure for the first partially-developed patterned layer having partially-developed radiation-sensitive material; determining a second set of limits for a first negative tone development procedure in the dual-tone development procedure for the first partially-developed patterned layer using the second simulated (predicted) dual-tone (lower) profile; performing second additional procedures in the (D-T) processing sequence, if the second threshold profile does not exceed a first limit of the first set of limits; and performing at least one second corrective action, if the second threshold profile exceeds the second limit.

In additional embodiments, that can be used to optimize the resolution enhancement features, performing the at least one corrective action can include: creating a new patterned layer of new exposed radiation-sensitive material by exposing the layer of radiation-sensitive material using new EM radiation and a new reticle having a new set of resolution enhancement features, the new patterned layer of exposed radiation-sensitive material can include a plurality of new high concentration (high acid) regions, a plurality of new medium concentration (some acid and some base) regions, a plurality of new low concentration (low base) regions; determining a new upper (first dual-tone) threshold profile using at least one of the new high concentration (high acid) regions in the new patterned layer of exposed radiation-sensitive material; establishing a new simulated (predicted) dual-tone (upper) profile for a new first positive tone development procedure in the dual-tone development procedure for the new patterned layer of new exposed radiation-sensitive material; determining a new set of limits for the new first positive tone development procedure in the dual-tone development procedure for the new patterned layer of new exposed radiation-sensitive material using the new simulated (predicted) dual-tone (upper) profile; performing new additional procedures in the dual-tone (D-T) processing sequence, if the new threshold profile does not exceed a new limit of the new set of limits; and performing at least one new corrective action, if the new threshold profile exceeds the new limit.

In other resolution enhancement optimization sequences, performing the at least one corrective action can include: creating a new patterned layer of new exposed radiation-sensitive material by exposing the layer of radiation-sensitive material using the first EM radiation and a new reticle having a new set of resolution enhancement features, the new patterned layer of exposed radiation-sensitive material can include a plurality of new high concentration (high acid) regions, a plurality of new medium concentration (some acid and some base) regions, a plurality of new low concentration (low base) regions; determining a new upper (first dual-tone) threshold profile using at least one of the new high concentration (high acid) regions in the new patterned layer of exposed radiation-sensitive material; establishing a new simulated (predicted) dual-tone (upper) profile for a new first positive tone development procedure in the dual-tone development procedure for the new patterned layer of new exposed radiation-sensitive material; determining a new set of limits for the new first positive tone development procedure in the dual-tone development procedure for the new patterned layer of new exposed radiation-sensitive material using the new simulated (predicted) dual-tone (upper) profile; performing new additional procedures in the dual-tone (D-T) processing sequence, if the new threshold profile does not exceed a new limit of the new set of limits; and performing at least one new corrective action, if the new threshold profile exceeds the new limit.

In other additional embodiments, performing the at least one corrective action can include: creating a new patterned layer of new exposed radiation-sensitive material by exposing the layer of radiation-sensitive material using new EM radiation and a new reticle having a new set of resolution enhancement features, the new patterned layer of exposed radiation-sensitive material can include a plurality of new high concentration (high acid) regions, a plurality of new medium concentration (some acid and some base) regions, a plurality of new low concentration (low base) regions; determining a new upper (first dual-tone) threshold profile using at least one of the new high concentration (high acid) regions in the new patterned layer of exposed radiation-sensitive material; establishing a new simulated (predicted) dual-tone (upper) profile for a new first positive tone development procedure in the dual-tone development procedure for the new patterned layer of new exposed radiation-sensitive material; determining a new set of limits for the new first positive tone development procedure in the dual-tone development procedure for the new patterned layer of new exposed radiation-sensitive material using the new simulated (predicted) dual-tone (upper) profile; performing new additional procedures in the dual-tone (D-T) processing sequence, if the new threshold profile does not exceed a new limit of the new set of limits; and performing at least one new corrective action, if the new threshold profile exceeds the new limit.

In additional embodiments, performing the second additional procedures in the (D-T) processing sequence can include: performing the first positive tone development procedure in the dual-tone development procedure, if the first threshold profile does not exceed a first limit of the first set of limits; determining a lower (second dual-tone) threshold profile using at least one of the low concentration (low base) regions in the first patterned layer of exposed radiation-sensitive material; establishing a second simulated (predicted) dual-tone (lower) profile for a first negative tone development procedure in the dual-tone development procedure for the first partially-developed patterned layer having partially-developed radiation-sensitive material; determining a second set of limits for a first negative tone development procedure in the dual-tone development procedure for the first partially-developed patterned layer using the second simulated (predicted) dual-tone (lower) profile; performing second additional procedures in the (D-T) processing sequence, if the second threshold profile does not exceed a first limit of the first set of limits; and performing at least one second corrective action, if the second threshold profile exceeds the second limit.

Figure 53:
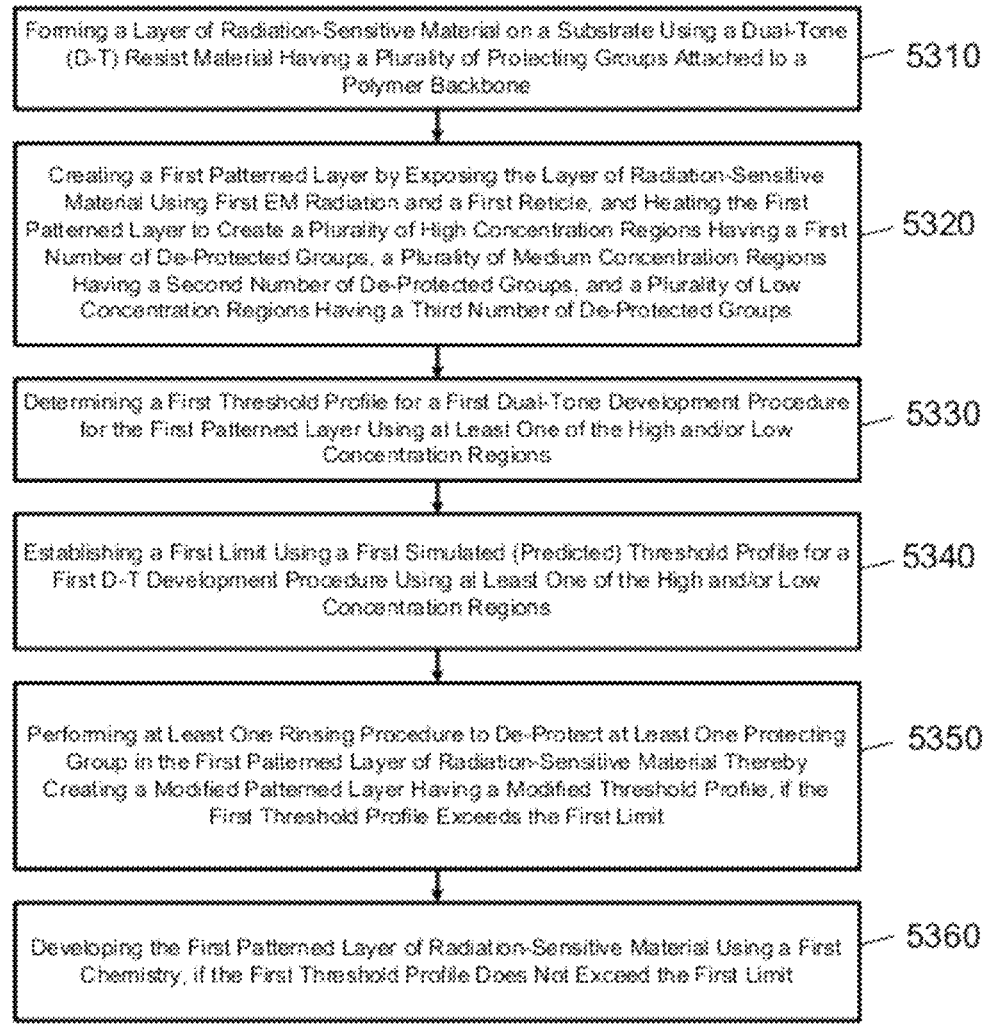

FIG. 53 illustrates a simplified flow diagram for another additional method of patterning a substrate in accordance with embodiments of the invention. Procedure 5300 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one rinse-activation procedure, and a plurality of other procedures.

In 5310, a layer of radiation-sensitive material can be formed on the substrate, and the layer of radiation-sensitive material can include a Dual-Tone (D-T) resist material having a plurality of protecting groups attached to a polymer backbone.

In 5320, a first patterned layer of radiation-sensitive material can be created by exposing the layer of radiation-sensitive material using first EM radiation and a first reticle having a first set of masking features. For example, the first patterned layer can be heated to create a plurality of high concentration regions having a first number of de-protected groups, a plurality of medium concentration regions having a second number of de-protected groups, and a plurality of low concentration regions having a third number of de-protected groups. For example, the concentration can be determined by using at least one of a first number of de-protected groups, a second number of de-protected groups, the third number of de-protected groups, the protecting group material, and the polymer backbone material.

In 5330, a first threshold profile can be determined for a first dual-tone (negative tone or positive tone) development procedure for the first patterned layer using at least one of the high and/or low concentration regions.

In 5340, a first limit can be established using a first simulated (predicted) threshold profile for a first dual-tone (D-T) development procedure using at least one of the high and/or low concentration regions. For example, the simulation parameters can include at least one of a rinsing chemistry, a developing chemistry, a rinsing time, a developing time, an acid activation component, a base activation component, and a polymer material.

In 5350, at least one rinsing procedure can be performed to de-protect at least one of the protecting groups in the first patterned layer of radiation-sensitive material thereby modifying the first threshold profile if the first threshold profile exceeds a first limit.

In 5360, the first patterned layer of radiation-sensitive material can be developed using a first chemistry, if the first threshold profile does not exceed the first limit.

In some embodiments, the procedure can include: performing a first rinsing procedure before performing a positive development procedure to remove one or more of the high concentration regions from the substrate using a first chemistry; and performing a second rinsing procedure before performing a negative development procedure to remove one or more of the low concentration regions from the substrate using a second chemistry.

In other embodiments, performing the at least one rinsing procedure to modify the first threshold profile can include: determining a first difference between the first threshold profile and the first limit; and applying first thermal activation energy (heat) to the first patterned layer of radiation-sensitive material during at least one of the rinsing procedures, and the first thermal activation energy (heat) can be determined using at least one of the first difference, a rinsing chemistry, a developing chemistry, the activation group material, and the polymer backbone material.

In some other embodiments, performing the at least one rinsing procedure to modify the first threshold profile can include: determining a first difference between the first threshold profile and the first limit; and applying first optical signal power to the first patterned layer of radiation-sensitive material during at least one of the rinsing procedures, and the first optical signal power can be determined using at least one of the first difference, a rinsing chemistry, a developing chemistry, the activation group material, and the polymer backbone material.

In some other embodiments, performing the at least one rinsing procedure to modify the first threshold profile can include: determining a first difference between the first threshold profile and the first limit; and applying at least one chemical solution to the first patterned layer of radiation-sensitive material during at least one of the rinsing procedures, and the chemical solution (developing solution) can be determined using at least one of the first difference, a rinsing chemistry, a developing chemistry, the activation group material, and the polymer backbone material.

In still other embodiment, developing the first patterned layer can include: performing a positive development procedure to remove one or more of the high concentration regions from the substrate using a first chemistry; determining a second threshold profile for a second dual-tone development procedure; performing at least one rinsing procedure to modify the second threshold profile, if the second threshold profile exceeds a second limit; and performing a negative development procedure to remove one or more of the low concentration regions from the substrate using a second chemistry, if the second threshold profile does not exceed the second limit.

In additional embodiments, performing the at least one rinsing procedure to modify the first threshold profile can include: determining a first difference between the first threshold profile and the first limit; and applying second EM radiation to the first patterned layer of radiation-sensitive material during at least one of the rinsing procedures, and the second EM radiation can be determined using the first difference.

Figure 54:
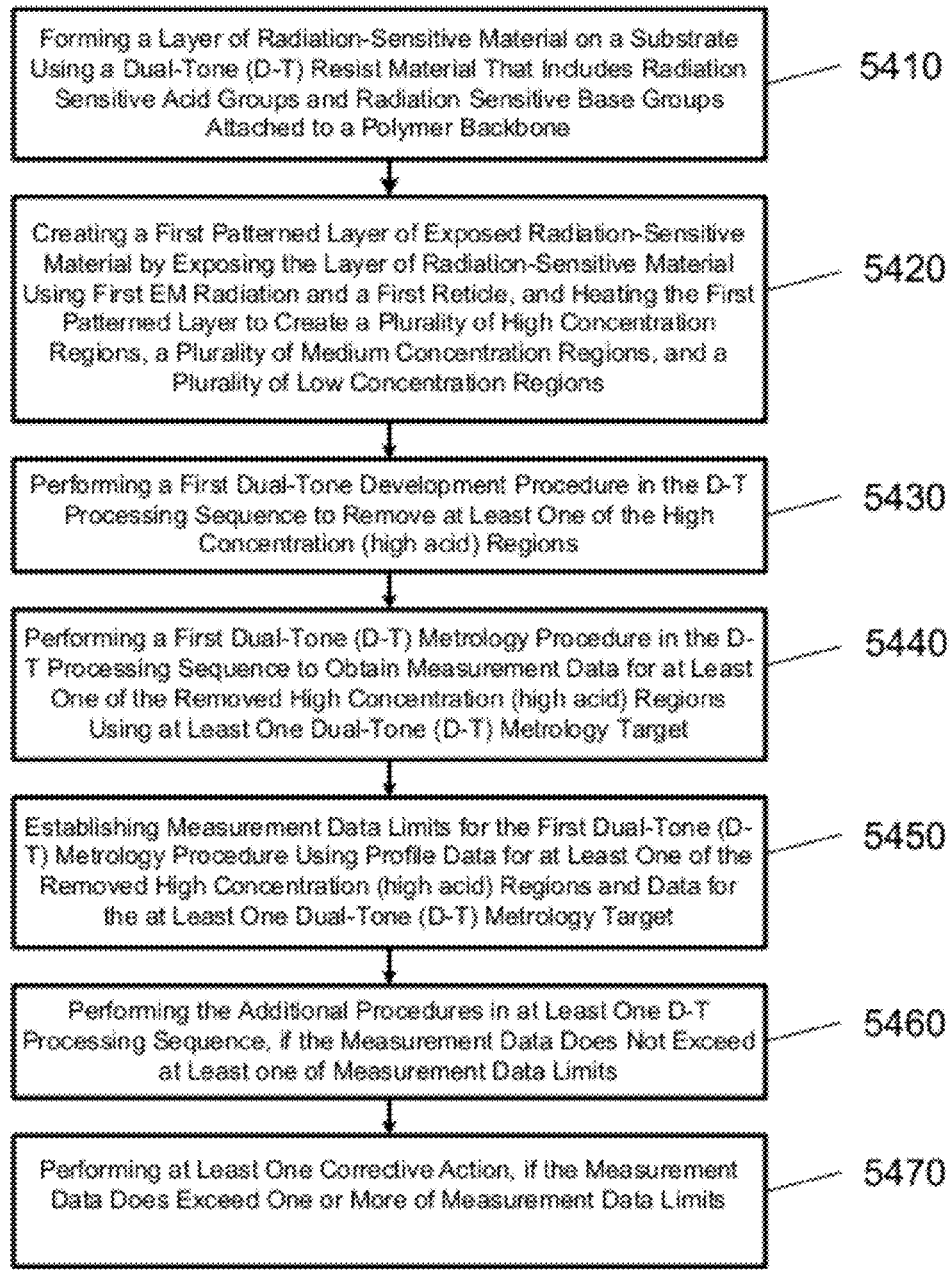

FIG. 54 illustrates a simplified flow diagram for another additional method of patterning a substrate in accordance with embodiments of the invention. Procedure 5400 illustrates a method for processing a substrate using another dual-tone (D-T) processing sequence. For example, the (D-T) processing sequence can include at least one dual-tone exposure procedure, at least one positive tone developing procedure, at least one negative tone developing procedure, at least one dual-tone (D-T) metrology procedure, and a plurality of other procedures.

In 5410, a layer of radiation-sensitive material can be formed on the substrate, and the layer of radiation-sensitive material can include a dual-tone resist material having a plurality of radiation-sensitive acid groups and a plurality of radiation-sensitive base groups attached to a polymer backbone. Alternatively, the dual-tone resist material may be configured differently.

In 5420, a first patterned layer of exposed radiation-sensitive material can be created by exposing the layer of radiation-sensitive material using first EM radiation and a first reticle having a first set of masking features that can have resolution-enhancement features. In addition, the first patterned layer of exposed radiation-sensitive material can be heated to create a plurality of high concentration (high acid) regions, a plurality of medium concentration (some acid and some base) regions, a plurality of low concentration (low base) regions.

In 5430, a first dual-tone (D-T) development procedure in the (D-T) processing sequence can be performed to remove at least one of the high concentration (high acid) regions in the first patterned layer of exposed radiation-sensitive material.

In 5440, a first dual-tone (D-T) metrology procedure in the (D-T) processing sequence can be performed to obtain first measurement data for at least one of the removed high concentration (high acid) regions using at least one dual-tone (D-T) metrology target. Alternatively, the (D-T) metrology procedure may be performed differently.

In 5450, measurement data limits can be established for the first dual-tone (D-T) metrology procedure using profile data for at least one of the removed high concentration (high acid) regions and data for the at least one dual-tone (D-T) metrology target.

In 5460, additional procedures in the dual-tone (D-T) processing sequence can be performed, if the measurement data does not exceed at least one of the measurement data limits; and.

In 5470, at least one corrective action can be performed, if the measurement data exceeds at least one of the measurement data limits.

In some embodiments, performing the at least one corrective action can include: creating a new dual-tone resist material having at least one of a new radiation-sensitive acid group, a new radiation-sensitive base group, and a new polymer backbone; forming a new layer of new radiation-sensitive material on the substrate using the new dual-tone resist material; creating a new patterned layer of new exposed radiation-sensitive material by exposing the new layer of new radiation-sensitive material using the first EM radiation and the first reticle having the first set of masking features, the new patterned layer of new exposed radiation-sensitive material can be heated to create a plurality of new high concentration (high acid) regions, a plurality of new medium concentration (some acid and some base) regions, a plurality of new low concentration (low base) regions; performing a new dual-tone (D-T) development procedure that can be in the (D-T) processing sequence to remove at least one of the new high concentration (high acid) regions in the new patterned layer of exposed radiation-sensitive material; performing a new dual-tone (D-T) metrology procedure that can be in the (D-T) processing sequence to obtain new measurement data for at least one of the new removed high concentration (high acid) regions using at least one new dual-tone (D-T) metrology target; establishing new measurement data limits for the new dual-tone (D-T) metrology procedure using new profile data for at least one of the new removed high concentration (high acid) regions and new data for the at least one new dual-tone (D-T) metrology target; performing new additional procedures in at least one of the dual-tone (D-T) processing sequences, if the new measurement data does not exceed at least one of the new measurement data limits; and performing at least one new corrective action, if the new measurement data exceeds at least one of the new measurement data limits.

In other embodiments, performing the at least one corrective action can include: establishing new measurement data limits for the new dual-tone (D-T) metrology procedure using new profile data for at least one of the new removed high concentration (high acid) regions and new data for the at least one new dual-tone (D-T) metrology target; performing new additional procedures in the dual-tone (D-T) processing sequence, if the new measurement data does not exceed at least one of the new measurement data limits; and performing at least one new corrective action, if the new measurement data exceeds one or more of the new measurement data limits.

In still other embodiments, performing the at least one corrective action can include: performing a new dual-tone (D-T) development procedure in the (D-T) processing sequence to remove at least one of the new high concentration (high acid) regions in the new patterned layer of exposed radiation-sensitive material; performing a new dual-tone (D-T) metrology procedure in the (D-T) processing sequence to obtain new measurement data for at least one of the new removed high concentration (high acid) regions using at least one new dual-tone (D-T) metrology target; establishing new measurement data limits for the new dual-tone (D-T) metrology procedure using new profile data for at least one of the new removed high concentration (high acid) regions and new data for the at least one new dual-tone (D-T) metrology target; increasing process window limits and performing new additional procedures in the dual-tone (D-T) processing sequence, if the new measurement data does not exceed at least one of the new measurement data limits; and performing at least one new corrective action, if the new measurement data exceeds at least one of the new measurement data limits.

In some other embodiments, performing the at least one corrective action can include: creating a new patterned layer of new exposed radiation-sensitive material by exposing the new layer of new radiation-sensitive material using the first EM radiation and the first reticle having the first set of masking features, and heating the new patterned layer of new exposed radiation-sensitive material to create a plurality of new high concentration (high acid) regions, a plurality of new medium concentration (some acid and some base) regions, a plurality of new low concentration (low base) regions; performing a new dual-tone (D-T) development procedure in the (D-T) processing sequence to remove at least one of the new high concentration (high acid) regions in the new patterned layer of exposed radiation-sensitive material; performing a new dual-tone (D-T) metrology procedure in the (D-T) processing sequence to obtain new measurement data for at least one of the new removed high concentration (high acid) regions using at least one new dual-tone (D-T) metrology target; establishing new measurement data limits for the new dual-tone (D-T) metrology procedure using new profile data for at least one of the new removed high concentration (high acid) regions and new data for the at least one new dual-tone (D-T) metrology target; storing the new measurement data and the new measurement data limits, and performing new additional procedures in the dual-tone (D-T) processing sequence, if the new measurement data does not exceed at least one of the new measurement data limits; and performing at least one new corrective action, if the new measurement data exceeds one or more of the new measurement data limits.

In additional embodiments, performing the at least one corrective action can include: forming a new layer of new radiation-sensitive material on the substrate using the new dual-tone resist material; creating a new patterned layer of new exposed radiation-sensitive material by exposing the new layer of new radiation-sensitive material using the first EM radiation and the first reticle having the first set of masking features, and heating the new patterned layer of new exposed radiation-sensitive material to create a plurality of new high concentration (high acid) regions, a plurality of new medium concentration (some acid and some base) regions, a plurality of new low concentration (low base) regions; performing a new dual-tone (D-T) development procedure in the (D-T) processing sequence to remove at least one of the new high concentration (high acid) regions in the new patterned layer of exposed radiation-sensitive material; performing a new dual-tone (D-T) metrology procedure in the (D-T) processing sequence to obtain new measurement data for at least one of the new removed high concentration (high acid) regions using at least one new dual-tone (D-T) metrology target; establishing simulated (predicted) measurement data limits for the new dual-tone (D-T) metrology procedure using new profile data for at least one of the new removed high concentration (high acid) regions and new data for the at least one new dual-tone (D-T) metrology target; storing the simulated (predicted) measurement data limits and performing new additional procedures in the dual-tone (D-T) processing sequence, if the new measurement data does not exceed at least one of the simulated (predicted) measurement data limits; and performing at least one new corrective action, if the new measurement data exceeds one or more of the simulated (predicted) measurement data limits.

In other additional embodiments, performing the at least one corrective action can include: performing a new dual-tone (D-T) metrology procedure in the (D-T) processing sequence to obtain new measurement data for at least one of the new removed high concentration (high acid) regions using at least one new dual-tone (D-T) metrology target; establishing new measurement data limits for the new dual-tone (D-T) metrology procedure using new profile data for at least one of the new removed high concentration (high acid) regions and new data for the at least one new dual-tone (D-T) metrology target; identifying the new dual-tone (D-T) metrology procedure as a verified procedure and performing new additional procedures in the dual-tone (D-T) processing sequence, if the new measurement data does not exceed at least one of the new measurement data limits; and performing at least one new corrective action, if the new measurement data exceeds one or more of the new measurement data limits.

In some other additional embodiments, performing the at least one corrective action can include: establishing new measurement data limits for the new dual-tone (D-T) metrology procedure using simulated (predicted) profile data for at least one of the removed high concentration (high acid) regions and/or simulated (predicted) data for the at least one new dual-tone (D-T) metrology target; storing simulated (predicted) profile data in a dual-tone profile library and performing new additional procedures in the dual-tone (D-T) processing sequence, if the new measurement data does not exceed at least one of the new measurement data limits; and performing at least one new corrective action, if the new measurement data exceeds one or more of the new measurement data limits.

In other examples, performing additional procedures in the dual-tone (D-T) processing sequence can include: performing a second dual-tone (D-T) development procedure in the (D-T) processing sequence to remove at least one of the low concentration (high base) regions in a new patterned layer of developed radiation-sensitive material; performing a second dual-tone (D-T) metrology procedure in the (D-T) processing sequence to obtain second measurement data for at least one of the removed low concentration (high base) regions using at least one second dual-tone (D-T) metrology target; establishing second measurement data limits for the second dual-tone (D-T) metrology procedure using second profile data for at least one of the removed low concentration (high base) regions and second data for the at least one second dual-tone (D-T) metrology target; identifying the second measurement data and the second measurement data limits as verified data, and performing second additional procedures in the dual-tone (D-T) processing sequence, if the second measurement data does not exceed at least one of the second measurement data limits; and performing at least one second corrective action, if the second measurement data exceeds one or more of the second measurement data limits.

In other examples, performing the first dual-tone (D-T) development procedure can include: determining a first difference between the first measurement data and a first measurement data limit; and applying first thermal activation energy (heat) to exposed resist material in the first patterned layer of exposed radiation-sensitive material to activate at least one of the radiation-sensitive acid groups and/or at least one of the radiation-sensitive base groups, thereby creating a first modified resist material, and the first thermal activation energy (heat) can be determined using at least one of the first difference, the polymer backbone, a radiation-sensitive acid group and/or a radiation-sensitive base group, the first modified resist material having the polymer backbone and a different number of radiation-sensitive acid groups and/or radiation-sensitive base groups attached to a polymer backbone.

In still other examples, performing the first dual-tone (D-T) development procedure can include: determining a first difference between the first measurement data and a first measurement data limit; and applying first optical signal power to exposed resist material in the first patterned layer of exposed radiation-sensitive material to de-protect at least one of the radiation-sensitive acid groups and/or at least one of the radiation-sensitive base groups, thereby creating a first modified resist material, and the first optical signal power can be determined using at least one of the first difference, the polymer backbone, a radiation-sensitive acid group and/or a radiation-sensitive base group, the first modified resist material can have the polymer backbone and a different number of radiation-sensitive acid groups and/or radiation-sensitive base groups attached to a polymer backbone.

In additional examples, performing the first dual-tone (D-T) development procedure can include: determining a first difference between the first measurement data and a first measurement data limit; and applying first chemical solution to exposed resist material in the first patterned layer of exposed radiation-sensitive material to de-protect at least one of the radiation-sensitive acid groups and/or at least one of the radiation-sensitive base groups, thereby creating a first modified resist material, and the first chemical solution can be determined using at least one of the first difference, the polymer backbone, a radiation-sensitive acid group and/or a radiation-sensitive base group, the first modified resist material can have the polymer backbone and a different number of radiation-sensitive acid groups and/or radiation-sensitive base groups attached to a polymer backbone.

In other additional embodiments, the semiconductor processing system can include: a lithography system configured to form a layer of radiation-sensitive material on the substrate, and the layer of radiation-sensitive material can include a dual-tone resist material having a plurality of radiation-sensitive acid groups and a plurality of radiation-sensitive base groups attached to a polymer backbone; an exposure system configured to create a first patterned layer of exposed radiation-sensitive material by exposing the layer of radiation-sensitive material using first EM radiation and a reticle having a first set of resolution-enhancement features, the first patterned layer of exposed radiation-sensitive material can include a plurality of high concentration (high acid) regions, a plurality of medium concentration (some acid and some base) regions, a plurality of low concentration (low base) regions, and the exposure system is coupled to the lithography system; and the lithography system is further configured to perform a first dual-tone (D-T) development procedure in the (D-T) processing sequence to remove at least one of the high concentration (high acid) regions in the first patterned layer of exposed radiation-sensitive material, and to perform a first dual-tone (D-T) metrology procedure in the (D-T) processing sequence to obtain first measurement data for at least one of the removed high concentration (high acid) regions using at least one dual-tone (D-T) metrology target; establishing measurement data limits for the first dual-tone (D-T) metrology procedure using profile data for at least one of the removed high concentration (high acid) regions and data for the at least one dual-tone (D-T) metrology target; and a computer system configured to determine when to perform additional procedures in the dual-tone (D-T) processing sequence, if the measurement data does not exceed at least one of the measurement data limits; and is further configured to perform at least one corrective action, if the measurement data exceeds at least one of the measurement data limits, the computer system being coupled to the exposure system and the lithography system.

In still other additional embodiments a computer readable medium containing program instructions for execution on a computer system coupled to a semiconductor processing system, which when executed by the computer system, causes the semiconductor processing system to perform a process, and the program instructions can include: forming a layer of radiation-sensitive material on the substrate, and the layer of radiation-sensitive material can include a dual-tone resist material having a plurality of radiation-sensitive acid groups and a plurality of radiation-sensitive base groups attached to a polymer backbone; creating a first patterned layer of exposed radiation-sensitive material by exposing the layer of radiation-sensitive material using first EM radiation and a reticle having a first set of resolution-enhancement features, the first patterned layer of exposed radiation-sensitive material can include a plurality of high concentration (high acid) regions, a plurality of medium concentration (some acid and some base) regions, a plurality of low concentration (low base) regions; performing a first dual-tone (D-T) development procedure in the (D-T) processing sequence to remove at least one of the high concentration (high acid) regions in the first patterned layer of exposed radiation-sensitive material; performing a first dual-tone (D-T) metrology procedure in the (D-T) processing sequence to obtain first measurement data for at least one of the removed high concentration (high acid) regions using at least one dual-tone (D-T) metrology target; establishing measurement data limits for the first dual-tone (D-T) metrology procedure using profile data for at least one of the removed high concentration (high acid) regions and data for the at least one dual-tone (D-T) metrology target; performing additional procedures in the dual-tone (D-T) processing sequence, if the measurement data does not exceed at least one of the measurement data limits; and performing at least one corrective action, if the measurement data exceeds at least one of the measurement data limits.

Figure 55:
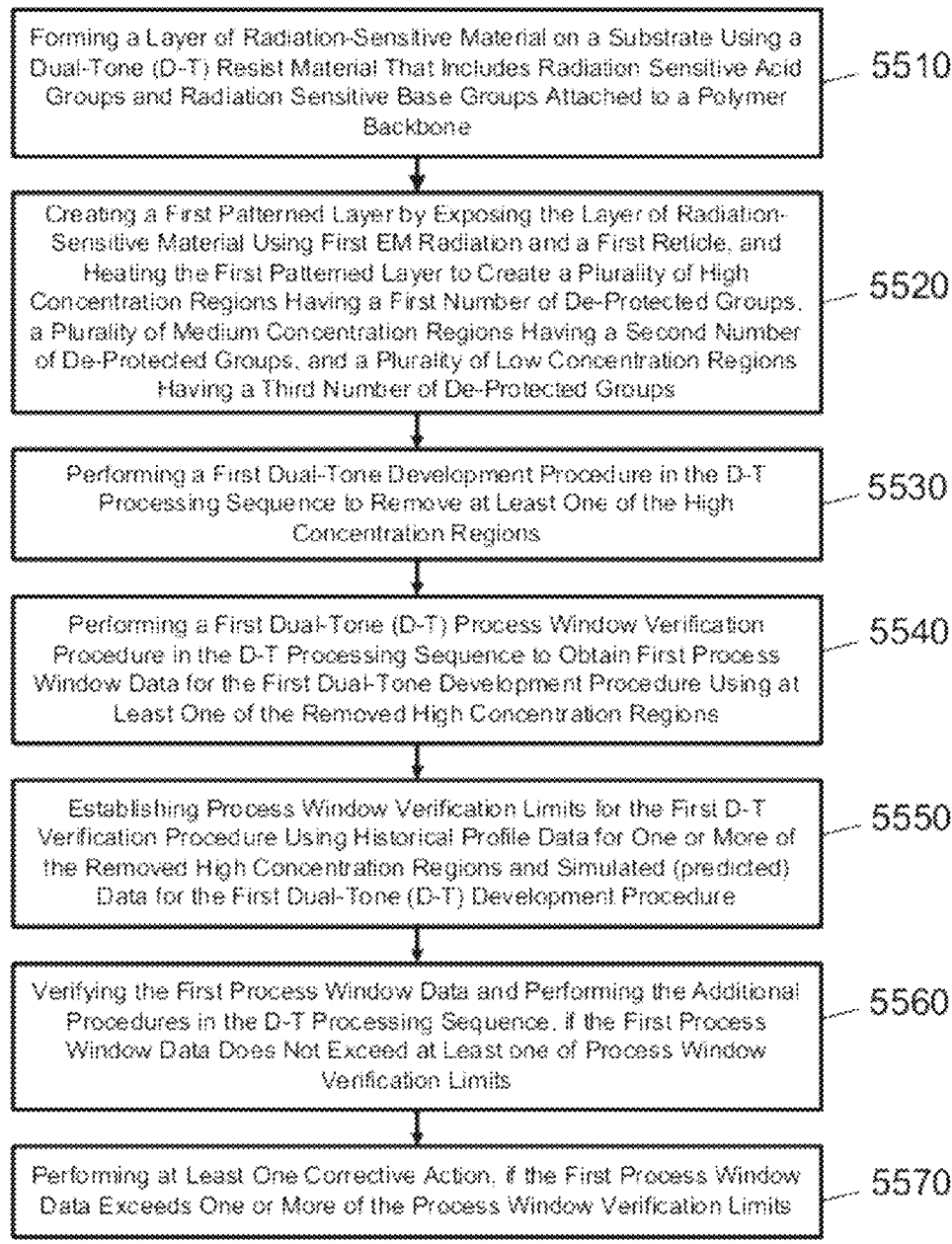

FIG. 55 illustrates a simplified flow diagram for another additional method of patterning a substrate in accordance with embodiments of the invention. Procedure 5500 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one process window metrology procedure, and a plurality of other procedures.

In 5510, a layer of radiation-sensitive material can be formed on the substrate, and the layer of radiation-sensitive material can include a dual-tone resist material having a plurality of radiation-sensitive acid groups and a plurality of radiation-sensitive base groups attached to a polymer backbone.

In 5520, a first patterned layer of exposed radiation-sensitive material can be created by exposing the layer of radiation-sensitive material using first EM radiation and a reticle having a first set of masking features. In addition, the first patterned layer of exposed radiation-sensitive material can be heated to create a plurality of high concentration (high acid) regions, a plurality of medium concentration (some acid and some base) regions, a plurality of low concentration (low base) regions. For example, the high concentration regions can have a first number of de-protected groups, the medium concentration regions can have a second number of de-protected groups, and the low concentration regions can have a third number of de-protected groups, and the de-protected groups can include acidic groups and/or base groups. In addition, the de-protected groups can include negative groups and/or positive groups, the concentration can be determined by using a first number of negative groups, a second number of positive groups, a third number of groups that remain protected, the protecting group material, and the polymer backbone material.

In 5530, a first dual-tone (D-T) development procedure in the (D-T) processing sequence can be performed to remove at least one of the high concentration (high acid) regions in the first patterned layer of exposed radiation-sensitive material.

In 5540, a first dual-tone (D-T) process window verification procedure in the (D-T) processing sequence can be performed to obtain first process window data using at least one of the removed high concentration (high acid) regions.

In 5550, process window verification limits can be established for the first dual-tone (D-T) metrology procedure using profile data for at least one of the removed high concentration (high acid) regions and simulated (predicted) data for the first dual-tone (D-T) development procedure.

In 5560, additional procedures in the dual-tone (D-T) processing sequence can be performed, if the process window data does not exceed at least one of the process window data limits.

In 5570, at least one corrective action can be performed, if the process window data exceeds at least one of the process window data limits.

In some embodiments, performing the at least one corrective action, further comprises: creating a new dual-tone resist material having at least one of a new radiation-sensitive acid group, a new radiation-sensitive base group, and a new polymer backbone; forming a new layer of new radiation-sensitive material on the substrate using the new dual-tone resist material; creating a new patterned layer of new exposed radiation-sensitive material by exposing the new layer of new radiation-sensitive material using the first EM radiation and the reticle having a first set of resolution-enhancement features, the new patterned layer of new exposed radiation-sensitive material can include a plurality of new high concentration (high acid) regions, a plurality of new medium concentration (some acid and some base) regions, a plurality of new low concentration (low base) regions; performing a new dual-tone (D-T) development procedure in the (D-T) processing sequence to remove at least one of the new high concentration (high acid) regions in the new patterned layer of exposed radiation-sensitive material; performing a new dual-tone (D-T) process window metrology procedure in the (D-T) processing sequence to obtain new process window data for at least one of the new removed high concentration (high acid) regions; establishing new process window data limits for the new dual-tone (D-T) metrology procedure using new profile data for at least one of the new removed high concentration (high acid) regions and new simulated (predicted) data for the first dual-tone (D-T) development procedure; performing new additional procedures in the dual-tone (D-T) processing sequence, if the new process window data does not exceed at least one of the new process window data limits; and performing at least one new corrective action, if the new process window data exceeds at least one of the new process window data limits.

FIG. 56 illustrates another simplified flow diagram for another additional method of patterning a substrate in accordance with embodiments of the invention. Procedure 5600 illustrates a method for processing a substrate using a dual-tone (D-T) processing sequence. For example, the (D-T) processing sequence can include at least one dual-tone exposure procedure, at least one positive tone developing procedure, at least one negative tone developing procedure, at least one optimization procedure, and a plurality of other procedures.

In 5610, a layer of radiation-sensitive material can be formed on the substrate, and the layer of radiation-sensitive material can include a dual-tone resist material having a plurality of radiation-sensitive positive tone groups and a plurality of radiation-sensitive negative tone groups attached to a polymer backbone.

In 5620, an optimization model can be established for the dual-tone (D-T) resist material that can include first de-protection models for the positive tone groups, second de-protection models for the negative tone groups, and third de-protection models for the polymer backbone In 5630, a first patterned layer of exposed radiation-sensitive material can be created by exposing the layer of radiation-sensitive material using first EM radiation and a reticle having a first set of masking features. In addition, the first patterned layer of exposed radiation-sensitive material can be heated to create a plurality of positive tone regions, a plurality of mixed (some positive tone and some negative tone material) regions, a plurality of negative tone regions.

In 5640, a first dual-tone (D-T) development procedure in the (D-T) processing sequence can be performed to remove at least one of the positive tone regions in the first patterned layer of exposed radiation-sensitive material.

In 5650, a first dual-tone (D-T) metrology procedure in the (D-T) processing sequence can be performed to obtain measured profile data using at least one of the removed positive tone regions and data for at least one dual-tone (D-T) metrology target.

In 5660, optimization data limits can be established for the first (D-T) development procedure using the optimization model for the dual-tone (D-T) resist material and data for the at least one (D-T) metrology target.

In 5670, the optimization model for the dual-tone (D-T) resist material can be modified, if the measured profile data does not exceed at least one of the optimization data limits.

In 5680, a second dual-tone (D-T) development procedure in the (D-T) processing sequence can be performed to remove at least one of the negative tone regions in the first patterned layer of exposed radiation-sensitive material, if the measured profile data exceeds one or more of the optimization data limits.

In some embodiments, modifying the optimization model can include: forming a new layer of radiation-sensitive material on the substrate, and the new layer of radiation-sensitive material can include a new dual-tone resist material having a plurality of new radiation-sensitive positive tone groups and a plurality of new radiation-sensitive negative tone groups attached to a new polymer backbone; establishing a new optimization model for the new dual-tone (D-T) resist material including new first de-protection models for the new positive tone groups, new second de-protection models for the new negative tone groups, and new third de-protection models for the new polymer backbone; creating a new patterned layer of exposed radiation-sensitive material by exposing the new layer of radiation-sensitive material using new EM radiation and a new reticle having a new set of masking features, and heating the new patterned layer of exposed radiation-sensitive material to create a plurality of new positive tone regions, a plurality of new mixed regions, a plurality of new negative tone regions; performing a new dual-tone (D-T) development procedure in the (D-T) processing sequence to remove at least one of the new positive tone regions in the new patterned layer of exposed radiation-sensitive material; performing a new dual-tone (D-T) metrology procedure in the (D-T) processing sequence to obtain new measured profile data using at least one of the new removed positive tone regions and new data for at least one new dual-tone (D-T) metrology target; establishing new optimization data limits for the new (D-T) development procedure using the new optimization model for the new dual-tone (D-T) resist material and new data for the at least one new (D-T) metrology target; identifying the new optimization model as a verified model, if the new measured profile data does not exceed at least one of the new optimization data limits; and modifying the new optimization model, if the new measured profile data exceeds at least one of the new optimization data limits.

FIG. 57 illustrates another simplified flow diagram for a method of patterning a substrate in accordance with embodiments of the invention. During procedure 5700, one or more substrates can be positioned on one or more substrate holders in one or more processing chambers for one or more lengths of time.

In 5710, a layer of radiation-sensitive material can be formed on at least one substrate, and the layer of radiation-sensitive material can include a resist material having polymer backbone and a plurality of protecting groups.

In 5720, a first patterned layer of exposed radiation-sensitive material can be created by exposing the layer of radiation-sensitive material using first EM radiation and a reticle having a plurality of periodic features, and heating the first patterned layer of exposed radiation-sensitive material to create a plurality of high exposure (intensity) regions having a first number of de-protected groups, a plurality of medium exposure (intensity) regions having a second number of de-protected groups, and a plurality of low exposure (intensity) regions having a third number of de-protected groups.

In 5730, a first threshold profile can be determined for a first dual-tone (positive tone) development procedure for the first patterned layer of exposed radiation-sensitive material. For example, the first dual-tone development procedure can include at least one positive tone development procedure and at least one negative tone development procedure. In addition, during the first dual-tone development procedure at least one positive tone threshold and/or at least one negative tone threshold can be determined.

In 5740, a first set of limits can be determined for the first dual-tone development procedure. For example, the first dual-tone development procedure can include at least one set of positive tone development limits and at least one set of negative tone development limits. In addition, during the first dual-tone development procedure at least one positive tone limit and/or at least one negative tone limit can be determined.

In 5750, the first threshold profile can be modified, if the first threshold profile exceeds one or more of the first set of limits, and a first protecting group in the resist material in the first patterned layer of exposed radiation-sensitive material can be de-protected during the modifying.

In 5760, the first patterned layer of exposed radiation-sensitive material can be developed, if the first threshold profile does not exceed at least one of the first set of limits.

In various embodiments, the reticle can include at least one of a phase-shift mask, a tri-tone mask, and a half-tone mask. In addition, the half-tone mask can include at least one of a sub-resolution pitch, a sub-resolution size, and mask edge spacing. Furthermore, the first activation group can be activated using at least one of thermal energy, optical energy, RF energy, DC energy, AC energy, UV energy, EUV energy, IR energy, chemical species, liquid, and a gas, and the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

In some embodiments, when the first patterned layer is being developed, the procedure can include: performing a negative development procedure to remove one or more of the high exposure (intensity) regions from the substrate using a first activation group, a first activation energy, and a first chemistry; and performing a positive development procedure to remove one or more of the low exposure (intensity) regions from the substrate using a second activation group, a second activation energy, and a second chemistry. During some procedures, a first post-exposure bake (PEB) of the substrate can be performed after exposing the layer of radiation-sensitive material using the first EM radiation. In addition, one or more post application bake (PAB) procedures may also be performed.

In other embodiments, when the first patterned layer is being developed, the procedure can include: performing a positive development procedure to remove one or more of the high exposure (intensity) regions from the substrate using a first activation group, a first activation energy, and a first chemistry; and performing a negative development procedure to remove one or more of the low exposure (intensity) regions from the substrate using a second activation group, a second activation energy, and a second chemistry.

In some embodiments, when the first threshold profile is being modified, the procedure can include: determining a first difference between the first threshold profile and a first limit; and applying first thermal activation energy (heat) to exposed resist material in the first patterned layer of exposed radiation-sensitive material to activate a first activation group thereby creating a first modified resist material, and the first thermal activation energy (heat) can be determined using at least one of the first difference, the polymer backbone, and the first number of activation groups, the first modified resist material having the polymer backbone and a different number of activation groups.

In other embodiments, when the first threshold profile is being modified, the procedure can include: determining a first difference between the first threshold profile and a first limit; and applying first optical signal power to exposed resist material in the first patterned layer of exposed radiation-sensitive material to activate a first activation group thereby creating a first modified resist material, and the first optical signal power can be determined using at least one of the first difference, the polymer backbone, and the first number of activation groups, the first modified resist material having the polymer backbone and a different number of activation groups.

For example, the first optical signal power can be provided by at least one of a single frequency source, multiple frequency source, a coherent source, a non-coherent source, a broadband source, a UV source, a EUV source, an IR source, a flood exposure source, and a visible light source.

In some other embodiments, when the first threshold profile is being modified, the procedure can include: determining a first difference between the first threshold profile and a first limit; and applying a first chemical solution to exposed resist material in the first patterned layer of exposed radiation-sensitive material to activate a first activation group thereby creating a first modified resist material, and the first chemical solution can be determined using at least one of the first difference, the polymer backbone, and the first number of activation groups, the first modified resist material having the polymer backbone and a different number of activation groups.

For example, the first chemical solution includes at least one of a developing solution (TMAH), a modified developing solution (TMAH and water), a de-blocking group, a de-protection group, a de-coupling group, and a cleaving group.

In still other embodiments, when the first patterned layer is being developed, the procedure can include: performing a positive development procedure to remove one or more of the high exposure (intensity) regions from the substrate using a first chemistry, a first activation group, and a first activation energy, and a first patterned layer of first modified resist material is created; determining a second threshold profile for a second dual-tone (negative tone or positive tone) development procedure; activating a second activation group in the first modified resist material to create a second modified resist material and to modify the second threshold profile, if the second threshold profile exceeds a second limit, and the second modified resist material has the polymer backbone and a second number of side groups; and performing a negative development procedure to remove one or more of the low exposure (intensity) regions from the substrate using a second chemistry, and a third patterned layer can include developed second modified resist material is created, if the second threshold profile does not exceed the second limit.

In additional embodiments, when the first patterned layer is being developed, the procedure can include: performing a negative development procedure to remove one or more of the high exposure (intensity) regions from the substrate using a first chemistry, a first activation group, and a first activation energy, and a first patterned layer of first modified resist material is created; determining a second threshold profile for a second dual-tone (negative tone or positive tone) development procedure; activating a second activation group in the first modified resist material to create a second modified resist material and to modify the second threshold profile, if the second threshold profile exceeds a second limit, and the second modified resist material has the polymer backbone and a second number of side groups; and performing a positive development procedure to remove one or more of the low exposure (intensity) regions from the substrate using a second chemistry, and a third patterned layer can include developed second modified resist material is created, if the second threshold profile does not exceed the second limit.

In some processing sequences, a protection layer can be deposited on top of the layer of radiation-sensitive material and the substrate, and the protection layer can be substantially transparent to the first EM radiation. In other processing sequences, an interface layer can be deposited between the layer of radiation-sensitive material and the substrate, and the interface layer can be substantially opaque to the first EM radiation. In addition, the protection layer and/or the interface layer can include an antireflective coating (ARC) material, a bottom antireflective coating (BARC) material, a top antireflective coating (TARC) material, a photo-active acid, a photo-active base, a de-blocking group, a de-protecting group, a leaving group, or an activation group, or any combination thereof.

When a semiconductor processing system is configured to pattern a substrate, the semiconductor processing system can include: a lithography system can be configured to form a layer of radiation-sensitive material on the substrate, and the layer of radiation-sensitive material can include a resist material having polymer backbone and a plurality of activation groups; an exposure system can be configured to create a first patterned layer of exposed radiation-sensitive material by exposing the layer of radiation-sensitive material using first EM radiation and a reticle/mask having a plurality of periodic features, the first patterned layer of exposed radiation-sensitive material can include a plurality of high exposure (intensity) regions, a plurality of medium exposure (intensity) regions, a plurality of low exposure (intensity) regions, and the exposure system is coupled to the lithography system; and a computer system can be configured to determine a first threshold profile for a first dual-tone (negative tone or positive tone) development procedure for the first patterned layer of exposed radiation-sensitive material and can be configured to determine a first set of limits for the first dual-tone development procedure, and the computer system is coupled to the exposure system and the lithography system; and the lithography system can be configured to activate a first activation group in the resist material in the first patterned layer of exposed radiation-sensitive material to modify the first threshold profile if the first threshold profile exceeds a first limit, and can be further configured to develop the first patterned layer of exposed radiation-sensitive material if the first threshold profile does not exceed the first limit.

When a computer readable medium is configured for the semiconductor processing system, the computer readable medium can contain program instructions for execution on a computer system coupled to a semiconductor processing system, which when executed by the computer system, cause the semiconductor processing system to perform a process, that can include: forming a layer of radiation-sensitive material on the substrate, and the layer of radiation-sensitive material can include a resist material having polymer backbone and a plurality of activation groups; creating a first patterned layer of exposed radiation-sensitive material by exposing the layer of radiation-sensitive material using first EM radiation and a mask/reticle having a plurality of periodic features, the first patterned layer of exposed radiation-sensitive material can include a plurality of high exposure (intensity) regions, a plurality of medium exposure (intensity) regions, a plurality of low exposure (intensity) regions; determining a first threshold profile for a first dual-tone (negative tone or positive tone) development procedure for the first patterned layer of exposed radiation-sensitive material; activating a first activation group in the resist material in the first patterned layer of exposed radiation-sensitive material to modify the first threshold profile if the first threshold profile exceeds a first limit; and developing the first patterned layer of exposed radiation-sensitive material if the first threshold profile does not exceed the first limit.

FIG. 58 illustrates an additional simplified flow diagram for a method of double patterning a substrate in accordance with embodiments of the invention, During procedure 5800, one or more substrates can be positioned on one or more substrate holders in one or more processing chambers for one or more lengths of time.

In 5810, a layer of radiation-sensitive material can be formed on at least one substrate, and the layer of radiation-sensitive material can include a resist material having polymer backbone and a first number of side groups.

In 5820, a first patterned layer of exposed radiation-sensitive material can be created by exposing the layer of radiation-sensitive material using first EM radiation and a reticle having a plurality of periodic features. In some examples, the first patterned layer of exposed radiation-sensitive material can include a plurality of high intensity regions, a plurality of medium intensity regions, and a plurality of low intensity regions. In other examples, the first patterned layer of exposed radiation-sensitive material can include a plurality of high exposure regions, a plurality of medium exposure regions, and a plurality of low exposure regions.

In 5830, a first threshold profile for a first dual-tone (negative tone or positive tone) development procedure for the first patterned layer of exposed radiation-sensitive material can be determined. For example, the first dual-tone development procedure can include at least one positive tone development procedure and at least one negative tone development procedure, and these procedures can be used in any order. In addition, during the first dual-tone development procedure at least one positive tone threshold and/or at least one negative tone threshold can be determined.

In 5840, a first simulated (predicted) profile can be established for a first dual-tone (negative tone or positive tone) development procedure for the first patterned layer of exposed radiation-sensitive material. For example, the first dual-tone development procedure can be simulated and/or modeled; one or more positive tone development procedures can be simulated and/or modeled; and one or more negative tone development procedure can be simulated and/or modeled. In addition, during the first dual-tone development procedure at least one positive tone resist, at least one negative tone resist, and/or at least one dual-tone resist can be simulated and/or modeled.

In 5850, a first set of limits can be determined for the first dual-tone (negative tone or positive tone) development procedure using the first simulated (predicted) profile. For example, the first dual-tone development procedure can include at least one set of dual-tone development limits, at least one set of positive tone development limits, and/or at least one set of negative tone development limits. In addition, during the first dual-tone development procedure at least one dual-tone limit, at least one positive tone limit, and/or at least one negative tone limit can be determined.

In 5860, the first threshold profile can be modified, if the first threshold profile exceeds a first limit of the first set of limits, and a first side group in the resist material in the first patterned layer of exposed radiation-sensitive material is modified during the modifying.

In 5870, the first patterned layer of exposed radiation-sensitive material can be developed, if the first threshold profile does not exceed the first limit.

In various embodiments, the reticle/mask can include at least one of a phase-shift mask, a tri-tone mask, and a half-tone mask. In addition, the half-tone mask can include at least one of a sub-resolution pitch, a sub-resolution size, and mask edge spacing. Furthermore, the first side group can be modified using at least one of thermal energy source, optical energy source, RF energy source, DC energy source, AC energy source, UV energy source, EUV energy source, IR energy source, chemical species source, liquid source, and a gas source, and the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

In some embodiments, when the first patterned layer is being developed, the procedure can include: performing a negative development procedure to remove one or more of the high exposure (intensity) regions from the substrate using a first side group, a first modification source (energy), and a first chemistry; and performing a positive development procedure to remove one or more of the low exposure (intensity) regions from the substrate using a second side group, a second modification source (energy), and a second chemistry. During some procedures, a one or more post-exposure bake (PEB) procedures of the substrate can be performed after exposing the layer of radiation-sensitive material using the first EM radiation. In addition, one or more post application bake (PAB) procedures may also be performed.

In other embodiments, when the first patterned layer is being developed, the procedure can include: performing a positive development procedure to remove one or more of the high exposure (intensity) regions from the substrate using a first side group, a first modification source (energy), and a first chemistry; and performing a negative development procedure to remove one or more of the low exposure (intensity) regions from the substrate using a second side group, a second modification source (energy), and a second chemistry.

In some embodiments, when the first threshold profile is being modified, the procedure can include: determining a first difference between the first threshold profile and a first limit; and applying first thermal modification energy (heat) to exposed resist material in the first patterned layer of exposed radiation-sensitive material to modify a first side group thereby creating a first modified resist material, and the first thermal modification energy (heat) can be determined using at least one of the first difference, the polymer backbone, and the first number of side groups, the first modified resist material having the polymer backbone and a number of modified side groups.

In other embodiments, when the first threshold profile is being modified, the procedure can include: determining a first difference between the first threshold profile and a first limit; and applying first optical signal power to exposed resist material in the first patterned layer of exposed radiation-sensitive material to modify a first side group thereby creating a first modified resist material, and the first optical signal power can be determined using at least one of the first difference, the polymer backbone, and the first number of side groups, the first modified resist material having the polymer backbone and a number of modified side groups.

For example, the first optical signal power can be provided by at least one of a single frequency source, multiple frequency source, a coherent source, a non-coherent source, a broadband source, a UV source, a EUV source, an IR source, a flood exposure source, and a visible light source.

In some other embodiments, when the first threshold profile is being modified, the procedure can include: determining a first difference between the first threshold profile and a first limit; and applying a first chemical solution to exposed resist material in the first patterned layer of exposed radiation-sensitive material to modify a first side group thereby creating a first modified resist material, and the first chemical solution can be determined using at least one of the first difference, the polymer backbone, and the first number of side groups, the first modified resist material having the polymer backbone and a number of modified side groups.

For example, the first chemical solution can include at least one of a developing solution (TMAH), a modified developing solution (TMAH and water), a de-blocking group, a de-protection group, a de-coupling group, and a cleaving group.

In still other embodiments, when the first patterned layer is being developed, the procedure can include: performing a positive development procedure to remove one or more of the high exposure (intensity) regions from the substrate using a first side group, a first modification source (energy), and a first chemistry, and a first patterned layer of first modified resist material is created; determining a second threshold profile for a second dual-tone (negative tone or positive tone) development procedure; modifying a second side group in the first modified resist material to create a second modified resist material and to modify the second threshold profile, if the second threshold profile exceeds a second limit, and the second modified resist material has the polymer backbone, a second number of side groups, and a second number of modified side groups; and performing a negative development procedure to remove one or more of the low exposure (intensity) regions from the substrate using a second chemistry, and a third patterned layer can include developed second modified resist material is created, if the second threshold profile does not exceed the second limit.

In additional embodiments, when the first patterned layer is being developed, the procedure can include: performing a negative development procedure to remove one or more of the high exposure (intensity) regions from the substrate using a first side group, a first modification source (energy), and a first chemistry, and a first patterned layer of first modified resist material is created; determining a second threshold profile for a second dual-tone (negative tone or positive tone) development procedure; modifying a second side group in the first modified resist material to create a second modified resist material and to modify the second threshold profile, if the second threshold profile exceeds a second limit, and the second modified resist material has the polymer backbone, a second number of side groups, and a second number of modified side groups; and performing a positive development procedure to remove one or more of the low exposure (intensity) regions from the substrate using a second chemistry, and a third patterned layer can include developed second modified resist material is created, if the second threshold profile does not exceed the second limit.

In some processing sequences, a protection layer can be deposited on top of the layer of radiation-sensitive material and the substrate, and the protection layer is substantially transparent to the first EM radiation. In other processing sequences, an interface layer can be deposited between the layer of radiation-sensitive material and the substrate, and the interface layer is substantially opaque to the first EM radiation.

In addition, the protection layer and/or the interface layer can include an antireflective coating (ARC) material, a bottom antireflective coating (BARC) material, a top antireflective coating (TARC) material, a photo-active acid, a photo-active base, a blocking group, a de-blocking group, a protecting group, a de-protecting group, a leaving group, or an activation group, or any combination thereof.

When a semiconductor processing system is configured to pattern a substrate, the semiconductor processing system can include: a lithography system configured to form a layer of radiation-sensitive material on the substrate, and the layer of radiation-sensitive material can include a resist material having polymer backbone and a first number of side groups; an exposure system configured to create a first patterned layer of exposed radiation-sensitive material by exposing the layer of radiation-sensitive material using first EM radiation and a reticle having a plurality of periodic features, the first patterned layer of exposed radiation-sensitive material can include a plurality of high exposure (intensity) regions, a plurality of medium exposure (intensity) regions, a plurality of low exposure (intensity) regions, and the exposure system is coupled to the lithography system; and a computer system configured to determine a first threshold profile for a first dual-tone (negative tone or positive tone) development procedure for the first patterned layer of exposed radiation-sensitive material, configured to establish a first simulated (predicted) profile for a first dual-tone (negative tone or positive tone) development procedure for the first patterned layer of exposed radiation-sensitive material, and further configured to determine a first set of limits for the first dual-tone (negative tone or positive tone) development procedure using the first simulated (predicted) profile, the computer system being coupled to the exposure system and the lithography system, and the lithography system is configured to modify the first threshold profile if the first threshold profile exceeds a first limit of the first set of limits, and a first side group in the resist material in the first patterned layer of exposed radiation-sensitive material is modified during the modifying, and is further configured to develop the first patterned layer of exposed radiation-sensitive material if the first threshold profile does not exceed the first limit.

When a computer readable medium is configured for the semiconductor processing system, the computer readable medium can contain program instructions for execution on a computer system coupled to a semiconductor processing system, which when executed by the computer system, cause the semiconductor processing system to perform a process, that can include: creating a first patterned layer of exposed radiation-sensitive material by exposing the layer of radiation-sensitive material using first EM radiation and a reticle having a plurality of periodic features, the first patterned layer of exposed radiation-sensitive material can include a plurality of high exposure (intensity) regions, a plurality of medium exposure (intensity) regions, a plurality of low exposure (intensity) regions; determining a first threshold profile for a first dual-tone (negative tone or positive tone) development procedure for the first patterned layer of exposed radiation-sensitive material; establishing a first simulated (predicted) profile for a first dual-tone (negative tone or positive tone) development procedure for the first patterned layer of exposed radiation-sensitive material; determining a first set of limits for the first dual-tone (negative tone or positive tone) development procedure using the first simulated (predicted) profile; modifying the first threshold profile if the first threshold profile exceeds a first limit of the first set of limits, and a first side group in the resist material in the first patterned layer of exposed radiation-sensitive material is modified during the modifying; and developing the first patterned layer of exposed radiation-sensitive material if the first threshold profile does not exceed the first limit.

Figure 59A:
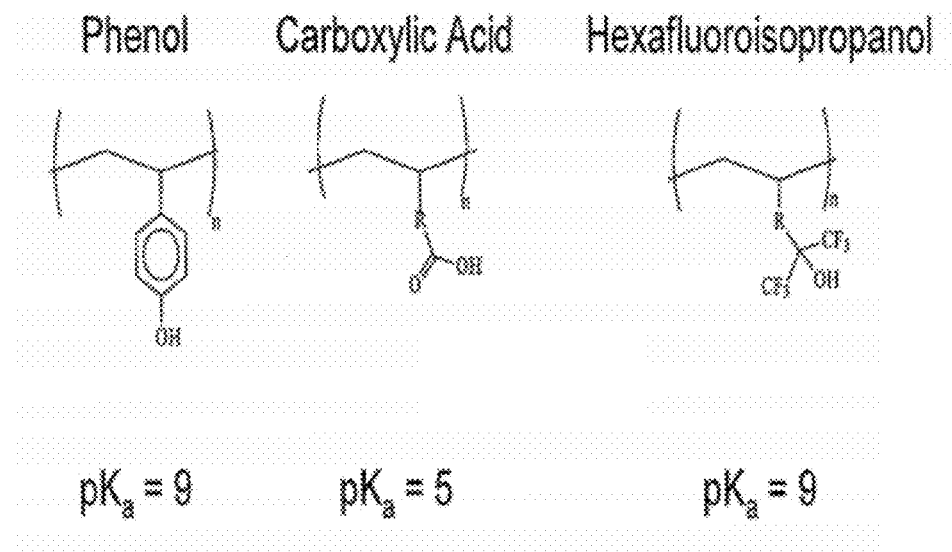
FIG. 59A and FIG. 59B illustrate exemplary views of simplified polymers in accordance with embodiments of the invention.
Figure 59B:
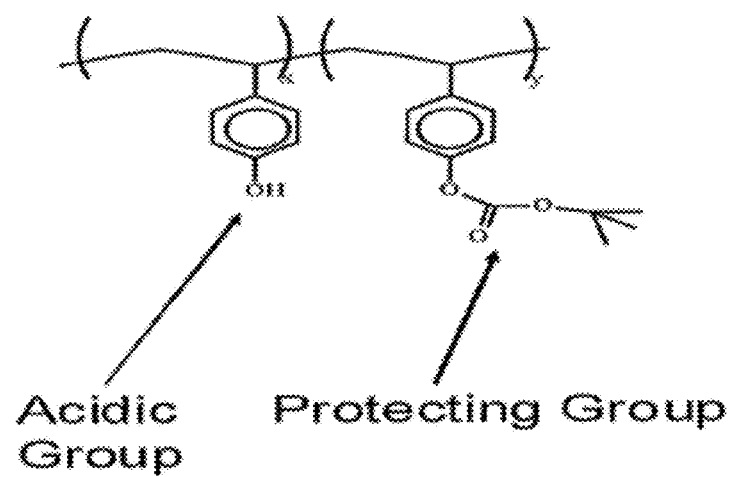

FIG. 59A and FIG. 59B illustrate exemplary views of simplified polymers in accordance with embodiments of the invention. FIG. 59A illustrates a simplified view of a "Phenol", a "Carboxylic Acid", and a "Hexafluoroisopropanol". FIG. 59B illustrates a simplified view of an "Acidic Group" and a "Protecting Group". "Acidic" in organic polymers can be described by a functionality's pKa; the lower the pKa, the more acidic the functionality. Carboxylic Acids are the most acidic functionalities that typically appear in photoresist, and they have acidity approximately the same as acetic acid (which is pretty weak when compared to HCl or other strong acids). These acidic functionalities impart different dissolution behavior to photoresist polymers; typically carboxylic acids dissolve the fastest because they are the most acidic. Most chemically amplified resist systems for both positive and negative tone development function on a de-protection mechanism. This is illustrated in FIG. 59B where the acidic group (i.e. de-protected functionality) is a phenol. In any real resist, there is a combination of protected and de-protected groups, the polymer will dissolve in aqueous base at some level of de-protection (labeled x in FIG. 59B). The type of acidic functionality can have a dramatic impact on the positive tone dissolution threshold. The nature of the acidic functionality on the negative tone process is not as well understood, but presumably since the method for solvation is based on polarity and not acidity, the negative tone development threshold will have less dependence on the acidic functionality.

Figure 60A:
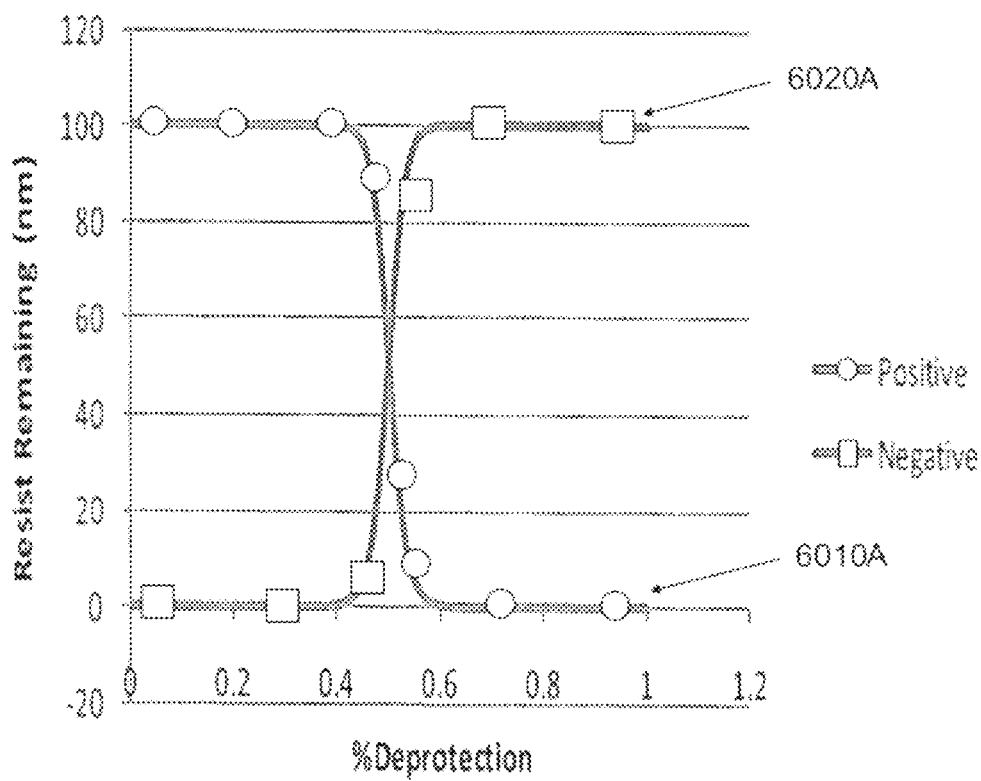
FIGS. 60A-60C illustrate simplified views of exemplary process results in accordance with embodiments of the invention.
Figure 60B:
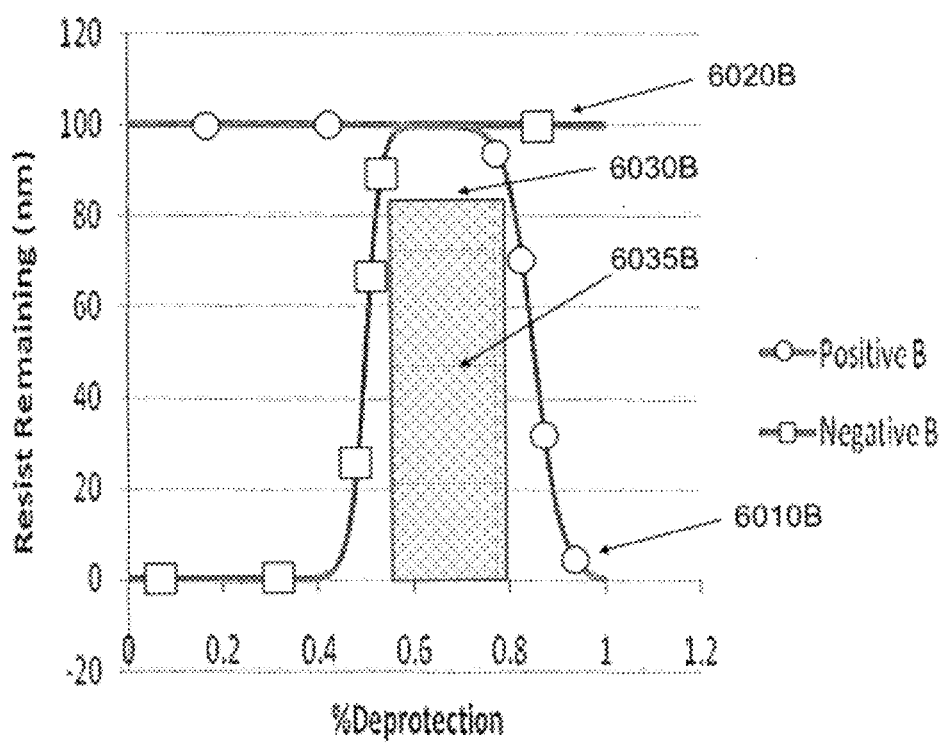
Figure 60C:
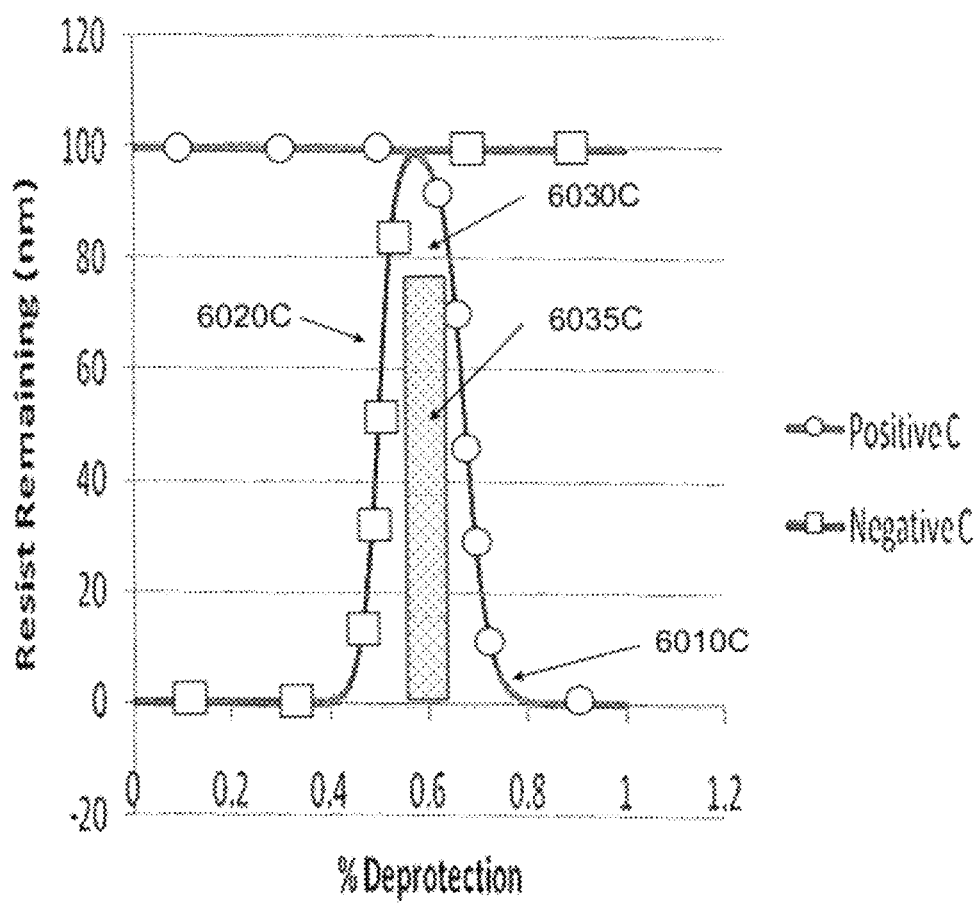

FIGS. 60A-60C illustrate simplified views of exemplary process results in accordance with embodiments of the invention. FIG. 60A illustrates a simplified view of a first set of simulation results 6000A that include a simulated positive tone response curve 6010A and a simulated negative tone response curve 6020A. In addition, the first set of simulation results 6000A do not have an overlap area and therefore could not be used in a dual-tone development procedure.

For good dual tone imaging, it is necessary to have an area of dissolution overlap where both the positive and negative tone dissolution rates are very low. In this area, the resist will stand up to both development processes and resist features will remain. Experimental results are shown in FIG. 60A where there is very limited overlap between the positive and negative processes. In this instance, the resist is almost completely developed way by either the positive tone process or the negative tone process.

FIG. 60B illustrates a simplified view of a second set of simulation results 6000B that include a second simulated positive tone response curve 6010B and a second simulated negative tone response curve 6020B. In addition, the second set of simulation results 6000B do have an overlap area 6030B and therefore can be used to create a suboptimal feature 6035B in a dual-tone development procedure.

FIG. 60C illustrates a simplified view of a third set of simulation results 6000C that include a third simulated positive tone response curve 6010C and a third simulated negative tone response curve 6020C. In addition, the third set of simulation results 6000C do have a smaller overlap area 6030C and therefore can be used to create an optimized feature 6035C in a dual-tone development procedure.

FIG. 60B and FIG. 60C show examples of how the inventors can improve the development overlap using dual acidic functionalities. Consider polymer A with one kind of functionality that leads to behavior such as illustrated in FIG. 60B, and polymer B has a different kind of acidic functionality such that the dissolution behavior appears as in FIG. 60C.

In this case, the positive tone threshold has been shifted to the right because of the different acidic functionality while the negative tone behavior has been keep the same as in Polymer A because the thermodynamic behavior controlling the negative behavior may not be changed by the change in the acidic functionality. Note that this polymer itself has the desired overlap behavior that we are looking for in terms of the overlap of positive and negative tone dissolution behavior. However, it may have some other issue (like defectivity) that precludes it from being used in the system.

If a third polymer, Polymer C, has been synthesized such that it has both acidic functionalities on it, the location of the positive and negative tone dissolution thresholds is expected to be a weighted average of that for Polymers A and B. For positive tone, the threshold for Polymer A is 0.5 and for Polymer B is 0.85 such that the threshold or Polymer C is 0.675. The negative tone threshold has not been changed in this case since Polymers A and B had the same negative tone thresholds. The resulting dual tone dissolution behavior is given in FIG. 60C.

A comparison of FIG. 60C with FIG. 60A shows a clear improvement in the overlap of the dissolution processes such that Polymer C has a much better dual-tone imaging behavior than does Polymer A. The inventors believe that this polymer might also have a blending of properties such that the behavior that would keep us from using Polymer B in the system might be overcome.

The inventors know that the Dual Tone Development depends on having good overlap of positive tone and negative tone development processes, and the inventors have developed novel techniques to control this overlap by controlling the de-protection threshold where the positive tone and negative tone development processes turn on.

The inventors have established novel techniques, presented herein, for creating, measuring, simulating, and optimizing resist features such as the optimized feature 6035C as shown in FIG. 60C. The inventors have established other novel techniques, presented herein, for creating, measuring, simulating, and optimizing the overlap region such as the optimized area 6030C as shown in FIG. 60C. The inventors have established other novel techniques, presented herein, for creating, measuring, simulating, and optimizing positive tone curves and negative tone curves such as the optimized curves (6010C and 6020C) as shown in FIG. 60C. The inventors have established other additional novel techniques, presented herein, for creating, measuring, simulating, and optimizing the mask/reticule features, the dual-tone metrology targets, the dual-tone process windows, and the dual-tone resist materials associated with the fabrication of the optimized features such as the optimized features 6035C as shown in FIG. 60C. Furthermore, the inventors have established novel techniques, presented herein, for creating, measuring, simulating, verifying and optimizing dual-tone development procedures that use radiation-sensitive acid groups and radiation-sensitive base groups to create resist features such as the optimized feature 6035C as shown in FIG. 60C.

FIG. 61 illustrates an additional simplified flow diagram for a method of double patterning a substrate in accordance with embodiments of the invention. During procedure 6100, one or more substrates can be positioned on one or more substrate holders in one or more processing chambers for one or more lengths of time.

In 6110, a layer of radiation-sensitive material can be formed on the substrate, and the layer of radiation-sensitive material can include a dual-tone resist material. For example, the dual-tone resist can include a polymer backbone and a plurality of protecting groups.

In 6120, a first patterned layer can be created using a positive tone development procedure and the layer of radiation-sensitive material. For example, the first patterned layer can include a plurality of first (developed) trench (space) regions and a plurality of isolation features that can include first radiation-sensitive material.

In 6130, a second patterned layer can be created using a negative tone development procedure and the first patterned layer. For example, the second patterned layer can include the first (developed) trench (space) regions, a plurality of second (developed) trench (space) regions, a plurality of first isolation features, and a plurality of second isolation regions. In addition, the first isolation features and the second isolation features can include second radiation-sensitive material.

In 6140, first verification data can be obtained for at least one of the first (developed) trench (space) regions, the first isolation features, the second (developed) trench (space) regions, and the second isolation features. In various embodiments, the verification data can include at least one of: de-protection data, feature thickness data, profile data, sidewall angle data, feature height data, exposure data, intensity data, contrast data, concentration data, resist material data, protecting group data, polymer data, de-protection data, thermal data, chemical data, rinsing data, EM radiation data, dual-tone metrology target data, defect data, uniformity data, developer data, and optical data.

In 6140, first verification data can be obtained for at least one of the first (developed) trench (space) regions, the first isolation features, the second (developed) trench (space) regions, and the second isolation features. In various embodiments, the verification data can include at least one of: de-protection data, feature thickness data, profile data, sidewall angle data, feature height data, exposure data, intensity data, contrast data, concentration data, resist material data, protecting group data, polymer data, de-blocking data, thermal data, chemical data, rinsing data, EM radiation data, dual-tone metrology target data, defect data, uniformity data, developer data, and optical data.

In 6150, the dual-tone resist material can be modified by changing at least one of a polymer material, a polymer blend, a polymer percent, a polymer average, and a number of protecting groups, a number of de-protected groups, if the first verification data exceeds a first verification limit. In various embodiments, the verification limit data can include at least one of: de-protection data limits, feature thickness data limits, profile data limits, sidewall angle data limits, feature height data limits, exposure data limits, intensity data limits, contrast data limits, concentration data limits, resist material data limits, protecting group data limits, polymer data limits, de-blocking data limits, thermal data limits, chemical data limits, rinsing data limits, EM radiation data limits, dual-tone metrology target data limits, defect data limits, uniformity data limits, developer data limits, and optical data limits.

In 6160, the positive tone development procedure and the negative tone development procedure can be identified as verified procedures, if the first verification data does not exceed the first verification limit. In addition, the verification data can be identified as verified data and can be stored in a real-time and/or historical library (database), and the process window data can be verified and stored. Furthermore, the positive tone and negative tone response curves can be verified, and the dual-tone targets can be verified. For example, the dual-tone resist material can be identified as a verified dual-tone resist material having the correct polymer blend.

In some procedures, modifying the dual-tone resist material can include: forming a new layer of new radiation-sensitive material on the substrate using the modified dual-tone resist material; creating a new first patterned layer using a new positive tone development procedure and the new layer of new radiation-sensitive material, wherein the new first patterned layer includes a plurality of new first (developed) trench (space) regions and a plurality of new isolation features comprising new first radiation-sensitive material; creating a new second patterned layer using a new negative tone development procedure and the new first patterned layer, wherein the new second patterned layer includes the new first (developed) trench (space) regions, a plurality of new second (developed) trench (space) regions, a plurality of new first isolation features, and a plurality of new second isolation regions, wherein the new first isolation features and the new second isolation features comprise new second radiation-sensitive material; obtaining new verification data for at least one of the new first (developed) trench (space) regions, the new first isolation features, the new second (developed) trench (space) regions, and the new second isolation features; identifying the new positive tone development procedure and the new negative tone development procedure as new verified procedures, if the new verification data does not exceed a new verification limit; and performing at least one corrective action, if the new verification data exceeds the new verification limit.

In other procedures, modifying the dual-tone resist material can include: simulating a new layer of new radiation-sensitive material on the substrate using a simulation model for the modified dual-tone resist material; simulating the creation of a new first patterned layer using a new positive tone development procedure and the new layer of new radiation-sensitive material, wherein the new first patterned layer includes a plurality of new first (developed) trench (space) regions and a plurality of new isolation features comprising new first radiation-sensitive material; simulating the creation of a new second patterned layer using a new negative tone development procedure and the new first patterned layer, wherein the new second patterned layer includes the new first (developed) trench (space) regions, a plurality of new second (developed) trench (space) regions, a plurality of new first isolation features, and a plurality of new second isolation regions, wherein the new first isolation features and the new second isolation features comprise new second radiation-sensitive material; obtaining simulated verification data for at least one of the new first (developed) trench (space) regions, the new first isolation features, the new second (developed) trench (space) regions, and the new second isolation features; identifying the simulated positive tone development procedure and the simulated negative tone development procedure as verified simulation procedures, if the simulated verification data does not exceed a simulated verification limit; and performing at least one corrective action, if the simulated verification data exceeds the simulated verification limit. In various descriptions of the invention the word "new" is used, and this can mean that the new item is the same or different than the item previously referred to.

In some additional procedures, modifying the dual-tone resist material can include changing the polymer material by incorporating multiple acidic functionality monomers within the polymer backbone itself to change dissolution behavior of the positive tone, the negative tone, or the dissolution overlap in a dual tone system.

In other additional procedures, modifying the dual-tone resist material can include using a blend of a multiple polymers with different acidic functionalities to induce change in the dissolution behavior of the positive tone, the negative tone, or the dissolution overlap in a dual tone system.

In still other additional procedures, modifying the dual-tone resist material can include using a blend of multiple polymers, each with the possibility of having multiple acidic functionalities, to induce change in the dissolution behavior of the positive tone, the negative tone, or the dissolution overlap in a dual tone system.

In some other embodiments, a semiconductor processing system can be used to pattern a substrate using a dual-tone (D-T) processing sequence, and the system can include a lithography system configured to form a layer of radiation-sensitive material on the substrate, wherein the layer of radiation-sensitive material comprises a dual-tone resist material; and further configured to create a first patterned layer using a positive tone development procedure and the layer of radiation-sensitive material, wherein the first patterned layer includes a plurality of first (developed) trench (space) regions and a plurality of isolation features comprising first radiation-sensitive material, and also configured to create a second patterned layer using a negative tone development procedure and the first patterned layer, wherein the second patterned layer includes the first (developed) trench (space) regions, a plurality of second (developed) trench (space) regions, a plurality of first isolation features, and a plurality of second isolation regions, wherein the first isolation features and the second isolation features comprise second radiation-sensitive material; and a computer system configured to obtain first verification data for at least one of the first (developed) trench (space) regions, the first isolation features, the second (developed) trench (space) regions, and the second isolation features, wherein the lithography system is coupled to the computer system and is further configured to modify the dual-tone resist material by changing at least one of a polymer material, a polymer blend, a polymer percent, a polymer average, a number of protecting groups, a number of de-protected groups, if the first verification data exceeds a first verification limit; and the computer system is further configured to identify the positive tone development procedure and the negative tone development procedure as verified procedures, if the first verification data does not exceed the first verification limit.

In some processing sequences, a protection layer can be deposited on top of the layer of radiation-sensitive material and the substrate, and the protection layer can be substantially transparent to the first EM radiation. In other processing sequences, an interface layer can be deposited between the layer of radiation-sensitive material and the substrate, and the interface layer can be substantially non-reflective to the first EM radiation. When the protection layer and/or the interface layer are present, the verification data can include ARC material data, BARC material data, and/or TARC material data.

Although only certain embodiments of this invention have been described in detail above, those skilled in the art will readily appreciate that many modifications are possible in the embodiments without materially departing from the novel teachings and advantages of this invention. For example, several embodiments are described herein that use a single exposure of a layer of radiation-sensitive material to a pattern of radiation. However, a plurality of exposures may be utilized. Accordingly, all such modifications are intended to be included within the scope of this invention.

What is claimed is:

1. A method of patterning a substrate using a dual-tone (D-T) processing sequence, comprising:
    forming a layer of radiation-sensitive material on the substrate, wherein the layer of radiation-sensitive material comprises a dual-tone (D-T) resist material having a plurality of radiation-sensitive positive tone groups and a plurality of radiation-sensitive negative tone groups attached to a polymer backbone;
    creating a first patterned layer of exposed radiation-sensitive material by exposing the layer of radiation-sensitive material using first EM radiation and a reticle having a first set of masking features, and heating the first patterned layer of exposed radiation-sensitive material to create a plurality of high exposure regions, a plurality of medium exposure regions, and a plurality of low exposure regions;
    determining a first threshold profile for a first dual-tone development procedure using at least one of the high exposure regions in the first patterned layer of exposed radiation-sensitive material;
    determining a first set of simulated limits for the first dual-tone development procedure for the first patterned layer;
    modifying the first threshold profile, if the first threshold profile exceeds at least one of the first set of simulated limits; and
    developing the first patterned layer of exposed radiation-sensitive material, if the first threshold profile does not exceed at least one of the first set of simulated limits.

2. The method of claim 1, wherein modifying the first threshold profile, further comprises:
    creating a new dual-tone (D-T) resist material having at least one of a new radiation-sensitive positive tone group, a new radiation-sensitive negative tone group, and a new polymer backbone;
    forming a new layer of new radiation-sensitive material on the substrate using the new (D-T) resist material;
    creating a new patterned layer of new exposed radiation-sensitive material by exposing the new layer of new radiation-sensitive material using the first EM radiation and the reticle having a having the first set of masking features, and heating the new patterned layer to create a plurality of new high exposure regions, a plurality of new medium exposure regions, and a plurality of new low exposure regions;

determining a new threshold profile for a new dual-tone development procedure using at least one of the new high exposure regions in the new patterned layer of new exposed radiation-sensitive material;

determining a new set of simulated limits for the new dual-tone development procedure for the new patterned layer of new exposed radiation-sensitive material;

modifying the new threshold profile, if the new threshold profile exceeds at least one of the new set of simulated limits; and developing the new patterned layer of new exposed radiation-sensitive material, if the new threshold profile does not exceed at least one of the new set of simulated limits.

3. The method of claim 1 further comprising:

creating a second patterned layer on the substrate by developing the first patterned layer of exposed radiation-sensitive material;

determining a second threshold profile for a second dual-tone development procedure using at least one of the low exposure regions in the second patterned layer;

determining a second set of simulated limits for the second dual-tone development procedure for the second patterned layer;

modifying the second threshold profile, if the second threshold profile exceeds at least one of the second set of simulated limits; and developing the second patterned layer, if the second threshold profile does not exceed at least one of the second set of simulated limits.

4. A method of patterning a substrate, comprising:

forming a layer of radiation-sensitive material on the substrate, wherein the layer of radiation-sensitive material comprises a dual-tone (D-T) resist material having a polymer backbone and a plurality of protecting groups;

forming a protection layer on the layer of radiation-sensitive material on the substrate, wherein the protection layer includes at least one activation component;

creating a first patterned layer of exposed radiation-sensitive material by exposing the layer of radiation-sensitive material through the protection layer using first EM radiation and a reticle having a plurality of masking features, and heating the first patterned layer to create a plurality of high intensity regions, a plurality of medium intensity regions, and a plurality of low intensity regions;

determining a first threshold profile for a first dual-tone development procedure using at least one of the high intensity regions;

establishing a first limit using a first simulated threshold profile for the first dual-tone development procedure using at least one of the high intensity regions;

activating the protection layer to create a modified patterned layer having a modified threshold profile, if the first threshold profile exceeds the first limit, wherein the modified patterned layer includes modified (D-T) resist material; and developing the first patterned layer, if the first threshold profile does not exceed the first limit.

5. The method of claim 4, wherein activating the protection layer further comprises:

determining a first difference between the first threshold profile and the first limit; and applying first activation energy to the protection layer, wherein the first activation energy is determined using at least one of the first difference, the polymer backbone, the plurality of protecting groups, an intensity, an exposure level, and a concentration, and the first activation energy includes at least one of thermal energy, optical signal energy, EM radiation, chemical energy, and time.

6. The method of claim 4, wherein the developing the first patterned layer further comprises:

performing a positive development procedure to remove one or more of the high intensity regions from the substrate using a first chemistry;

determining a second threshold profile for a second dual-tone development procedure;

activating the protection layer to modify the second threshold profile, if the second threshold profile exceeds a second limit; and performing a negative development procedure to remove one or more of the low intensity regions from the substrate using a second chemistry, if the second threshold profile does not exceed the second limit.

7. A method of patterning a substrate, comprising:

forming an interface layer on the substrate, wherein the interface layer includes at least one activation component;

forming a layer of radiation-sensitive material on the interface layer on the substrate, wherein the layer of radiation-sensitive material comprises a dual-tone (D-T) resist material having a polymer backbone and a plurality of protecting groups;

creating a first patterned layer by exposing the layer of radiation-sensitive material using the interface layer, first EM radiation, and heating the first patterned layer to create a plurality of high intensity regions, a plurality of medium intensity regions, and a plurality of low intensity regions;

determining a first threshold profile for a first dual-tone development procedure using at least one of the high intensity regions;

establishing a first limit using a first simulated threshold profile for the first dual-tone development procedure using at least one of the high intensity regions;

activating the interface layer to create a modified patterned layer having a modified threshold profile, if the first threshold profile exceeds the first limit, wherein the modified patterned layer includes modified (D-T) resist material; and developing the first patterned layer of radiation-sensitive material if the first threshold profile does not exceed the first limit.

8. The method of claim 7, wherein activating the interface layer further comprises:

determining a first difference between the first threshold profile and the first limit; and applying first activation energy to the interface layer, wherein the first activation energy is determined using at least one of the first difference, the polymer backbone, the plurality of protecting groups, an intensity, an exposure level, and a concentration, and the first activation energy includes at least one of thermal energy, optical signal energy, EM radiation, chemical energy, and time.

9. The method of claim 7, wherein the developing the first patterned layer further comprises:

performing a positive development procedure to remove one or more of the high intensity regions from the substrate using a first chemistry;

determining a second threshold profile for a second dual-tone development procedure;

activating the interface layer to modify the second threshold profile, if the second threshold profile exceeds a second limit; and performing a negative development procedure to remove one or more of the low intensity regions from the substrate using a second chemistry, if the second threshold profile does not exceed the second limit.

10. A method of patterning a substrate using a dual-tone (D-T) processing sequence, comprising:

forming a layer of radiation-sensitive material on the substrate, wherein the layer of radiation-sensitive material comprises a dual-tone (D-T) resist material having a plurality of radiation-sensitive acid components and a plurality of radiation-sensitive base components attached to a polymer backbone;

creating a first patterned layer of exposed radiation-sensitive material by exposing the layer of radiation-sensitive material using first EM radiation and a first reticle, and heating the first patterned layer of exposed radiation-sensitive material to create a plurality of high concentration regions, a plurality of medium concentration regions, and a plurality of low concentration regions;

determining a first threshold profile for a first dual-tone development procedure using at least one of the high concentration regions in the first patterned layer of exposed radiation-sensitive material;

establishing a first simulated dual-tone profile for a first positive tone development procedure in the first dual-tone development procedure for the first patterned layer of exposed radiation-sensitive material;

determining a first limit for the first positive tone development procedure in a dual-tone development procedure for the first patterned layer of exposed radiation-sensitive material using the first simulated dual-tone profile;

performing additional procedures in the (D-T) processing sequence, if the first threshold profile does not exceed the first limit; and performing at least one corrective action, if the first threshold profile exceeds the first limit.

11. The method of claim 10, wherein performing the at least one corrective action, further comprises:

forming a new layer of radiation-sensitive material on the substrate, wherein the new layer of radiation-sensitive material comprises a new dual-tone (D-T) resist material having a plurality of new radiation-sensitive acid components and a plurality of new radiation-sensitive base components attached to a new polymer backbone;

creating a new patterned layer of new exposed radiation-sensitive material by exposing the new layer of radiation-sensitive material using new EM radiation and a new reticle having a new set of resolution-enhancement features, the new patterned layer of new exposed radiation-sensitive material comprising a plurality of new high concentration regions, a plurality of new medium concentration regions, and a plurality of new low concentration regions;

determining a new threshold profile for a new dual-tone development procedure using at least one of the new high concentration regions in the new patterned layer of new exposed radiation-sensitive material;

establishing a new simulated dual-tone profile for a new positive tone development procedure in the new dual-tone development procedure for the new patterned layer of new exposed radiation-sensitive material;

determining a new limit for the new positive tone development procedure in the new dual-tone development procedure for the new patterned layer of new exposed radiation-sensitive material using the new simulated dual-tone profile;

performing new additional procedures in the (D-T) processing sequence, if the new threshold profile does not exceed the new limit; and performing at least one new corrective action, if the new threshold profile exceeds the first limit.

12. The method of claim 10, wherein performing the additional procedures in the (D-T) processing sequence, further comprises:

creating a second patterned layer on the substrate by developing the first patterned layer of exposed radiation-sensitive material, wherein the first positive tone development procedure in the dual-tone development procedure is performed, the second patterned layer comprising a plurality of removed regions, a plurality of partially-removed regions, and a plurality of new low concentration regions;

determining a second dual-tone (D-T) threshold profile using at least one of the new low concentration regions in the second patterned layer of partially-developed radiation-sensitive material;

establishing a second simulated dual-tone profile for a first negative tone development procedure in the dual-tone development procedure for the second patterned layer of partially-developed radiation-sensitive material;

determining a second limit for the first negative tone development procedure in the dual-tone development procedure for the second patterned layer using the second simulated dual-tone profile;

performing the first negative tone development procedure in the (D-T) processing sequence, if the second (D-T) threshold profile does not exceed the second limit; and performing at least one second corrective action, if the second (D-T) threshold profile exceeds the second limit.

13. A method of patterning a substrate, using a dual-tone (D-T) processing sequence, comprising:

forming a layer of radiation-sensitive material on the substrate, wherein the layer of radiation-sensitive material comprises a Dual-Tone (D-T) resist material having a plurality of protecting groups attached to a polymer backbone;

creating a first patterned layer of radiation-sensitive material by exposing the layer of radiation-sensitive material using first EM radiation and a first reticle having a first set of masking features, and heating the first patterned layer to create a plurality of high concentration regions having a first number of de-protected groups, a plurality of medium concentration regions having a second number of de-protected groups, a plurality of low concentration regions having a third number of de-protected groups;

determining a first threshold profile for a first dual-tone (D-T) development procedure for the first patterned layer using at least one of the high concentration regions and at least one of the low concentration regions;

establishing a first limit using a first simulated threshold profile for the first (D-T) development procedure using at least one of the high concentration regions and at least one of the low concentration regions;

performing at least one rinsing procedure to de-protect at least one protecting group in the (D-T) resist material in the first patterned layer of radiation-sensitive material and to create a modified patterned layer having a modified threshold profile, if the first threshold profile exceeds the first limit; and developing the first patterned layer of radiation-sensitive material using a first chemistry, if the first threshold profile does not exceed the first limit.

14. The method of claim 13, wherein performing the at least one rinsing procedure, further comprises:
applying a first rinsing solution to the (D-T) resist material in the first patterned layer of radiation-sensitive material to create the modified patterned layer having the modified threshold profile;
determining a new difference between the modified threshold profile and the first limit; and
applying additional de-protection energy to the modified patterned layer, wherein the additional de-protection energy is determined using at least one of a first difference, the polymer backbone, the plurality of protecting groups, an intensity, an exposure level, and a concentration, and the additional de-protection energy includes at least one of thermal energy, optical signal energy, EM radiation, chemical energy, and time.

15. The method of claim 13, wherein developing the first patterned layer, further comprises:
creating a second patterned layer on the substrate by developing the first patterned layer of exposed radiation-sensitive material, wherein a first positive tone development procedure in a dual-tone development procedure is performed, the second patterned layer comprising a plurality of removed regions, a plurality of partially-removed regions, and a plurality of new low concentration regions;
determining a second dual-tone threshold profile using at least one of the new low concentration regions in the second patterned layer of partially-developed radiation-sensitive material;
establishing a second simulated dual-tone profile for a first negative tone development procedure in the dual-tone development procedure for the second patterned layer of partially-developed radiation-sensitive material;
determining a second limit for the first negative tone development procedure in the dual-tone development procedure for the second patterned layer using the second simulated dual-tone profile;
performing the first negative tone development procedure in the (D-T) processing sequence, if the second dual-tone threshold profile does not exceed the second limit; and
performing at least one second corrective action, if the second dual-tone threshold profile exceeds the second limit.

16. A method of patterning a substrate using a dual-tone (D-T) processing sequence, comprising:
forming a layer of radiation-sensitive material on the substrate, wherein the layer of radiation-sensitive material comprises a dual-tone (D-T) resist material having a plurality of radiation-sensitive acid components and a plurality of radiation-sensitive base components attached to a polymer backbone;
creating a first patterned layer of exposed radiation-sensitive material by exposing the layer of radiation-sensitive material using first EM radiation and a first reticle having a first set of masking features, and heating the first patterned layer of exposed radiation-sensitive material to create a plurality of high concentration regions, a plurality of medium concentration regions, and a plurality of low concentration regions;
performing a first dual-tone (D-T) development procedure in the (D-T) processing sequence to remove at least one of the high concentration regions in the first patterned layer of exposed radiation-sensitive material;
performing a first dual-tone (D-T) metrology procedure in the D-T processing sequence to obtain first measurement data for at least one of the removed high concentration regions using at least one dual-tone (D-T) metrology target; establishing measurement data limits for the first dual-tone (D-T) metrology procedure using profile data for at least one removed high concentration region and data for the at least one dual-tone (D-T) metrology target;
performing additional procedures in the dual-tone (D-T) processing sequence, if measurement data does not exceed at least one measurement data limit; and
performing at least one corrective action, if the measurement data exceeds one or more of measurement data limits.

17. The method of claim 16, wherein performing the at least one corrective action, further comprises:
creating a new dual-tone (D-T) resist material having at least one of a new radiation-sensitive acid component, a new radiation-sensitive base component, and a new polymer backbone;
forming a new layer of new radiation-sensitive material on the substrate using the new dual-tone (D-T) resist material;
creating a new patterned layer of new exposed radiation-sensitive material by exposing the new layer of new radiation-sensitive material using the first EM radiation and the first reticle having the first set of masking features, and heating the new patterned layer of new exposed radiation-sensitive material to create a plurality of new high concentration regions, a plurality of new medium concentration regions, and a plurality of new low concentration regions;
performing a new dual-tone (D-T) development procedure to remove at least one of a new high concentration regions in the new patterned layer of exposed radiation-sensitive material;
performing a new dual-tone (D-T) metrology procedure to obtain new measurement data for at least one of the new removed high concentration regions using at least one new dual-tone (D-T) metrology target;
establishing new measurement data limits for the new dual-tone (D-T) metrology procedure using new profile data for at least one of the new removed high concentration regions and new data for the at least one new dual-tone (D-T) metrology target;
performing new additional procedures in a new (D-T) processing sequence, if the new measurement data does not exceed at least one of the new measurement data limits; and
performing at least one new corrective action, if the new measurement data exceeds at least one of the new measurement data limits.

18. A method of patterning a substrate using a dual-tone (D-T) processing sequence, comprising:
forming a layer of radiation-sensitive material on the substrate, wherein the layer of radiation-sensitive material comprises a dual-tone resist material having a plurality of radiation-sensitive acid components and a plurality of radiation-sensitive base components attached to a polymer backbone;
creating a first patterned layer of exposed radiation-sensitive material by exposing the layer of radiation-sensitive material using first EM radiation and a first reticle having a first set of masking features, and heating the first patterned layer of exposed radiation-sensitive material to create a plurality of high concentration regions, a plurality of medium concentration regions, and a plurality of low concentration regions;

performing a first dual-tone (D-T) development procedure in the (D-T) processing sequence to remove at least one of the high concentration regions in the first patterned layer of exposed radiation-sensitive material;

performing a first dual-tone (D-T) process window verification procedure in the (D-T) processing sequence to obtain first process window data using at least one removed high concentration region;

establishing process window verification limits for the first dual-tone (D-T) metrology procedure using historical profile data one or more of the removed high concentration regions and simulated data for the first dual-tone (D-T) development procedure;

verifying the first process window data and performing additional procedures in the dual-tone (D-T) processing sequence, if the first process window data does not exceed at least one of the process window verification limits; and performing at least one corrective action, if the first process window data exceeds at least one of the process window verification limits.

19. The method of claim 18, wherein performing the at least one corrective action, further comprises:

creating a new dual-tone resist material having at least one of a new radiation-sensitive acid component, a new radiation-sensitive base component, and a new polymer backbone;

forming a new layer of new radiation-sensitive material on the substrate using the new dual-tone resist material;

creating a new patterned layer of new exposed radiation-sensitive material by exposing the new layer of new radiation-sensitive material using the first EM radiation and the first reticle having the first set of masking features, and heating the new patterned layer of new exposed radiation-sensitive material to create a plurality of new high concentration regions, a plurality of new medium concentration regions, a plurality of new low concentration regions;

performing a new dual-tone (D-T) development procedure in the (D-T) processing sequence to remove at least one of the new high concentration regions in the new patterned layer of exposed radiation-sensitive material;

performing a new dual-tone (D-T) process window verification procedure in the (D-T) processing sequence to obtain new process window data for one or more of the new removed high concentration regions;

establishing new process window verification limits for the new dual-tone (D-T) metrology procedure using new profile data for at least one of the new removed high concentration regions and new simulated data for the first dual-tone (D-T) development procedure;

performing new additional procedures in the dual-tone (D-T) processing sequence, if the new process window data does not exceed at least one of the new process window verification limits; and performing at least one new corrective action, if the new process window data exceeds one or more of the new process verification data limits.

20. A method of patterning a substrate using a dual-tone (D-T) processing sequence, comprising:

forming a layer of radiation-sensitive material on the substrate, wherein the layer of radiation-sensitive material comprises a dual-tone resist material having a plurality of radiation-sensitive positive tone groups and a plurality of radiation-sensitive negative tone groups attached to a polymer backbone;

establishing an optimization model for the dual-tone resist material including at least one of a first de-protection model for positive tone groups, a second de-protection model for negative tone groups, and a third de-protection model for the polymer backbone;

creating a first patterned layer of exposed radiation-sensitive material by exposing the layer of radiation-sensitive material using first EM radiation and a first reticle having a first set of masking features, and heating the first patterned layer of exposed radiation-sensitive material to create a plurality of positive tone regions, a plurality of mixed regions, and a plurality of negative tone regions;

performing a first dual-tone (D-T) development procedure in the (D-T) processing sequence to remove at least one of the positive tone regions in the first patterned layer of exposed radiation-sensitive material;

performing a first dual-tone (D-T) metrology procedure in the (D-T) processing sequence to obtain measured profile data using at least one removed positive tone regions and data for at least one dual-tone (D-T) metrology target;

establishing optimization data limits for the first (D-T) development procedure using the optimization model for the dual-tone resist material and data for the at least one (D-T) metrology target;

modifying the optimization model for the dual-tone resist material, if the measured profile data exceeds one or more of the optimization data limits; and performing a second dual-tone (D-T) development procedure in the (D-T) processing sequence to remove at least one of the negative tone regions in the first patterned layer of exposed radiation-sensitive material, if measured profile data does not exceed at least one of the optimization data limits.

21. The method of claim 20, wherein performing the second dual-tone (D-T) development procedure, further comprises:

performing a second dual-tone (D-T) metrology procedure in the (D-T) processing sequence to obtain second measured profile data using at least one removed negative tone region and second data for at least one second dual-tone (D-T) metrology target;

establishing second optimization data limits for the second (D-T) development procedure using the optimization model for the dual-tone resist material and second data for the at least one second (D-T) metrology target;

modifying the optimization model for the dual-tone resist material, if the second measured profile data exceeds at least one of the second optimization data limits; and performing at least one additional procedure, if the second measured profile data exceeds at least one of the second optimization data limits.

22. A method of patterning a substrate using a dual-tone (D-T) processing sequence, comprising:

forming a layer of radiation-sensitive material on the substrate, wherein the layer of radiation-sensitive material comprises a resist material having polymer backbone and a plurality of protecting groups;

creating a first patterned layer of exposed radiation-sensitive material by exposing the layer of radiation-sensitive material using first EM radiation and a reticle having a plurality of masking features, and heating the first patterned layer of exposed radiation-sensitive material to create a plurality of high exposure regions having a first number of de-protected groups, a plurality of medium exposure regions having a second number of de-protected groups, and a plurality of low exposure regions having a third number of de-protected groups;

determining a first threshold profile for a first positive tone development procedure for the first patterned layer of exposed radiation-sensitive material using at least one of the first number of de-protected groups in the high exposure regions, the second number of de-protected groups in the medium exposure regions, and the third number of de-protected groups in the low exposure regions;

determining a first set of limits for the first positive tone development procedure;

modifying the first threshold profile if the first threshold profile exceeds one or more of the first set of limits; and developing the first patterned layer of exposed radiation-sensitive material if the first threshold profile does not exceed at least one of the first set of limits.

23. The method of claim 22, wherein modifying the first threshold profile further comprises:

determining a first difference between the first threshold profile and a first limit in the first set of limits; and applying first de-protection energy to the first patterned layer, wherein the first de-protection energy is determined using at least one of the first difference, the polymer backbone, the first number of de-protected groups in the high exposure regions, the second number of de-protected groups in the medium exposure regions, the third number of de-protected groups in the low exposure regions, an intensity, an exposure level, and a concentration, and the first de-protection energy includes at least one of thermal energy, optical signal energy, EM radiation, chemical energy, and time.

24. The method of claim 22, wherein the developing the first patterned layer further comprises:

performing a positive development procedure to remove one or more of the high exposure regions from the substrate using a first chemistry;

performing at least one additional exposure procedure and at least one additional thermal procedure, thereby creating a new first number of de-protected groups in the high exposure regions, creating a new second number of de-protected groups in the medium exposure regions, and creating a new third number of de-protected groups in the low exposure regions;

determining a second threshold profile for a first negative tone development procedure for the first patterned layer of exposed radiation-sensitive material using at least one of the new first number of de-protected groups in the high exposure regions, the new second number of de-protected groups in the medium exposure regions, and the new third number of de-protected groups in the low exposure regions;

determining a second set of limits for the first negative tone development procedure;

modifying the second threshold profile if the second threshold profile exceeds a second limit of the second set of limits; and performing a negative development procedure to remove one or more of the low exposure regions from the substrate using a second chemistry, if the second threshold profile does not exceed the second limit of the second set of limits.

25. A method of patterning a substrate using a dual-tone (D-T) processing sequence, comprising:

forming a layer of radiation-sensitive material on the substrate, wherein the layer of radiation-sensitive material comprises a resist material having polymer backbone and a plurality of protecting groups;

creating a first patterned layer of exposed radiation-sensitive material by exposing the layer of radiation-sensitive material using first EM radiation and a reticle having a plurality of masking features, and heating the first patterned layer of exposed radiation-sensitive material to create a plurality of high concentration regions having a first number of de-protected groups, a plurality of medium concentration regions having a second number of de-protected groups, and a plurality of low concentration regions having a third number of de-protected groups;

determining a first threshold profile for a first positive tone development procedure for the first patterned layer of exposed radiation-sensitive material using at least one of the first number of de-protected groups in the high concentration regions, the second number of de-protected groups in the medium concentration regions, and the third number of de-protected groups in the low concentration regions;

determining a first set of limits for the first positive tone development procedure;

modifying the first threshold profile if the first threshold profile exceeds one or more of the first set of limits; and developing the first patterned layer of exposed radiation-sensitive material if the first threshold profile does not exceed at least one of the first set of limits.

26. The method of claim 25, wherein modifying the first threshold profile further comprises:

determining a first difference between the first threshold profile and a first limit in the first set of limits; and applying first de-protection energy to the first patterned layer, wherein the first de-protection energy is determined using at least one of the first difference, the polymer backbone, the first number of de-protected groups in the high concentration regions, the second number of de-protected groups in the medium concentration regions, the third number of de-protected groups in the low concentration regions, an intensity, an exposure level, and a concentration, and the first de-protection energy includes at least one of thermal energy, optical signal energy, EM radiation, chemical energy, and time.

27. The method of claim 25, wherein the developing the first patterned layer further comprises:

performing a positive development procedure to remove one or more of the high concentration regions from the substrate using a first chemistry;

performing at least one additional exposure procedure, thereby creating a new first number of de-blocked groups in the high concentration regions, creating a new second number of de-blocked groups in the medium concentration regions, and creating a new third number of de-blocked groups in the low concentration regions;

determining a second threshold profile for a first negative tone development procedure for the first patterned layer of exposed radiation-sensitive material using at least one of the new first number of de-blocked groups in the high concentration regions, the new second number of de-blocked groups in the medium concentration regions, and the new third number of de-blocked groups in the low concentration regions;

determining a second set of limits for the first negative tone development procedure;

modifying the second threshold profile if the second threshold profile exceeds one or more of the second set of limits; and performing a negative development procedure to remove one or more of the low concentration regions from the substrate using a second chemistry, if the second threshold profile does not exceed at least one of the second set of limits.

* * * * *